United States Patent
Greenberg et al.

(10) Patent No.: US 7,167,531 B2
(45) Date of Patent: Jan. 23, 2007

(54) SYSTEM AND METHOD FOR SHARED DECODING USING A DATA REPLAY SCHEME

(75) Inventors: Mark Greenberg, Beaverton, OR (US); Manish Shah, Beaverton, OR (US)

(73) Assignee: Digeo, Inc., Kirkland, WA (US)

( * ) Notice: Subject to any disclaimer, the term of this patent is extended or adjusted under 35 U.S.C. 154(b) by 686 days.

(21) Appl. No.: 09/954,777

(22) Filed: Sep. 17, 2001

(65) Prior Publication Data
US 2003/0118130 A1 Jun. 26, 2003

(51) Int. Cl.
*H03D 1/00* (2006.01)

(52) U.S. Cl. .................. 375/341; 375/262; 714/786; 714/795

(58) Field of Classification Search .......... 375/260, 375/265, 340, 341, 347, 349, 350, 344, 262; 380/20, 49; 348/465, 571, 423, 726, 725; 386/68, 46; 455/277.1, 133, 3.02, 277.2; 370/386, 486; 714/789, 796, 794, 795, 786; 700/94; 725/120, 121, 149, 71, 78, 80, 82
See application file for complete search history.

(56) References Cited

U.S. PATENT DOCUMENTS

| | | | |
|---|---|---|---|
| 4,015,238 A | 3/1977 | Davis | |
| 5,027,374 A | 6/1991 | Rossman | |
| 5,233,630 A | 8/1993 | Wolf | 375/67 |
| 5,291,499 A | 3/1994 | Behrens et al. | |
| 5,295,142 A | 3/1994 | Hatakeyama | 371/43 |
| 5,349,608 A | 9/1994 | Graham et al. | |
| 5,390,198 A | 2/1995 | Higgins | 371/43 |
| 5,446,746 A | 8/1995 | Park | 371/43 |
| 5,608,737 A | 3/1997 | Kimura et al. | |
| 5,636,251 A * | 6/1997 | Citta et al. | 375/341 |
| 5,778,192 A | 7/1998 | Schuster et al. | |
| 5,907,586 A | 5/1999 | Katsuragawa et al. | |
| 5,923,755 A * | 7/1999 | Birch | 380/212 |
| 5,974,095 A | 10/1999 | Kitaura et al. | |
| 5,987,637 A | 11/1999 | Thomas | 714/795 |
| 6,005,640 A | 12/1999 | Strolle et al. | |

(Continued)

FOREIGN PATENT DOCUMENTS

EP 0 762 777 A2 3/1997

(Continued)

OTHER PUBLICATIONS

Advanced two IC chipset for DVB on satellite reception; Haas, M.; et al.; ☐☐Consumer Electronics, IEEE Transactions on , vol. 42, Issue: 3, Aug. 1996 ☐☐pp. 341-345.*

(Continued)

*Primary Examiner*—Temesghen Ghebretinsae
(74) *Attorney, Agent, or Firm*—Kory D. Christensen; Stoel Rives LLP

(57) ABSTRACT

A system and method are described in which a decoder decodes data from a plurality of data streams. In one embodiment, the decoder is restored to the state it was in the last time it processed data from each data stream by re-decoding data stored in a replay buffer before decoding new data from each respective data stream. In one embodiment, multiple decoders are grouped together to process data from a plurality of satellite transponders.

33 Claims, 28 Drawing Sheets

U.S. PATENT DOCUMENTS

| | | | |
|---|---|---|---|
| 6,049,573 | A | 4/2000 | Song |
| 6,061,406 | A * | 5/2000 | Carson et al. .............. 375/260 |
| 6,119,265 | A | 9/2000 | Hara |
| 6,122,325 | A | 9/2000 | Mogre et al. |
| 6,138,265 | A | 10/2000 | Morelos-Zaragoza et al. |
| 6,141,391 | A | 10/2000 | Morelos-Zaragoza et al. |
| 6,148,043 | A | 11/2000 | Fujimoto |
| 6,157,997 | A | 12/2000 | Oowaki et al. |
| 6,189,126 | B1 | 2/2001 | Ulmer et al. |
| 6,195,642 | B1 | 2/2001 | Izumi et al. |
| 6,205,186 | B1 | 3/2001 | Butler et al. ................ 375/341 |
| 6,266,687 | B1 | 7/2001 | Leyonhjelm et al. |
| 6,278,725 | B1 | 8/2001 | Rouphael et al. |
| 6,301,314 | B1 | 10/2001 | Murayama |
| 6,320,627 | B1 * | 11/2001 | Scott et al. ................. 348/726 |
| 6,404,828 | B1 * | 6/2002 | Kaewell, Jr. ................ 375/341 |
| 6,462,423 | B1 | 10/2002 | Akram et al. ............... 257/778 |
| 6,563,889 | B1 | 5/2003 | Shih et al. |
| 6,594,795 | B1 | 7/2003 | Satou ......................... 714/795 |
| 6,615,388 | B1 | 9/2003 | Takamichi .................. 714/795 |
| 6,622,307 | B1 * | 9/2003 | Ho ............................. 725/120 |
| 6,654,357 | B1 | 11/2003 | Wiedeman .................. 370/315 |
| 6,680,986 | B1 * | 1/2004 | Hemmati .................... 375/341 |
| 6,690,926 | B1 * | 2/2004 | Tawil et al. ............. 455/277.1 |
| 6,691,268 | B1 | 2/2004 | Chin ........................... 714/726 |
| 6,775,463 | B1 * | 8/2004 | Nooralahiyan et al. ....... 386/68 |
| 6,917,652 | B1 * | 7/2005 | Lyu ....................... 375/240.25 |
| 6,931,424 | B1 | 8/2005 | Joseph ........................ 708/207 |
| 2001/0032027 | A1 * | 10/2001 | Fukami ........................ 700/94 |
| 2002/0031120 | A1 * | 3/2002 | Rakib ......................... 370/386 |
| 2003/0021346 | A1 | 1/2003 | Bixby et al. ........... 375/240.25 |
| 2003/0223731 | A1 * | 12/2003 | Carlsgaard et al. ........... 386/46 |

FOREIGN PATENT DOCUMENTS

| | | |
|---|---|---|
| WO | WO 00/74264 A1 | 12/2000 |
| WO | WO 01/59937 A2 | 8/2001 |

OTHER PUBLICATIONS

A low-cost DVB compliant Viterbi and Reed Solomon decoder; Mueller, K.; et al; ☐☐Consumer Electronics, IEEE Transactions on, vol. 43, Issue: 3, Aug. 1997 ☐☐pp. 448-452.*

A single-chip universal digital satellite receiver with 480-MHz IF input; Kwentus, A.Y , et al.; ☐☐Solid-State Circuits, IEEE Journal of, vol. 34, Issue: 11, Nov. 1999 ☐☐pp. 1634-1646.*

A multi-standard set-top box channel decoder; Sohi, N.; Gulak, P.G.; ☐☐Signal Processing Systems, 2000. SiPS 2000. 2000 IEEE Workshop on , Oct. 11-13, 2000 ☐☐pp. 295-304.*

Microsoft Press computer dictionary; Microsoft Corporation ☐☐Microsoft Press, c1997; 3rd Edition p. 115☐☐*

James Tsui, "Frequency Channelization, Digital Techniques for Wideband Receivers," Second Edition, pp. 363-396, 2001 Artech House, Inc., Norwood, MA.

Zhengdao Wang and Georgios B. Giannakis, "Wireless Multicarrier Communications where Fourier Meets Shannon," Department of ECE, University of Minnesota, Minneapolis, MN.., pp. 1-21.

E. Verriest, Isen, "Implementing an Adaptive Noise Cancelling System to Enhance Sonar Receiver Performance Using the TMS320C31 DSP," ESIEE, Paris, Sep. 1996, Texas Instruments, pp. 1-24.

G.A. Shaw, R.A. Ford, J.C. Anderson, B.W. Zuerdnorfer, A.H. Anderson, "RASSP Benchmark 2 Technical Description," Massachusetts Institute Of Technology Lincoln Library, 153 pages total.

Bree, et al., "A Bit-Serial Architecture For A VLSI Viterbi Processor", Communications Systems Research Group, University of Saskatchewan, Saskatoon, IEEE, WESCANEX '88, 1988, pp. 72-77.

Biver, et al., "Architectural Design and Realization Of A Single-Chip Viterbi Decoder", Elsevier Science Publishers B.V.,Integration, The VLSI Journal 8 (1989), Oct., No. 1, Amsterdam, NL, pp. 3-16.

Bree, et al., "A Modular Bit-Serial Architecture For Large Constraint-Length Viterbi Decoding", Communications Systems Research Group, University of Saskatchewan, Saskatoon, Canada, IEEE International Conference on Communications, 1990, pp. 1501-1506.

Choi, et al., "Viterbi Detector Architecture For High-Speed Optical Storage", 1997, IEEE TENCON-Speech and Image Technologies for Computing and Telecommunications, ASIC Center Corporate Technical Operations Samsung Electronics, vol. 1, Dec. 1997, pp. 89-92.

Marie-Laure Boucheret, Ivar Mortensen and Henri Favaro, "Fast Convolution Filter Banks For Satellite Payloads with On-Board Processing," IEEE Journal On Selected Areas In Communications, vol. 17, No. 2, Feb. 1999.

W.H. Yim and F.P. Coakley, "On-Board Processing For KA-Band Applications", University of Surrey, UK, Publication Date, Feb. 11, 1993., XP 000458011, pp. 225-229.

Hashida Mitsuyoshi, "Hierachical Network Management System and Control Method for Network Management Information," Patent Abstracts of Japan, Publication No. 07226777.

Patent Abstracts of Japan, vol. No. 11, Dec. 26, 1995, & JP 07 226777 A (Hitachi Ltd), Aug. 22, 1995, Abstract.

John G. Proakis, Block and Convolutional Channel Codes, Digital Communications, Fourth Edition, pp. 416-547, McGraw-Hill Series in Electrical and Computer Engineering, New York, NY.

"www.inventra.com/inventra/softcore/workshop/MultiRaFiltDes95/" Mentor Graphics, Hardware Design of Decimators/Interpolators, pp. 1-38.

"www.mentor.com/inventra/softcore/workshop/SDmod95/", Mentor Graphics, Introduction to AD/DA Converters, pp. 1-27.

http://www.mentor.com/inventra/softcore/workshop/SDHWDes95/ Mentor Graphics, Design of the Decimation & Interpolation Filters, pp. 1-57.

http://www.mentor.com/inventra/softcore/workshop/Applications95/, Mentor Graphics, Sigma Delta Converter Applications, pp. 1-5.

* cited by examiner

FFT Input Data

SYSTEM AND METHOD FOR SHARED DECODING USING A DATA REPLAY SCHEME

BACKGROUND

1. Field of the Invention

This invention relates generally to the field of multimedia systems. More particularly, the invention relates to a multimedia system capable of concurrently demodulating and decoding a plurality of multimedia streams transmitted from a satellite or a cable network.

2. Description of the Related Art

Digital broadband video systems, such as digital cable or satellite, multiplex many television channels onto a single carrier. In the cable world, the carriers are modulated using Quadrature Amplitude Modulation ("QAM"). In the satellite world, the carriers (known as transponders) are modulated using Quadrature Phase Shift Key ("QPSK") modulation. In residential satellite/cable systems, these carriers typically have a net bandwidth of 20–40 Mbits/s.

As illustrated in FIG. 1, a conventional digital receiver 100 is comprised of a tuner 110 for locking on to a signal from a single transponder at a specified frequency and downconverting the signal to baseband. The tuner 110 receives the transponder signal from a satellite dish 105 with one or more low noise block downconverters ("LNBs"). The signal coming from the transponder has either a clockwise or counterclockwise polarization (or horizontal vs. vertical for fixed satellite service ("FSS") systems satellite systems). Each LNB, which can be thought of as an antenna, can selectively listen to either polarization. The LNB also moves the signal from the satellite transmission band (Ka or Ku) into the L-Band, 950–2100 MHz.

The signal is then digitally sampled via an analog-to-digital ("A/D") converter 120 and demodulated via a QPSK demodulator 130 (or, in the case of digital cable, a QAM demodulator). Noise and other types of interference may be introduced in the signal during transmission (e.g., by the tuner and/or the LNB). When demodulating the signal, the QPSK demodulator 130 attempts to remove these unwanted portions of the signal using a combination of filters (e.g., band-pass FIR filters for removing noise, root-raised cosine filters for removing inter-symbol interference, . . . etc).

The demodulated signal is then transmitted to a Viterbi decoder 140 (or other type of forward-error-correction decoder) which attempts to correct bit errors caused by signal noise. In particular, the Viterbi algorithm determines the most likely transmitted bit sequence using statistical correlation of the bit sequence actually received by the system. Accordingly, the original bit sequence may be reconstructed, even in the presence of a significant amount of noise.

After additional processing, the Viterbi-decoded signal is input to a Reed-Solomon decoder 150 (or similar block-based decoder). Reed-Solomon codes are block-based error correcting codes. Before transmission, a Reed-Solomon encoder (not shown) adds extra "redundant" bits to each block of data. The Reed-Solomon decoder 150 processes each block and attempts to correct any errors and recover the original data. The number and type of errors that can be corrected depends on the characteristics of the particular Reed-Solomon code employed.

Following Reed-Solomon decoding, a single MPEG-2 transport stream containing video data for a single channel (e.g., HBO) is demultiplexed and further processed by the system. If the system is equipped with a mass storage device (e.g., such as a Tivo™ or Replay TV™ system), the MPEG-2 stream may be stored for later viewing. In addition, "trick modes" such as pause and rewind for live television broadcasts may be implemented on the system. Alternatively, or in addition, the signal may be decoded by an MPEG-2 decoder (not shown) and rendered on a television display.

One limitation of the system illustrated in FIG. 1 is that it is only capable of processing data from a single transponder at any given time. In order to concurrently process data from a group of n transponders, all of the logic illustrated in FIG. 1 must be multiplied by n, resulting in significant additional manufacturing costs. Given that satellite systems typically transmit multimedia data over between 24 to 32 transponders, a system for concurrently processing data transmitted over all available transponders would be prohibitively expensive to manufacture using current satellite receiver technologies.

A receiver system capable of concurrently processing data from multiple transponders would provide many benefits to end users, especially if the system included a high performance mass storage device (a 40+ Gbyte hard drive with an ATA-100 interface). For example, channels from several different transponders could then be concurrently stored on the on the mass storage device, either for long term storage or for "trick modes." Such a system would allow users to watch any program being broadcast from the beginning by continually buffering each program (or subset thereof) for a predetermined period of time (e.g., until the program broadcast has ended).

Accordingly, what is needed is a system and method for concurrently processing content from multiple transponders and/or QAMs which is not prohibitively expensive to manufacture.

BRIEF DESCRIPTION OF THE DRAWINGS

A better understanding of the present invention can be obtained from the following detailed description in conjunction with the following drawings, in which.

DETAILED DESCRIPTION

Figure 1:
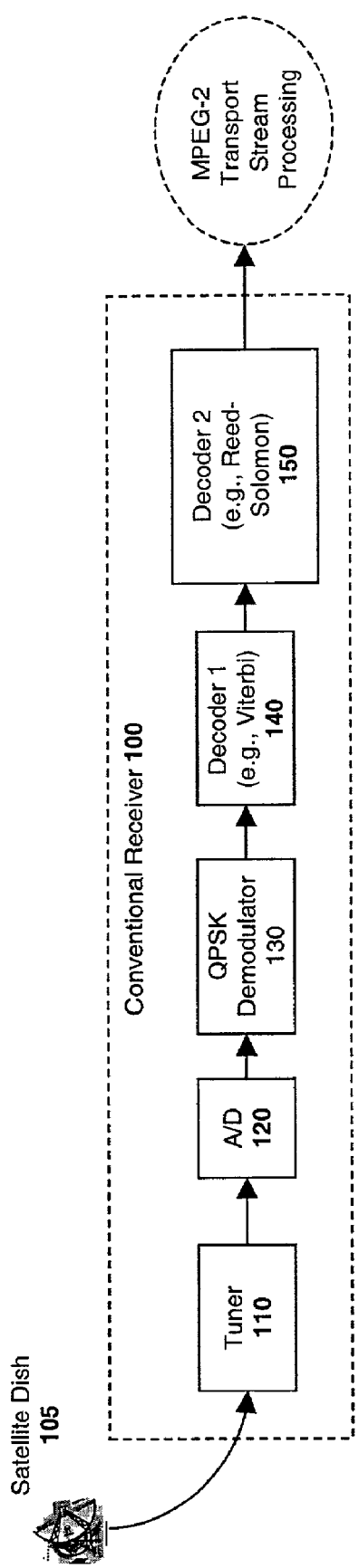
FIG. 1 illustrates a prior art digital multimedia receiver.

In the following description, for the purposes of explanation, numerous specific details are set forth in order to provide a thorough understanding of the present invention. It will be apparent, however, to one skilled in the art that the invention may be practiced without some of these specific details. In other instances, well-known structures and devices are shown in block diagram form to avoid obscuring the underlying principles of the invention.

EMBODIMENTS OF A SYSTEM AND METHOD FOR DEMODULATING AND DECODING MULTIPLE DATA STREAMS

As illustrated in FIG. 2, one embodiment of the invention is comprised of a plurality of quadrature tuners 201–204, each of which lock on to signals transmitted by a plurality of transponders, downconvert the signals to baseband, and separate the in-phase ("I") and quadrature phase ("Q") components of the signals. In one embodiment, the entire group of transponders employed on the satellite system are allocated across the tuners 201–204. Accordingly, for a 32 transponder system, each of the quadrature tuners 201–204 process data streams from 8 transponders. Two of the tuners (e.g., 201–202) process signals from the first satellite LNB and the other two tuners (e.g., 203–204) process signals from the second satellite LNB, at first and second polarizations, respectively. More specifically, in one embodiment, each of the tuners 201–204 processes a 250 MHz chunk of transponder spectrum, resulting in 8 baseband signals having data from –125 MHz to +125 MHz. It should be noted, however, that the underlying principles of the invention are not limited to any particular number of tuners or any particular transponder/bandwidth allocation among the tuners.

The transponder signals are then passed through a plurality of anti-alias filters 205 which suppress undesirable non-baseband signal residuals. Because of the digital signal processing performed in one embodiment of the invention (described in detail below) relatively inexpensive anti-alias filters may be used to filter the signals, thereby reducing system costs. For example, in one embodiment, the anti-alias filters are $3^{rd}$ order elliptic filters.

The filtered signals are then passed through a plurality of analog-to-digital ("A/D") converters 210, which digitally sample the signal at a predetermined sampling rate. In one embodiment, each of the A/D converters 210 is a 300 Msample/sec, 6-bit A/D. However, various other types of A/D converters may be employed while still complying with the underlying principles of the invention.

Once processed by the A/D converters 210, the digitized samples are temporarily stored in a plurality of buffers 215. Although illustrated in FIG. 2a as four independent buffer units, it will be appreciated that a single buffer may also be employed to store data from each of the streams (i.e., and broken up into a plurality of addressable memory blocks).

Conventional satellite systems perform filtering via convolution. More specifically, in the time domain, the input signal is "convolved" with a time domain representation of the filter's transfer function. As mentioned above, conventional receiver systems use finite impulse response ("FIR") or infinite impulse response ("IIR") bandpass filters to filter data from each transponder based on the transponder's carrier frequency and bandwidth. These filtering techniques are effective for processing data from one or possibly two transponders. However, standard filtering techniques are not practical for filtering data from numerous transponders. For example, a bank of at least 32 conventional filters would be required for 32 transponders, dramatically increasing system costs.

By contrast, in one embodiment of the invention, a Fast Fourier Transform ("FFT") unit 220, a multiplier 230 and an inverse FFT unit 240 are used in place of conventional filters to convolve the in-phase ("I") and quadrature ("Q") samples from all 32 transponders (or as many transponders as are provided on the system). While the logic required to implemented the FFT may be more substantial than that required to implement a typical conventional FIR filter, only a single FFT is required for the entire group of transponders. Mathematically, the FFT is more efficient for processing a significantly greater number of data samples because, in order to process N data samples, the FFT must perform N*Log(N) operations, whereas an FIR filter must perform $N^2$ operations.

Figure 2A:
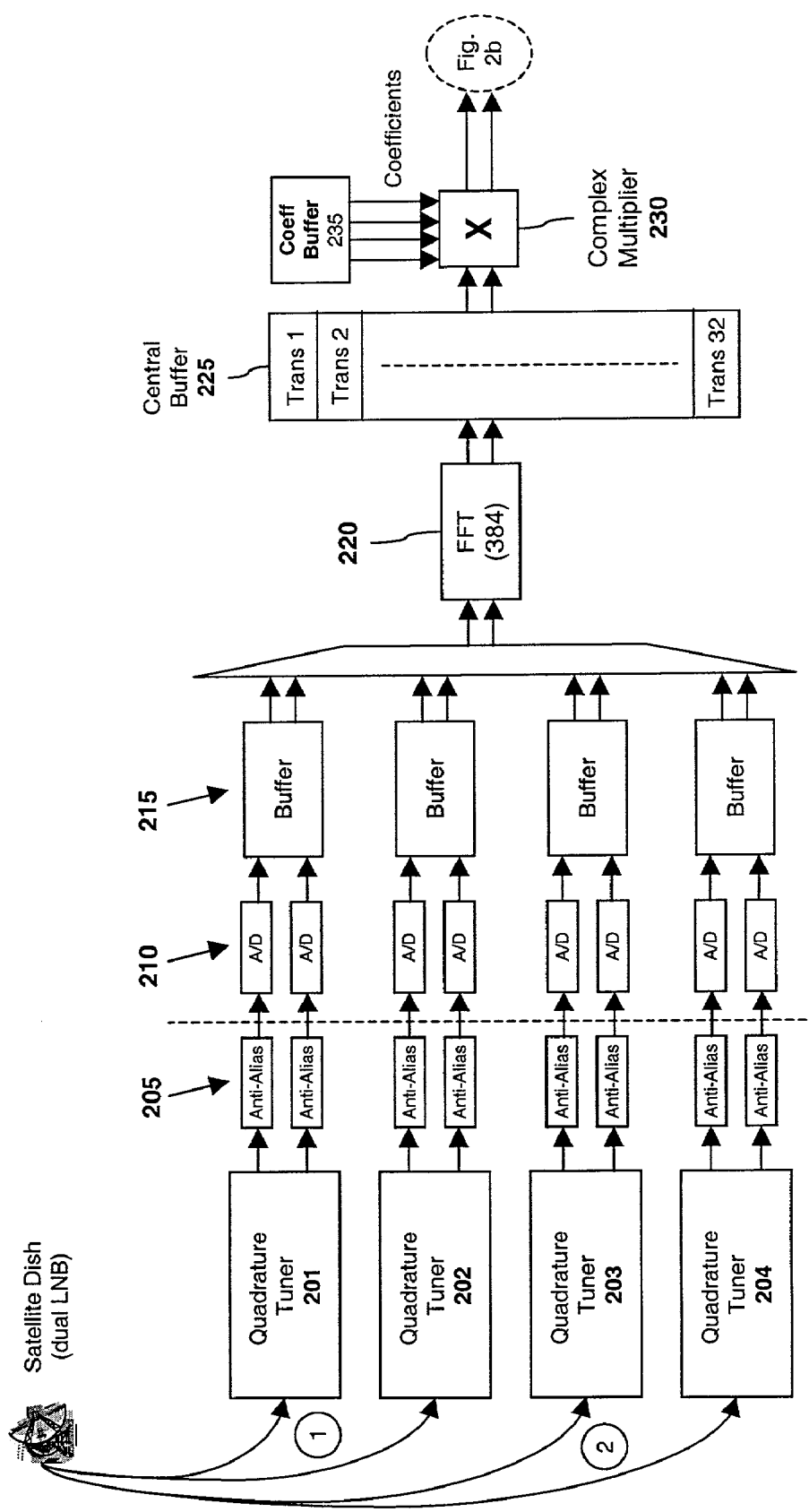
FIGS. 2a and 2b illustrate a multimedia receiver according to one embodiment of the invention.

As indicated in FIG. 2a, in one embodiment, a 384-point FFT is employed which converts 384 samples of complex data (i.e., complex data if QPSK is used as the modulation scheme) from a buffer 215 (or multiple buffers) into 384 complex frequency coefficients with each FFT operation. Because FFTs are inherently capable of processing complex numbers, no supplemental logic is required for the FFT to concurrently process both the I and Q signal components.

Figure 6:
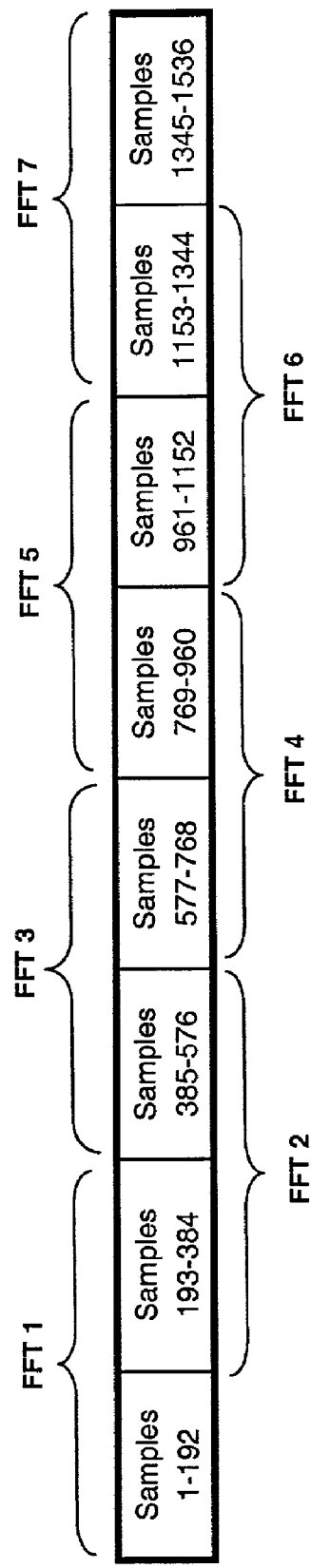
FIG. 6 illustrates overlapping data samples to be processed by a Fast Fourier Transform ("FFT") in one embodiment of the invention.

In one embodiment, during each FFT operation, the FFT unit 220 processes 192 new samples and 192 replay samples from each tuner. This technique of overlapping input data in an FFT operation is graphically demonstrated in FIG. 6 using input sample data from a single tuner (e.g., tuner 201, which includes data for transponders 1–8). As illustrated, for the first FFT operation (identified as FFT 1) input samples 1–192 and 193–384 are concurrently processed. The FFT then proceeds down through each of the buffers in turn, performing similar 384-point FFT operations using input samples from each of the tuners. Once it processes data from the final tuner (e.g., tuner 204, which includes data for transponders 25–32), it starts again from the first in a round robin fashion. As illustrated in FIG. 6, it then performs an 384-point FFT (identified as FFT 2) using both 192 new samples 385–576 and 192 replay samples 192–384. The FFT continues reading data samples from each transponder in this manner as long as data is available.

Each tuner may not necessarily supply data to the FFT 220 at the same rate, depending on the system configuration. Accordingly, in one embodiment, arbitration logic (not shown) may instruct the FFT 220 to process relatively more or fewer samples for a particular tuner in a given cycle, depending on the relative speed with which the tuner provides samples to the FFT 220 (or, rather, to the buffer 215 from which the FFT 220 reads the samples). For example, in one embodiment, the arbitration logic monitors each of the buffers 215 and, when the data in a particular buffer reaches a threshold value, the arbitration logic instructs the FFT 220 to process an additional 384 samples from the buffer before moving to the next buffer. Various static and dynamic arbitration techniques may be employed while still complying with the underlying principles of the invention.

The level of overlapping illustrated in FIG. 6 is referred to as a 50% overlap (i.e., because for each FFT ½ of the data is old and ½ is new). It should be noted, however, that various other levels of overlapping may be employed while still complying with the underlying principles of the invention (e.g., depending on the particular FFT used).

In one embodiment, "overlap-save" and/or "overlap-discard" techniques are employed to avoid the effects of circular convolution. More specifically, due to the periodic nature of the discrete Fourier transforms such as the FFT, a portion of the output from the FFT may be errant (i.e., and may wrap back upon itself). Accordingly, in one embodiment of the invention, this errant portion is discarded/filtered following the FFT.

In one embodiment, for each FFT operation, 384 complex frequency values from a given tuner (or multiple tuners) are stored in the buffer 225 but only 128 are selected from the buffer by the complex multiplier 230. The particular 128 values may be selected based on the center frequency of the transponder of interest (e.g., 64 samples greater than the center frequency and 64 samples less than the center frequency may be selected). Alternatively, or in addition, the 128 frequency values may be selected from each transponder (or cable system carrier) before being stored in the buffer 225 rather than after.

Because only 128 frequency coefficients are selected in the process of performing the FFT, the underlying signal is effectively decimated by a factor of 3× (i.e., because the 384 input samples are converted into 128 frequency coefficients which are subsequently transformed back into the time domain by an IFFT, described below). Moreover, the decimation is accomplished without the need for a separate decimation unit—a potentially costly component, particularly when implementing large decimation factors.

Although a 3× decimation was described above, it should be noted that various alternative decimation factors may be realized by selecting greater or fewer frequency coefficients following the FFT operation. For example, 96 coefficients may be selected to achieve a decimation factor of 4×.

Figure 3A:
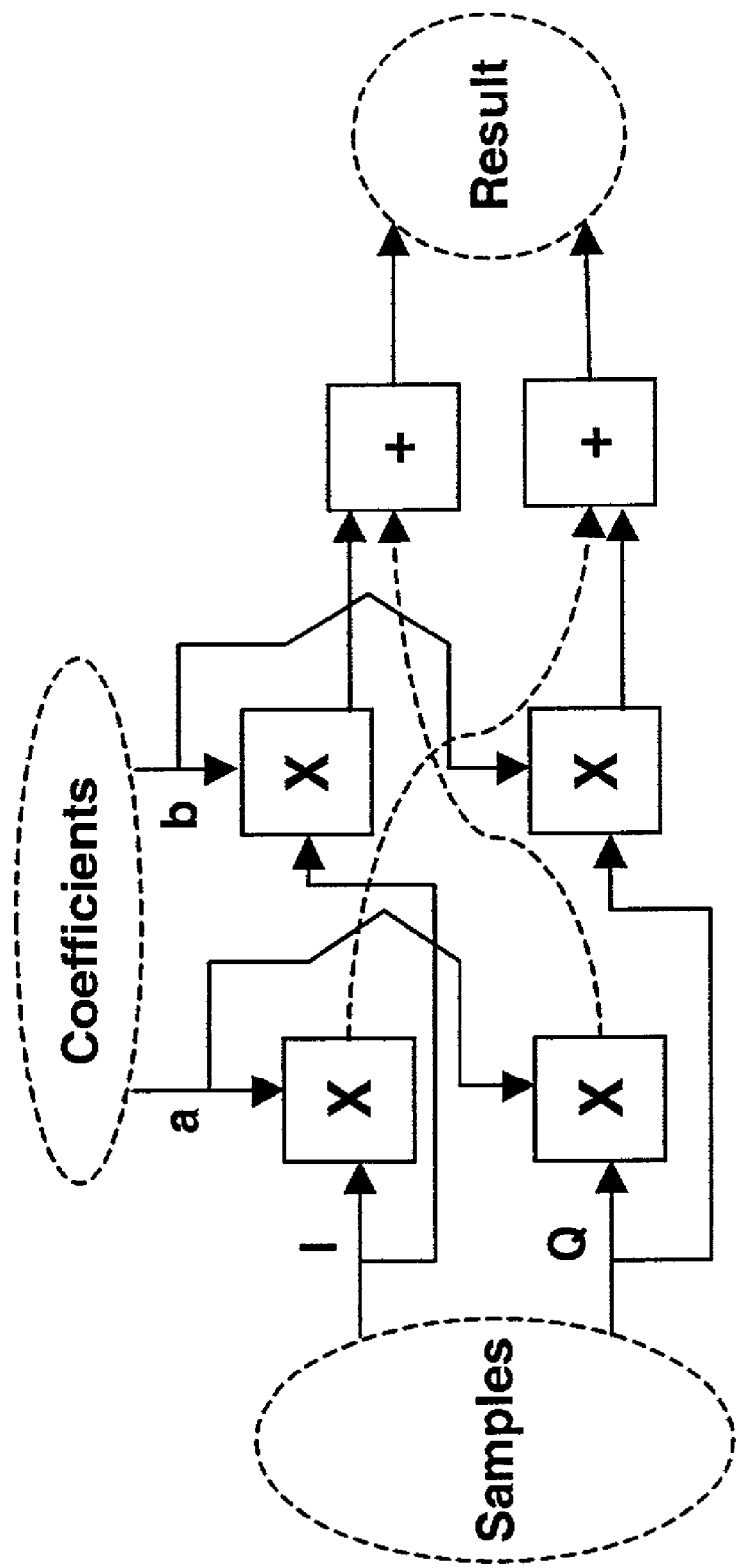
FIGS. 3a and 3b illustrate complex multipliers employed in embodiments of the invention.

As mentioned above, in one embodiment, as part of the convolution process, a complex multiplier 230 multiplies the I and Q frequency components by a set of complex designated frequency coefficients (i.e., in an embodiment in which complex signal data is being convolved). The frequency coefficients may be selected based on the desired transfer function. One particular complex multiplier 230 for performing the multiplication using frequency coefficients 'a' and 'b' is illustrated in FIG. 3a.

Figure 3B:
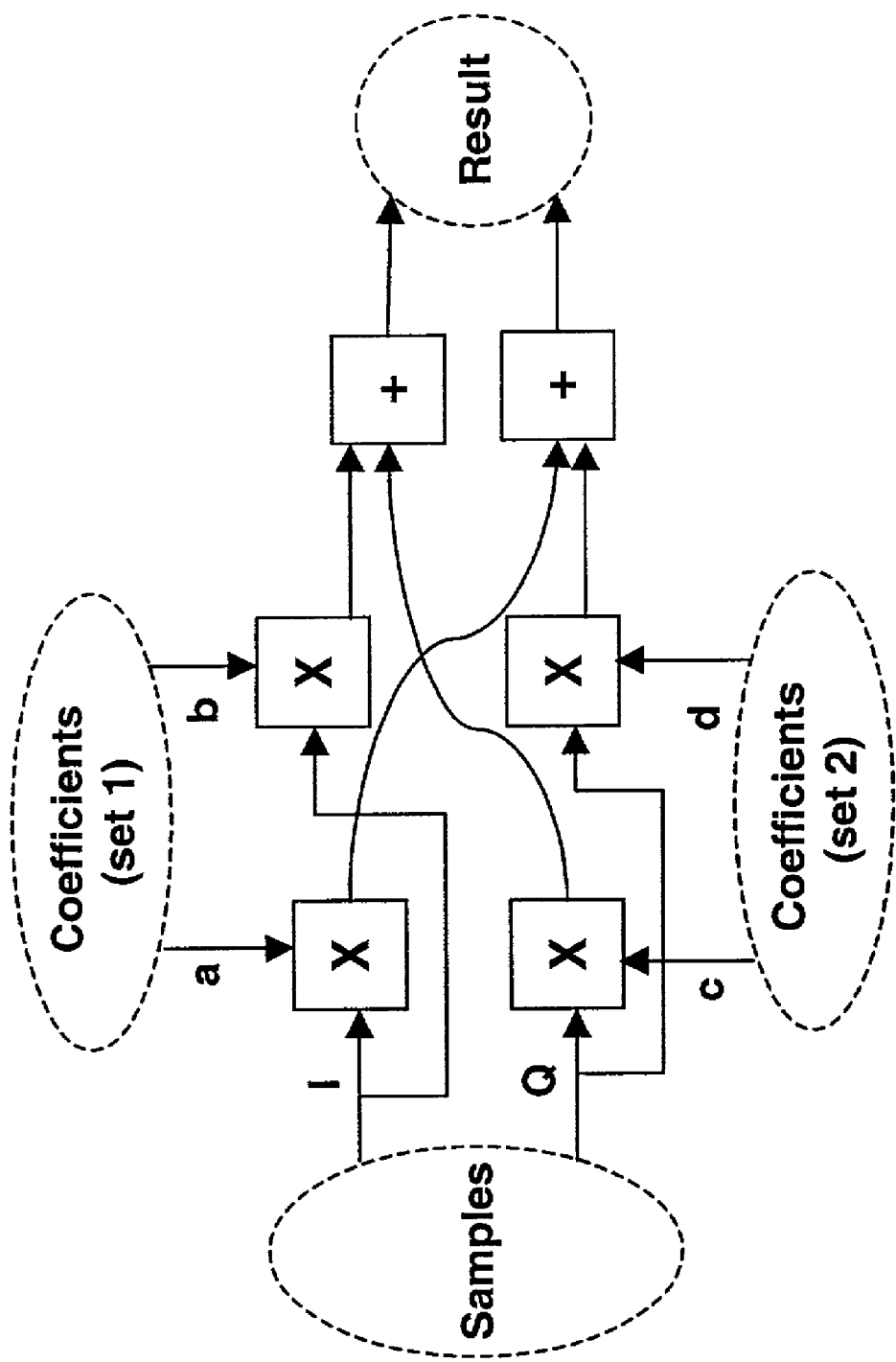

Gain and phase imbalances may be introduced in the signal during transmission and/or by the various system components (e.g., by the tuners 201–204 or the LNBs). As such, following the FFT operation, the I component and/or the Q component of the signal may not have the correct amplitude and may not be exactly 90 degrees out of phase. In one embodiment of the invention, the complex multiplier 230 compensates for these gain and phase imbalances using an additional set of frequency coefficients. As illustrated in FIG. 3b, four coefficients may be used (i.e., identified as 'a,' 'b,' 'c,' and 'd'). Although this requires storing an additional two coefficients, it allows for more precise gain/phase corrections. For example, with four coefficients, the gain of the I component may be precisely adjusted without affecting the phase/gain of Q. Similarly, the phase of the Q component may be modified without affecting I. This level of control is not possible using only two coefficients (i.e., where a change to 'a' or 'b' would affect both I and Q).

In one embodiment, the additional coefficients may be used to independently control gain and phase for two different streams or for a single high bandwidth stream. For example, the standard data rate of the system may not be sufficient to handle certain high bandwidth streams (e.g., a 60 MHz wide FSS transponder). In such a case, two sets of coefficients may be time shifted (e.g., by ½ of the data rate) and applied to the stream twice in succession to produce two filtered streams. These time-shifted streams may then be combined to produce a higher bandwidth stream. Accordingly, if the typical data rate output from the IFFT unit 240 is 100 MHz (which may not be sufficient under certain conditions), time shifting coefficients and combining streams in this manner may produce an effective data rate of 200 MHz.

Following the gain/phase corrections, the signal components are converted back into the time domain via an inverse FFT ("IFFT") unit 240. In one embodiment, the IFFT is a 128-point IFFT which operates on the 128 frequency components for each transponder output from the complex multiplier. Accordingly, in one embodiment, the output of the IFFT contains 64 valid transponder data samples (i.e., because the rest are discarded due to the effects of circular convolution). In an embodiment in which the two sets of coefficients used in the complex multiplier 230 are time shifted by a specified period of time (e.g., 5 nsec) and applied twice in succession for a given transponder, two sets of 64 data samples may be output from the IFFT 240. The two sets may then be interleaved even/odd to produce a more accurate representation of the signal in the time domain.

In one embodiment, the output of the IFFT 240 is then fed into a linear interpolator 245 which interpolates between data samples at points identified by a baud loop unit 246. More specifically, the baud loop unit 246 identifies the baud rate at which the transponder signal was transmitted (e.g., from the satellite uplink facility) and applies this rate to the interpolator 245. In response, the interpolator adjusts the effective sampling rate by selecting a new set of data points, spaced according to the rate identified by the baud loop unit 246 (often at a lower rate than transmitted from the IFFT unit 240).

In one embodiment, following the linear interpolator, the signal is passed through a carrier removal module 250 which removes the carrier offset from the signal using a periodic signal (e.g., a sinusoid) supplied by a Numerically Controlled Oscillator ("NCO") 252. When the output of the NCO is equivalent to the desired carrier frequency, the carrier is effectively removed from the signal. However, the NCO oscillator frequency and the actual frequency of the signal read out of the linear interpolator may not be equal due to signal drift produced by the LNB and/or various other system components which process the signal prior to the carrier removal unit 250 (e.g., the tuners 201–204).

Figure 4:
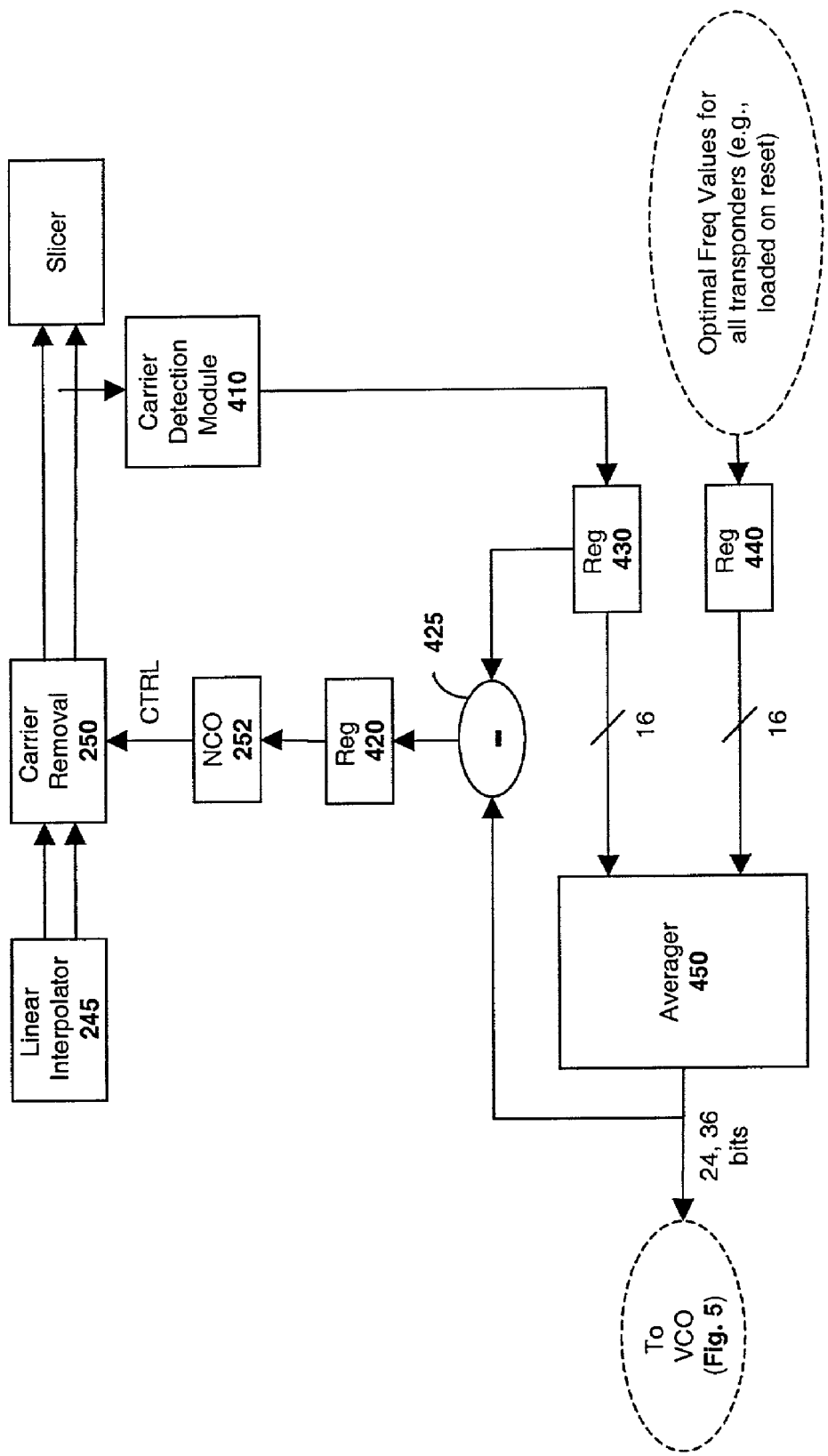
FIG. 4 illustrates one embodiment of an apparatus for compensating for signal drift.

To compensate for signal drift, following the linear interpolator 245, one embodiment of the invention employs the system illustrated in FIG. 4. According to this embodiment, a carrier detection module 410 detects the frequency of the carrier signal from each transponder and stores the results in a register 430. An averager unit 450 calculates the average difference between the actual frequency signals from each transponder (read from register 440) and the desired frequency values for each transponder (i.e., assuming no drift). In one embodiment, these values are loaded into a register 440 when the system is initialized.

The average difference between the optimal frequency values and the actual frequency values represents the overall drift of the system (i.e., the drift associated with all transponders). Accordingly, in one embodiment, this value is used to control a voltage controlled oscillator ("VCO") within a phase locked loop ("PLL") (described in greater detail below) which generates the center frequency of each of the tuners 201–204 at the front end of the receiver. In one embodiment, the averager unit 450 transmits the average drift as a 32-bit word. However, it should be noted that various other data lengths may be employed (e.g., 24 bits) to transmit the average drift value while still complying with the underlying principles of the invention.

In the embodiment shown in FIG. 4, the average drift is calculated in the described manner for all transponders received over the same LNB. Accordingly, if 16 transponders are received by one LNB and another 16 transponders are received by a second LNB, then two separate averaging calculations may be performed (i.e., one for each LNB). This will allow for more accurate signal drift calculations, particularly when each of the LNBs cause a different level of drift.

In one embodiment, a subtraction unit 425 calculates the difference between the average transponder drift (output from the averager 450) and the drift measured for each individual transponder (output from the carrier detection module 410). The resulting "per-transponder drift" values are stored in the NCO control register 420. These values indicate the extent to which the frequency needs to be adjusted by the NCO 252 for each individual transponder.

Providing two levels of drift compensation as described above (i.e., a per-transponder compensation and a system-level compensation) allows the system to control signal drift more precisely. In one embodiment, the loop filters used to control the VCO (associated with the tuners) and the NCO may be fine-tuned to perform their respective functions. For example, the per-transponder drift will typically be much lower than the overall system drift (e.g., introduced by the LNBs). Accordingly, the loop filters used for the NCO may be configured with a narrower adjustment range than that used for the NCO.

Figure 5A:
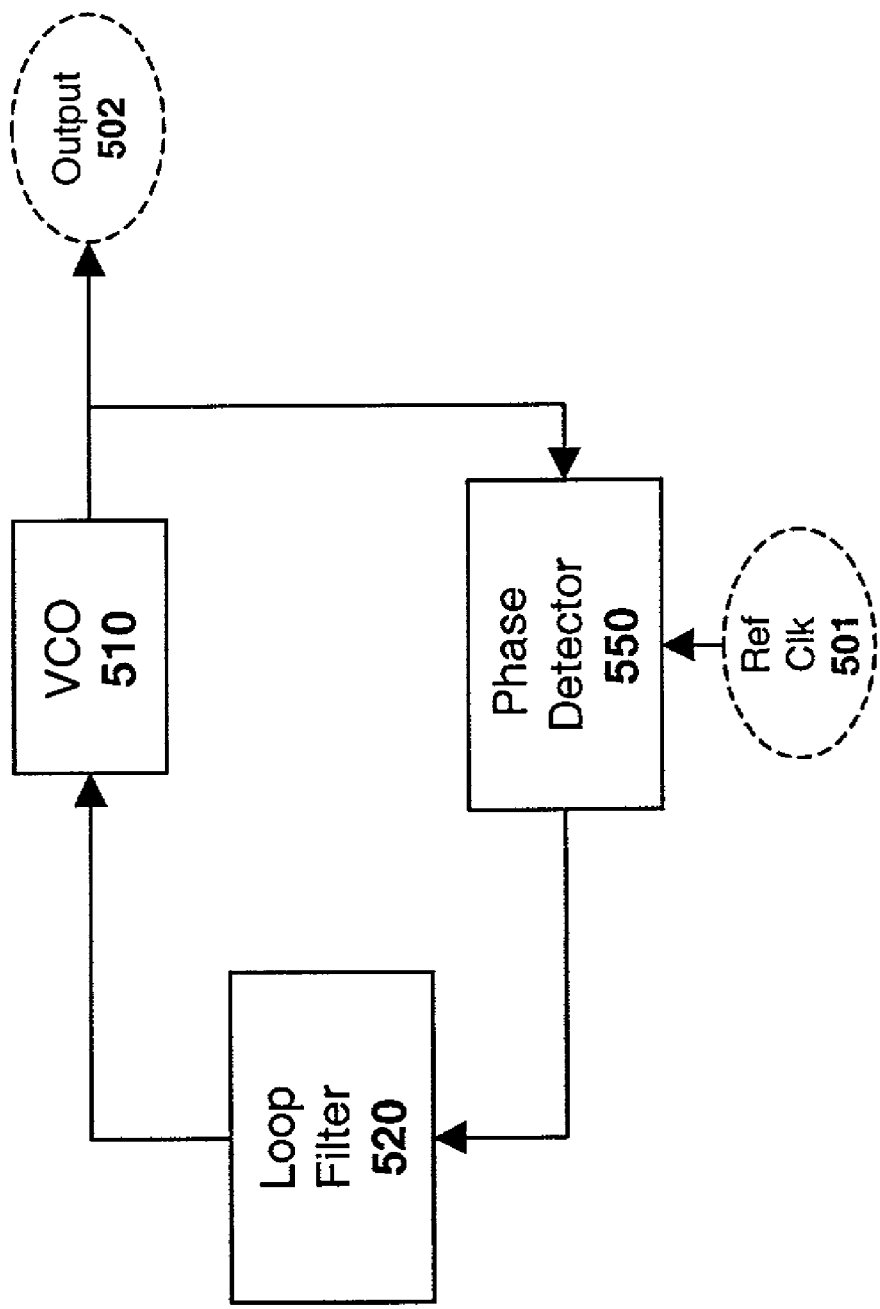
FIG. 5a illustrates a conventional phase locked loop ("PLL") employed in one embodiment of the invention.

As mentioned above, a PLL controls the center frequency for each of the quadrature tuners 201–204. A conventional PLL, illustrated in FIG. 5*a*, is comprised of a VCO 510, which provides an output frequency signal 502 and a phase detector 550 which measures the difference between the output frequency 502 and the frequency of a reference clock signal 501. If the reference frequency and the output frequency are not equal, a loop filter 520 adjusts the VCO 510 (e.g., by increasing/decreasing the signal delay) until the two signals 501, 502 are "locked" at the same frequency. Accordingly, if a conventional PLL is employed in the system, the average drift value transmitted by the averager unit 450 may be used by the loop filter 520 to lock the VCO 510 to the appropriate frequency.

Figure 5B:
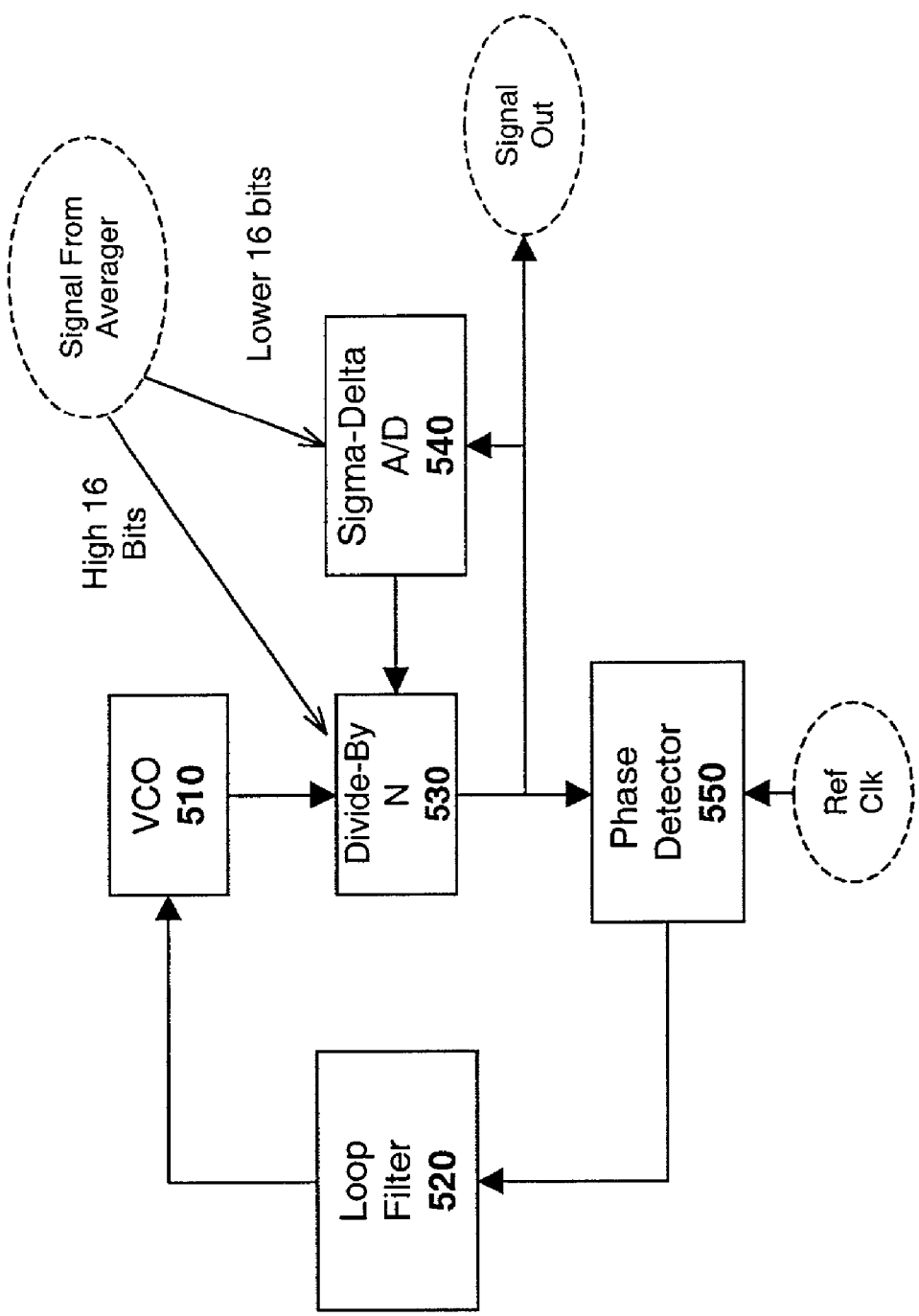
FIG. 5b illustrates an alternate PLL employed in one embodiment of the invention.

In one embodiment, illustrated in FIG. 5*b*, the PLL also includes a divide-by-N unit 530 and a sigma-delta A/D unit 540. The divide-by-N unit 530 provides for precise system drift correction by dividing the output of the VCO 510 by a specified value of N. In one embodiment, the value of N is supplied by the most significant 16 bits of the 32 bit drift value transmitted from the averager unit 450 (i.e., if a 32-bit code is used). Dividing the VCO 510 output by N may cause a significant amount of jitter, particularly for values of N which are not multiples of the reference clock frequency. The sigma-delta A/D unit 540 is used to compensate for the jitter by removing high frequency noise components from the output signal.

DECODER EMBODIMENTS

Depuncture Region

Figure 2B:
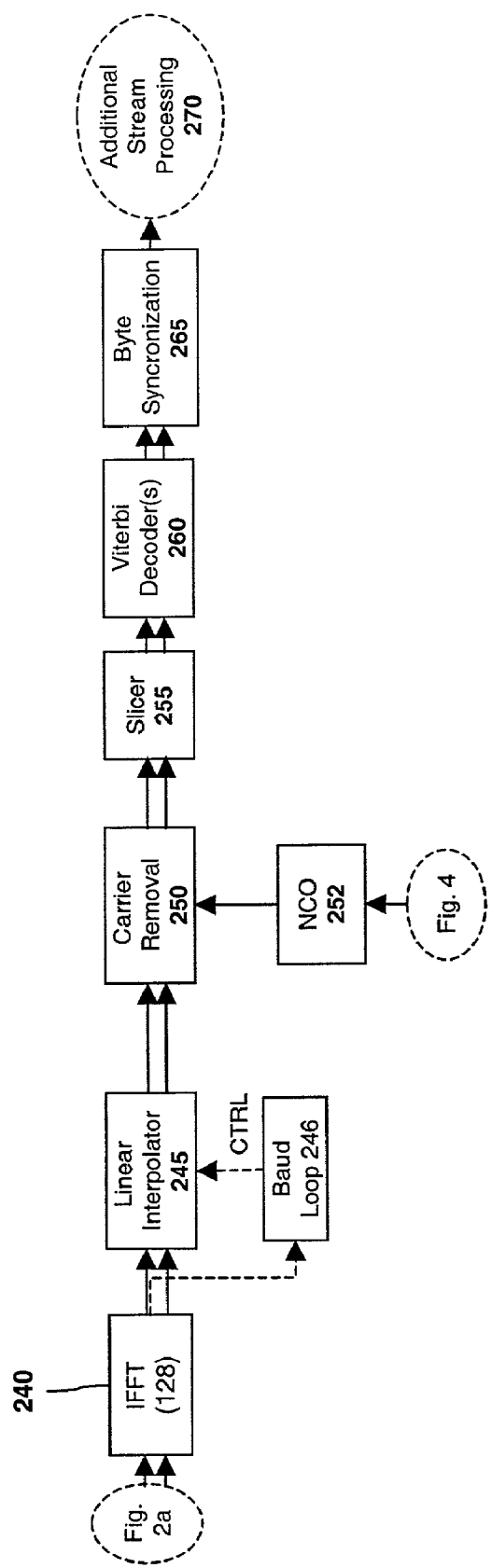
Figure 7:
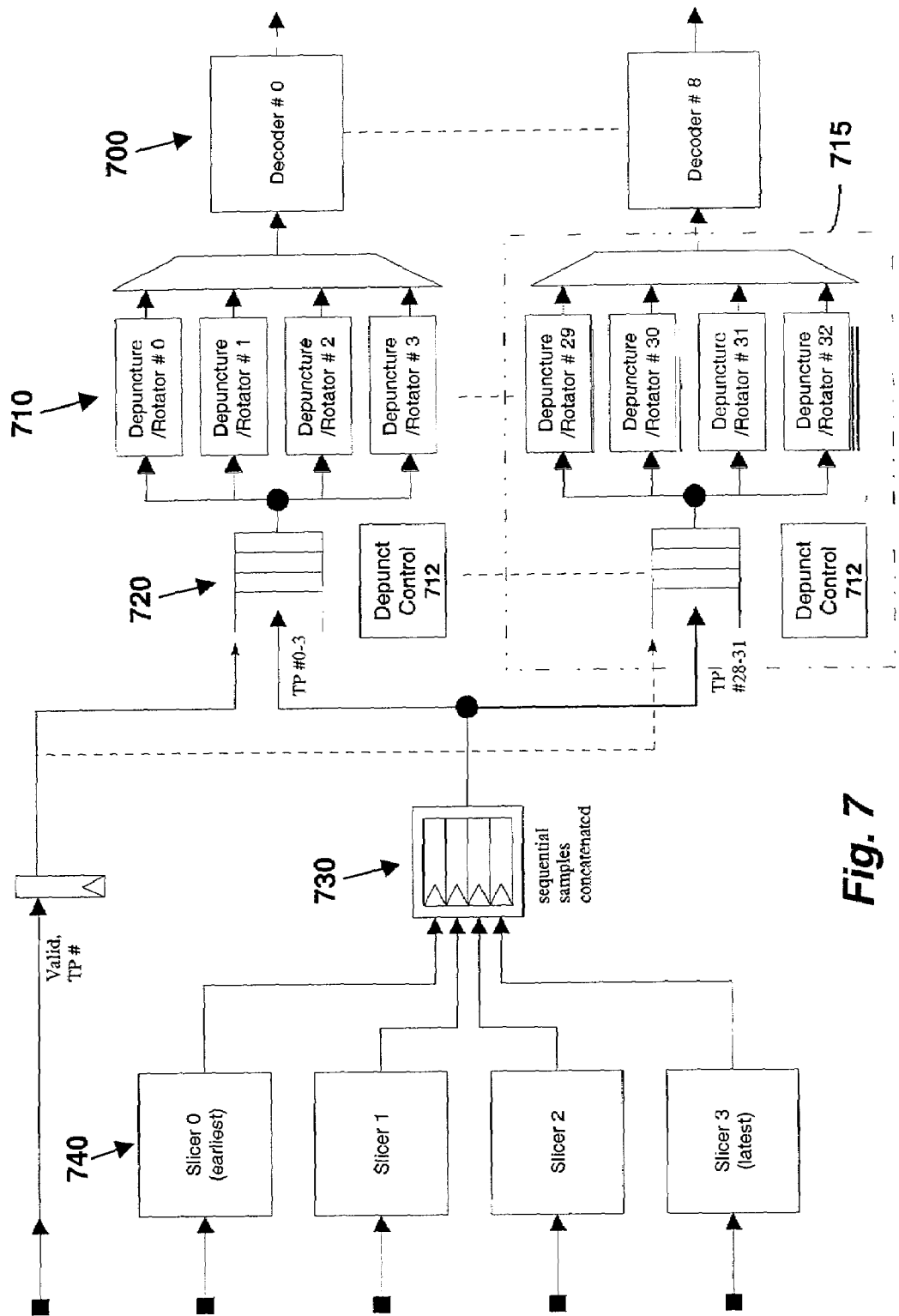
FIG. 7 illustrates slicer, rotator, depuncture, and Viterbi logic according to one embodiment of the invention.

As illustrated in FIG. 2*b*, one embodiment of the system also includes a Viterbi decoder unit 260 and a byte-synchronization unit 265. Viterbi codes are forward error correcting codes used to improve the capacity of a channel by adding some redundant information to the data being transmitted through the channel. As illustrated in FIG. 7, in one embodiment of the invention, the Viterbi decoder unit 260 is comprised of eight Viterbi decoder modules 700 shared across all thirty-two transponders (e.g., with each Viterbi decoder module servicing data streams from four transponders).

The Viterbi decoder unit 260 is also comprised of a plurality of depuncture "regions" 715 which reinsert symbol values into the received stream to match the expected original symbol stream at the transmitter. The transmitter may remove symbol values based on a specific pattern before the actual bit pattern is modulated and sent on the channel. Therefore, some of the original data symbol values are not sent by the transmitter. The depuncture region 715 must insert these erased symbol values into the received symbol stream at the correct locations so that the Viterbi decoders 700 will decode the symbols correctly. In one embodiment there are eight depuncture regions (i.e., one for each Viterbi decoder 700) with each depuncture region 715 comprised of one Viterbi buffer 720; four depuncture/rotator units 710 (e.g., one for each transponder); one depuncture control block 712; and four Viterbi feedback paths 1000 (illustrated in FIG. 10).

The rotator logic of the depuncture/rotator units 710 (illustrated in FIG. 9 as rotator logic 900) rotates the received symbols to the correct phase before depuncturing is performed. For example, in an embodiment which uses QPSK modulation, depuncturing is performed after the rotator portion rotates the symbols to the correct QPSK phase. This is accomplished with the help of the byte synchronization ("BSYNC") unit 265. The BSYNC unit 265 accumulates the bits received from the Viterbi decoder unit 260 and attempts to detect a meaningful byte pattern in them. If it does not find a pattern it recognizes after a programmable amount of time, it informs the rotator portion of the depuncture/rotator units 710 that the phase of the signal from the demodulator is incorrect and must be rotated (e.g., by some multiple of 90 degrees).

Symbols are sometimes removed from the transmitted signal to increase channel bandwidth. This tends to decrease the overall performance of the system for a particular signal to noise ratio ("SNR"). Thus, the tradeoff is between channel bandwidth, system performance, and SNR. The act of removing symbols is called "puncturing" the signal. There are several patterns that can be applied to puncture the signal. These patterns are referred more commonly by their respective code (puncture) rate.

TABLE 1

| Rate | Pattern: X:Y Encoding | | Symbol Pattern | # of States |
|---|---|---|---|---|
| 1/2 | X | 1 | $X_1$ | 1 |
|  | Y | 1 | $Y_1$ |  |
| 2/3 | X | 10 | $X_1 \, Y_2 \, Y_3$ | 2 |
|  | Y | 11 | $Y_1 \, X_3 \, Y_4$ |  |
| 3/4 | X | 101 | $X_1 \, Y_2$ | 3 |
|  | Y | 110 | $Y_1 \, X_3$ |  |
| 5/6 | X | 10101 | $X_1 \, Y_2 \, Y_4$ | 5 |
|  | Y | 11010 | $Y_1 \, X_3 \, X_5$ |  |
| 6/7 | X | 100101 | $X_1 \, Y_2 \, X_4 \, X_6 \, Y_7 \, Y_9 \, Y_{11}$ | 6 |
|  | Y | 111010 | $Y_1 \, Y_3 \, Y_5 \, X_7 \, Y_8 \, X_{10} \, X_{12}$ |  |
| 7/8 | X | 1000101 | $X_1 \, Y_2 \, Y_4 Y_6$ | 7 |
|  | Y | 1111010 | $Y_1 \, Y_3 \, X_5 \, X_7$ |  |

Table 1 above shows the puncture patterns for different code rates. Although a total of six code rates are illustrated, it should be noted that various other code rates may be employed while still complying with the underlying principles of the invention. The code or puncture rate is a fraction that represents the Viterbi output bit rate in relation the number of received symbol values. For instance, if the rate were ½, it would take two symbol values to create a single bit. This is because the Viterbi decoders 700 take a whole symbol as an input an output a single bit for each input symbol. It should be noted that, in one embodiment, a symbol is composed of two symbol values, I and Q. Puncturing removes a single symbol component, I or Q, not the value pair.

To further illustrate the puncturing concept, a rate of ⅔ will be used as an example. Suppose the following symbol pattern is transmitted:

I=X1, X2, X3, X4, . . .
Q=Y1, Y2, Y3, Y4, . . .

Each pair X/Y has been encoded by a Viterbi encoder. The integer values represent the order in time that the symbols were encoded. If the ⅔ rate puncture pattern shown in Table 1 above is applied to this sequence, the following modified sequence is generated:

I=X1, Y2, Y3, X5, . . .
Q=Y1, X3, Y4, Y5, . . .

This is the actual symbol pattern sent by the transmitter. Note that symbol values X2 and X4 have been skipped. These values were skipped since they matched the same position as the zeros in the puncture pattern. Symbol values matching the ones in the puncture pattern are always sent.

In one embodiment, the depuncture/rotator units 710 apply the same puncture pattern as the transmitter applied in order to restore the input symbol pattern to the correct state. Accordingly, the symbol stream should closely resemble the original encoded stream to be recognized and decoded correctly by the Viterbi decoders 700. The depuncture/rotator units 710 insert a null or zero symbol value wherever the incoming symbol value matches a zero in the puncture table. This is similar to the puncture example explained earlier. Symbols that match ones in the puncture table are not affected. Thus, the depuncture/rotator units 710 do not remove any symbol values from the received stream. They only add null symbol values which increases the number of symbol values at the Viterbi input. The rate ½ is an exception. For rate ½, the transmitter does not puncture any symbol values and, as such, the depuncture/rotator units 710 do not insert any null symbol values (signified by its puncture pattern in the table above by the absence of zeros).

Null symbol values are set to zero for the symbol value and have an additional bit set for the symbol indicating it is a null symbol value. Inserting null symbol values effectively increases the number of symbols (i.e., relative to the number of symbols originally received by the depuncture/rotator units 710). That is to say, the input rate into the depuncture/rotator units 710 do not equal the output rate.

As indicated in the rate table, a different number of puncture phases exist for each rate. In one embodiment, this number specifies the possible states of the depuncture logic for a particular code rate. The puncturing logic on the transmitter, and in the feed back path has the same number of states. Code rates may be different for each transponder. Accordingly, one embodiment of the system includes a set of registers which store the code rate for each individual transponder.

Symbols from the slicer blocks 740 are fed into the eight Viterbi buffers 720 within the eight depuncture regions 715. Each region 715 also receives a transponder (TP) number that indicates the transponder number for the symbols. This number is decoded in each region and enables one of the eight buffers to be written. In one embodiment, only a single buffer is written in a given cycle.

In one embodiment, a single Viterbi buffer 720 is employed in each depuncture region 715. Each buffer 720 holds symbols for four transponders. Accordingly, buffering is employed, in part, because each Viterbi block symbols for the transponders not being serviced need to be temporarily stored. Moreover, during depuncturing, extra symbol values are added to the symbols, thus making the bandwidth pattern irregular. Buffering is used to make this pattern more regular so that the Viterbi decoders 700 can be utilized efficiently.

The Viterbi buffer 720 may be implemented as a queue structure using a register file as the main storage element. In one embodiment, there are four separate read and four separate write pointers for the four logical queues to address the register file. The register file uses one read port and one write port since data can be read from the one logical queue and written to another logical queue in the same cycle. A TP number is sent with the slicer symbols to each Viterbi buffer 720. A decoder enables the Viterbi buffer 720 to be written at any given point in time and also specifies which of the four transponder sections to write to the buffer 720.

Each entry or address in the register file holds four symbols worth of data. This includes 8 bits of soft decision×4 symbols and 1 bit feedback bit×4 symbols. Accordingly, in this embodiment, the total width of the register files needs to be minimum 32+4=36 bits. The feedback bit needs to be stored per symbol since symbols may not be aligned (see the description of write control below).

For a Viterbi decoder with a depth of 64, Viterbi buffer simulation experiments show that a storage of 156 symbols per transponder should be sufficient as a buffer length. In one embodiment, this length is rounded up to 192 symbols to add some extra safety margin. Since each buffer has 4 symbols, there needs to be 192/4=48 entries per transponder of logical queue. Since we have 4 logical queues, the physical register has the following dimensions: 192×36, (1 read, 1 write).

In one embodiment, symbols (soft decisions) are written to only one logical buffer space at a time (e.g., since data is supplied for one transponder at a time. There can be up to four symbols received in the same cycle. However, there can be cycles where fewer than four valid symbols received. This data pattern is not always aligned since fewer than four symbols may be received.

Figure 8:
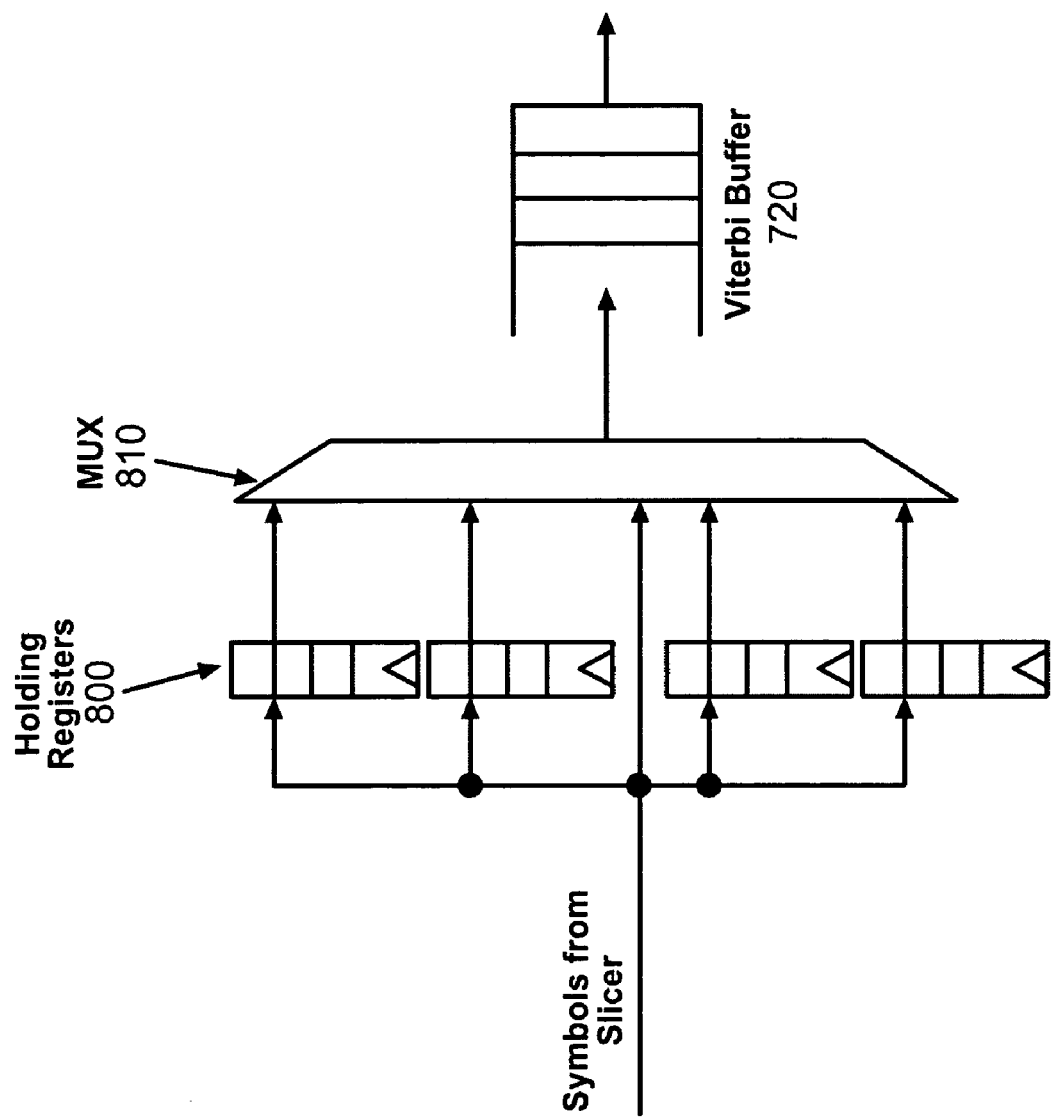
FIG. 8 illustrates a plurality of holding registers and a Viterbi buffer according to one embodiment.

To alleviate this problem, in one embodiment illustrated in FIG. 8, a set of holding registers 800 is provided at the input of the Viterbi buffer 720 to hold symbols to be written to the Viterbi buffer 720. A buffer entry is written when there are four symbols available. Data provided to the Viterbi buffer 720 can come directly from the slicers 740 or from the holding registers or from a combination of both. In one embodiment, there are actually four different sets of holding registers 800 within each depuncture region 715, one for each transponder.

In one embodiment, the multiplexer 810 illustrated in FIG. 8 is selecting data for a single transponder. This multiplexer 810 may be more complicated than what is shown. As enumerated in Table 2 below, there may be several combinations to consider in order to write the data to correct place. More specifically, Table 2 below shows combinations for a single transponder when multiplexing data between symbols from the slicer blocks 740 and the symbols held in the holding registers 800. It also enumerates writes and reads from the holding registers. Consider the first row of the table as the simplest example. There are no valid symbols from the interpolator 245 and nothing is in the holding registers 800. In this case, no writes are performed. In fact, in one embodiment, no writes are performed when there is no valid data, regardless of the content stored in the holding registers 800.

since these are the earliest in time. The three symbols from the holding registers would be combined with one of the symbols from the slicers 740 as the four symbols to write to the Viterbi buffer 720.

In one embodiment, the depuncture/rotator units 710 receive symbols for a particular transponder from the Viterbi buffer 720 until the number of symbols processed exceeds a maximum limit. This limit is controlled by a depuncture control block 712. When this limit is reached, the depuncture control block signals a context switch and reads from the next transponder queue. In one embodiment, the depuncture control block 712 asserts a 4 bit 1-hot vector which acts as a read enable to the Viterbi buffer 720. The vector selects one of four read pointers to form the read address for the register file. After the read is completed the read pointer is incremented. If none of the read enables are set, then no data is returned to the depuncture/rotator unit 710 and the read pointers are not affected. In one embodiment, on every read, the register file returns four symbols to the depuncture/rotator units 710.

In one embodiment, the Viterbi buffer 720 sends four independent signals (one for each logical transponder queue) to the depuncture control block 712, which indicates whether the number of entries in the buffer will result in 64 symbols that can be sent to the Viterbi decoder 700 for that transponder. In one embodiment, the signals are set if the following is true for a particular queue: ((Write Pointer−Read Pointer)*2*code rate)>64.

The depuncture/rotator unit 710 requests symbols from the Viterbi buffer 720, and in response, the Viterbi buffer 720 provides four symbols at a time (i.e., because each entry in the buffer holds four symbols). As mentioned above, in an embodiment which uses QPSK modulation, the depuncture/

TABLE 2

| Valid Symbols S3 S2 S1 S0 | Holding Register Valid Bits H2 H1 H0 | Holding Register WE | Holding Registers Write Data | VBUF WE | VBUF Write Data Entries |
|---|---|---|---|---|---|
| 0000 | 000 | 000 | — — — | 0 | — — — — |
| 0000 | 001 | 000 | — — — | 0 | — — — — |
| 0000 | 011 | 000 | — — — | 0 | — — — — |
| 0000 | 111 | 000 | — — — | 0 | — — — — |
| 0001 | 000 | 001 | — — S0 | 0 | — — — — |
| 0001 | 001 | 010 | — S0 — | 0 | — — — — |
| 0001 | 011 | 100 | S0 — — | 0 | — — — — |
| 0001 | 111 | 000 | — — — | 1 | S0 H2 H1 H0 |
| 0011 | 000 | 011 | — S1 S0 | 0 | — — — — |
| 0011 | 001 | 110 | S1 S0 — | 0 | — — — — |
| 0011 | 011 | 000 | — — — | 1 | S1 S0 H1 H0 |
| 0011 | 111 | 001 | — — S1 | 1 | S0 H2 H1 H0 |
| 0111 | 000 | 111 | S2 S1 S0 | 0 | — — — — |
| 0111 | 001 | 000 | — — — | 1 | S2 S1 S0 H0 |
| 0111 | 011 | 001 | — — S2 | 1 | S1 S0 H1 H0 |
| 0111 | 111 | 011 | — S2 S1 | 1 | S0 H2 H1 H0 |
| 1111 | 000 | 000 | — — — | 1 | S3 S2 S1 S0 |
| 1111 | 001 | 001 | — — S3 | 1 | S2 S1 S0 H0 |
| 1111 | 011 | 011 | — S3 S2 | 1 | S1 S0 H1 H0 |
| 1111 | 111 | 111 | S3 S2 S1 | 1 | S0 H2 H1 H0 |

Taking a more complicated example, the last row of the table demonstrates writes to both the holding registers and the Viterbi buffer 720. In this case, there are three valid entries in the holding registers and four valid symbols from the slicers 740. The oldest symbols should be written to the Viterbi buffer 720 and the earliest symbols should be written to the holding registers 800. Thus, in this particular example, S3, S2, and S1 would be written to the holding registers 800 rotator unit 710 first performs a QPSK rotation on the symbols before it depunctures them.

The byte synchronization unit 265 (BSYNC) accumulates bits received from the Viterbi decoder unit 260 and attempts to detect a meaningful byte pattern in them. If it does not find a recognizable pattern within a programmable amount of time, then it will either indicate to the depuncture/rotator units 710 to change the rotator phase or the puncture phase.

There are two possible rotator phases: 0 degrees and 90 degrees. Byte sync alternates between these two phase when it is trying to find synchronization. If the current rotation phase from byte sync is 0 degrees, then the symbol values read from the Viterbi buffer (I and Q) are passed unchanged to the depuncture unit. If the current rotation phase from byte sync is 90 degrees, then the Q symbol value read from the Viterbi buffer is passed as I symbol value to the depuncture unit, and the I symbol value read from the Viterbi buffer is inverted, and sent as Q symbol value to the depuncture unit. This is illustrated in Table 3 below where Irot and Qrot are the output of the rotator unit going to the depuncture unit, and I and Q are the symbol values read from the Viterbi buffer:

TABLE 3

| Rotator Phase | Irot | Qrot |
|---|---|---|
| 0 | I | Q |
| 90 | Q | ~I |

By rotating 90 degress, the rotator can reach all 4 phases 90, 180, 270 and 0 degrees.

Figure 9:
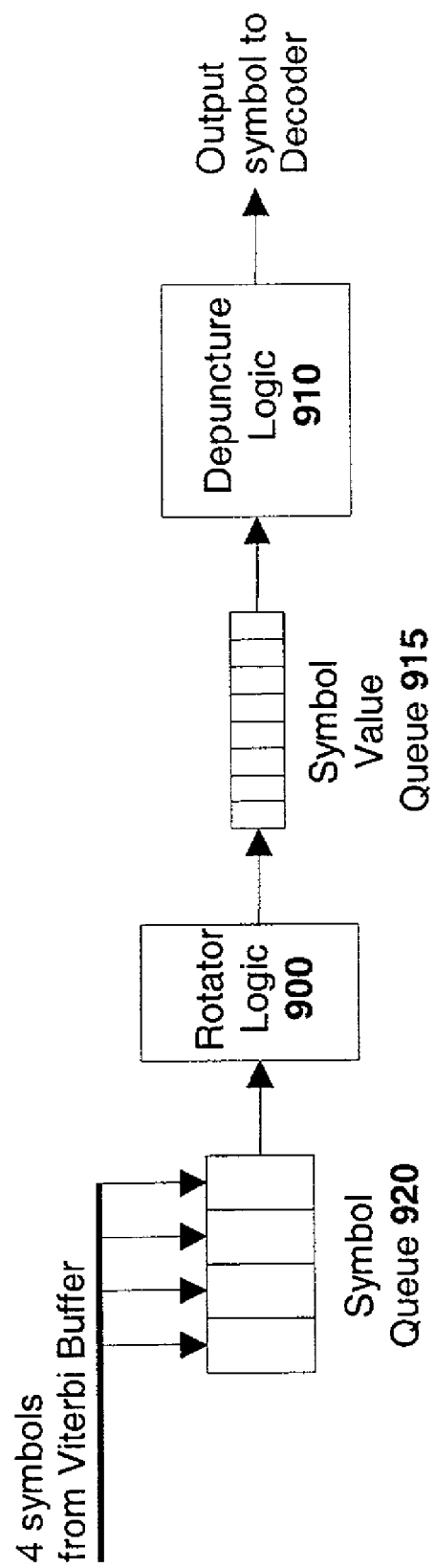
FIG. 9 illustrates rotator and depuncture logic according to one embodiment of the invention.

A data path for a depuncture/rotator unit 710 employed in one embodiment of the invention is illustrated in FIG. 9. Four symbols are simultaneously loaded into a symbol queue 920. In one embodiment, the rotator logic processes one symbol at a time. Rotated symbol values are then fed to a symbol value queue 915 that will be read by the depuncture logic 910. The depuncture logic 910 reads 0,1, or 2 symbol values from symbol value queue 915 depending on the puncture pattern. Note that in one embodiment the depuncture logic reads symbol values, not necessarily an entire symbol (as mentioned above, depuncturing is performed on symbol values).

The rotator logic 900 transmits data to the symbol value queue 915 until it is full. In one embodiment, the symbol value queue 915 holds four rotated symbols (eight symbol values). Alternatively, the symbol value queue 915 may hold more than four symbols (e.g., eight symbols) because of the turnaround time reading from the Viterbi buffer 720. For example, it may need to queue up more than four symbols to avoid starving the depuncture logic 910.

This buffering scheme is employed in one embodiment because the depuncture logic 910 does not have to consume a symbol every cycle from the symbol value queue 915. Depending on the puncture pattern, the depuncture logic 910 may create a null symbol to be sent to the Viterbi decoder 700 in a given cycle. Accordingly, the depuncture logic 910 effectively increases the symbol bandwidth into the Viterbi region. This is one of the factors that affects the Viterbi buffer 720 size requirements.

TABLE 4

| Code Rate Name | Current State | Change Phase | Next State | RD1 | RD2 | SYMICTL | SYMQCTL |
|---|---|---|---|---|---|---|---|
| 1/2 | 000 | — | 000 | 0 | 1 | DIN0 | DIN1 |
| 2/3 | 000 | — | 001 | 0 | 1 | DIN0 | DIN1 |
|  | 001 | 0 | 000 | 1 | 0 | NULL | DIN0 |
|  | 001 | 1 | 111 | 1 | 0 | NULL | DIN0 |
|  | 111 | — | 000 | 1 | 0 | DIN0 | NULL |

TABLE 4-continued

| Code Rate Name | Current State | Change Phase | Next State | RD1 | RD2 | SYMICTL | SYMQCTL |
|---|---|---|---|---|---|---|---|
| 3/4 | 000 | — | 001 | 0 | 1 | DIN0 | DIN1 |
|  | 001 | — | 010 | 1 | 0 | NULL | DIN0 |
|  | 010 | 0 | 000 | 1 | 0 | DIN0 | NULL |
|  | 010 | 1 | 111 | 1 | 0 | DIN0 | NULL |
|  | 111 | — | 000 | 1 | 0 | DIN0 | NULL |
| 5/6 | 000 | — | 001 | 0 | 1 | DIN0 | DIN1 |
|  | 001 | — | 010 | 1 | 0 | NULL | DIN0 |
|  | 010 | — | 011 | 1 | 0 | DIN0 | NULL |
|  | 011 | — | 100 | 1 | 0 | NULL | DIN0 |
|  | 100 | 0 | 000 | 1 | 0 | DIN0 | NULL |
|  | 100 | 1 | 111 | 1 | 0 | DIN0 | NULL |
|  | 111 | — | 000 | 1 | 0 | DIN0 | NULL |
| 6/7 | 000 | — | 001 | 0 | 1 | DIN0 | DIN1 |
|  | 001 | — | 010 | 1 | 0 | NULL | DIN0 |
|  | 010 | — | 011 | 1 | 0 | NULL | DIN0 |
|  | 011 | — | 100 | 1 | 0 | DIN0 | NULL |
|  | 100 | — | 101 | 1 | 0 | NULL | DIN0 |
|  | 101 | 0 | 000 | 1 | 0 | DIN0 | NULL |
|  | 101 | 1 | 111 | 1 | 0 | DIN0 | NULL |
|  | 111 | — | 000 | 1 | 0 | DIN0 | NULL |
| 7/8 | 000 | — | 001 | 0 | 1 | DIN0 | DIN1 |
|  | 001 | — | 010 | 1 | 0 | NULL | DIN0 |
|  | 010 | — | 011 | 1 | 0 | NULL | DIN0 |
|  | 011 | — | 100 | 1 | 0 | NULL | DIN0 |
|  | 100 | — | 101 | 1 | 0 | DIN0 | NULL |
|  | 101 | — | 000 | 1 | 0 | NULL | DIN0 |
|  | 110 | 0 | 000 | 1 | 0 | DIN0 | NULL |
|  | 110 | 1 | 111 | 1 | 0 | DIN0 | NULL |
|  | 111 | — | 000 | 1 | 0 | DIN0 | NULL |

One embodiment of depuncture logic 910 is based on Table 4 shown above. This table is derived from Table 1. In one embodiment, the state of the depuncture logic 910 is held in a register. The current state and the code rate determines the next state and the outputs. In one embodiment, 4 output signals control the functioning of the depuncture logic. In one embodiment, these signals are referred to as RD1, RD2, SYMICTL and SYMQCTL. The depuncture logic continuously cycles through all the states as indicated in Table 4.

RD1 and RD2 are mutually exclusive, i.e., both cannot be asserted at the same time. If RD1 is asserted then 1 symbol value is read from the symbol value queue 915. If RD2 is asserted the 2 symbol values are read from the symbol value queue 915. SYMICTL controls the value being sent out as symbol value I to the Viterbi decoder 700. SYMICTL can take two values: DIN0 and NULL. DIN0 indicates that the first symbol value read from the symbol value queue is sent out as symbol value I. NULL indicates that a NULL symbol is inserted at symbol value I position.

SYMQCTL controls the value being sent out as symbol value Q to the Viterbi decoder 700. SYMQCTL can take three values: DIN0, DIN1, and NULL. DIN0 indicates that the first symbol value read from the symbol value queue is sent out as symbol value Q. DIN1 indicates that the second symbol value read out of the symbol value queue is sent out as symbol value Q. NULL indicates that a NULL symbol is inserted at symbol value Q position. An additional control signal may be sent along with the null symbol value to be used by the Viterbi decoder 700 to handle NULL symbols in a special manner.

Two control signals from the byte synchronization unit 265 that affect the depuncture region 715 are referred to herein as "change puncture phase" and "current rotational phase" signals. In one embodiment, these signal operate on a per-transponder/carrier basis, so there are 4 independent signals for each of them giving a total of 8 signals. The BSYNC unit accumulates bits received from the Viterbi decoder unit 260 and attempts to detect a meaningful byte pattern. If it does not find a recognizable pattern within a programmable amount of time, then it will either indicate to the depuncture/rotator units 710 to change the rotator phase or the puncture phase.

The "change puncture phase" signal indicates a change is required in the puncture phase for a given transponder. The BSYNC unit sends this signal as a single clock pulse to the depuncture logic. When the depuncture logic receives the "change puncture phase" signal, it tries a new puncturing phase, and the design of depuncture logic is such that it cycles through all possible puncturing phases. When the right combination of the rotator phase and depuncture phase is found, the BSYNC unit will be able to find a recognizable pattern, i.e., it will achieve synchronization and it will stop sending the "change puncture phase" signal.

In one embodiment, the "change puncture phase" signal is a pulse and it is latched and held by the depuncture unit, and is called the "change phase" signal. If the "change phase" signal is set, then the depuncture state for each code rate transitions to a special state indicated by state number 7 in Table 4. This transition occurs only after the last state for a particular code rate is reached. For example, for code rate ⅚, state number 4 is normally the last state and then it transitions to state 0. If "change phase" signal is set, then state number 4 is followed by the special state 7. In state 7, a single symbol value is read from the symbol value queue, the read symbol value is passed as the I symbol value to the viterbi decoder, and a NULL value is passed as the Q symbol value. This mechanism ensures that a change of puncture phase occurs at the depuncture unit. State number 7 then transitions back to state 0, and the "change phase" signal is cleared. This unique design guarantees that a new puncture phase will be tried on each occurrence of the "change puncture phase" signal from the BSYNC unit. The "change phase" signal has no affect on the operation of the depuncture unit during any state other than the last state for the particular code rate. On every puncture phase change, the depuncture region sends out a control signal which is piped along with the symbol values coming out of the depuncture region. This signal is used by the puncture block 1020 in the feedback path.

The current rotational phase signals specify the current rotational phase for the rotator logic 900. This signal is fed to the rotator logic 900 in the depuncture/rotator unit 720 and the de-rotator in the Viterbi Feedback path 1000. This signal is used as a multiplexer select for the rotator logic 900 and the de-rotator logic 1030.

As mentioned above, each depuncture control block 712 handles context switching between the transponder contexts in a depuncture region 715. In one embodiment, the depuncture control block 712 also controls the replay behavior of the Viterbi decoders 700 (described in detail below) region and the buffering required for the depuncture logic 910. The depuncture control block 712 receives a vector which indicates the active transponder. In one embodiment, it is ultimately is responsible for the following functions:

(1) Sending 4 read-enable signals (1 per transponder) to the Viterbi buffer 720. Only one of these 4 read-enables is active at any given time. The Viterbi buffer 720 selects the correct read pointer based on the active read-enable signal, read the buffer entry, and provide the 4 symbols to the depuncture/rotator unit 710. The read pointer is incremented following the read. On every context switch, the depuncture control block 712 selects a new transponder buffer (e.g., in a round-robin fashion). During Viterbi replay state, the read-enables are masked off so that no reads occur.

(2) Generating a save-ACS signal which is piped along with the symbols to the Viterbi region. Every context switch is preceded by a save-ACS signal. The Viterbi region needs to be fed exactly 64 symbols between a context switch and a previous save-ACS assertion. The save-ACS signal will be described in greater detail below.

(3) Generate a context switch signal which is piped along with the symbols. This signal is used to select a new depuncture/rotator unit 710 and to select new transponder data from the Viterbi buffer 720. The depuncture control block signals a context switch when the number of symbols processed for a transponder exceeds a predetermined maximum limit, or the number of symbols in the Viterbi buffer 720 falls below some minimum number.

Figure 11:
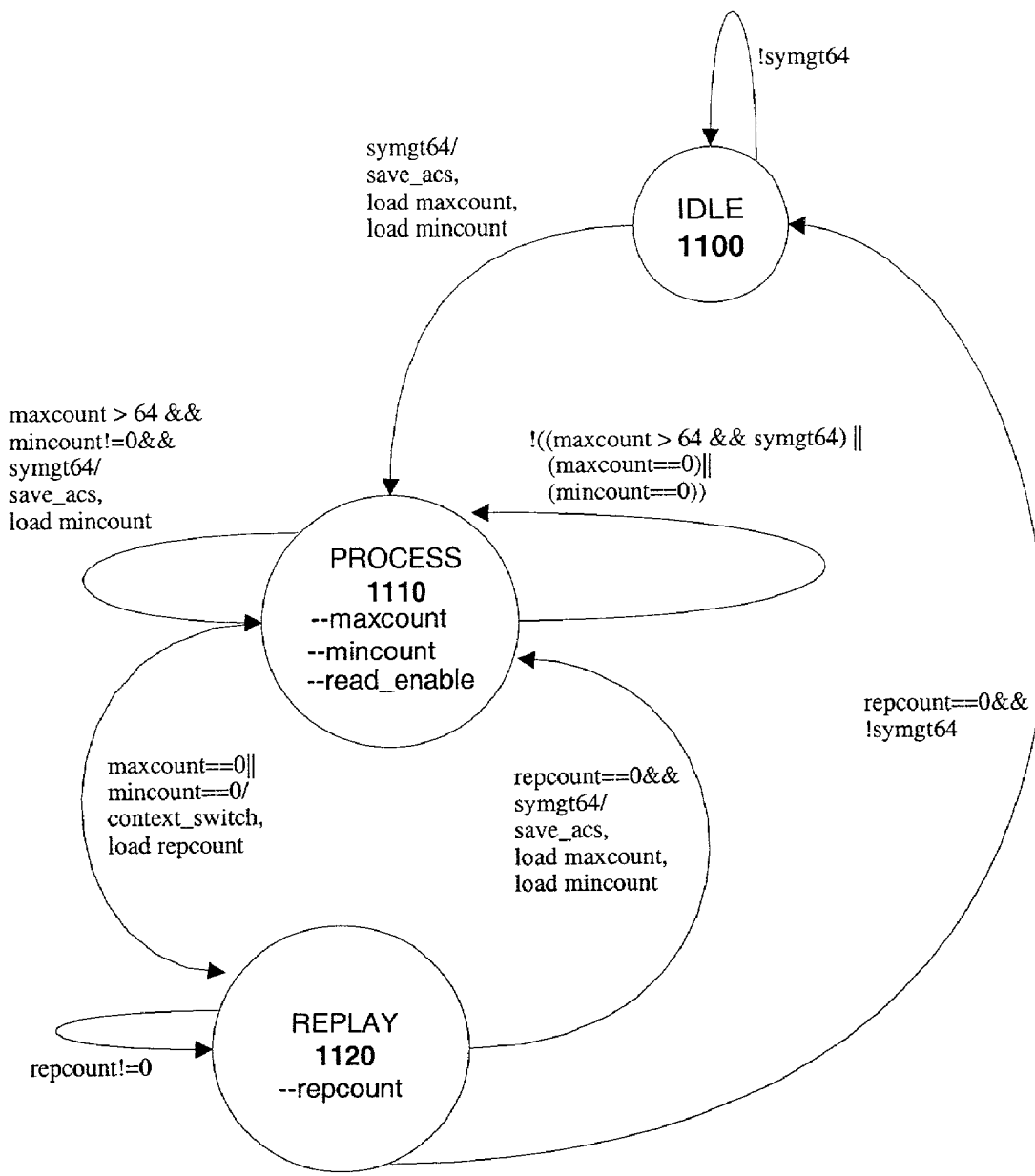
FIG. 11 illustrates depuncture control states according to one embodiment of the invention.

FIG. 11 illustrates a state diagram describing one embodiment of the depuncture control block 712. As illustrated, according to this embodiment the depuncture control block 712 has three states in its state machine (IDLE 1100, PROCESS 1110, and REPLAY 1120) and it maintains three counters (maxcounter, mincounter, replaycounter). Each of these counters can be loaded with a predetermined (e.g., software programmable) value. In one embodiment, MINCOUNTER is loaded with a value of 64, MAXCOUNTER is loaded with a value of 256, and REPLAYCOUNTER is loaded with a value of 64. The following is the description of each state:

(1) IDLE 1100: The depuncture control block 712 stays in the Idle state as long as there are less than 64 symbols to be processed in the Viterbi buffer 720. When the number of symbols in the Viterbi buffer 720 exceed 64, the Viterbi buffer 720 sends a signal to the depuncture control block 712 block. This signal triggers the transition to the process state, generates the save-ACS signal and loads the maxcounter and mincounter.

(1) PROCESS 1110: While in the process state, the maxcounter and mincounter are decremented when valid symbols are sent to Viterbi decoders. In addition, while in the process state, the depuncture control block 712 generates read-enable signals when it needs to read new symbols from the Viterbi buffer 720. The mincounter gets reloaded every time the Viterbi buffer 720 asserts its signal indicating that the number of buffered symbols exceed 64. When either one of maxcounter or mincounter goes to zero, a context switch is signaled by the depuncture control block 712, the state transitions to replay state (described below), and the replay counter is loaded. On every context switch, the depuncture control block 712 identifies a new transponder by updating the read-enable signals.

REPLAY 1120: In this state, the replay counter is decremented every cycle. Once the replay counter goes to zero, and if the Viterbi buffer signal is asserted (i.e., indicating more than 64 buffered symbols) for the current transponder, then the state will transition to PROCESS state. If the Viterbi buffer signal is not asserted, then the depuncture control block 712 will transition to the IDLE state.

Figure 10:
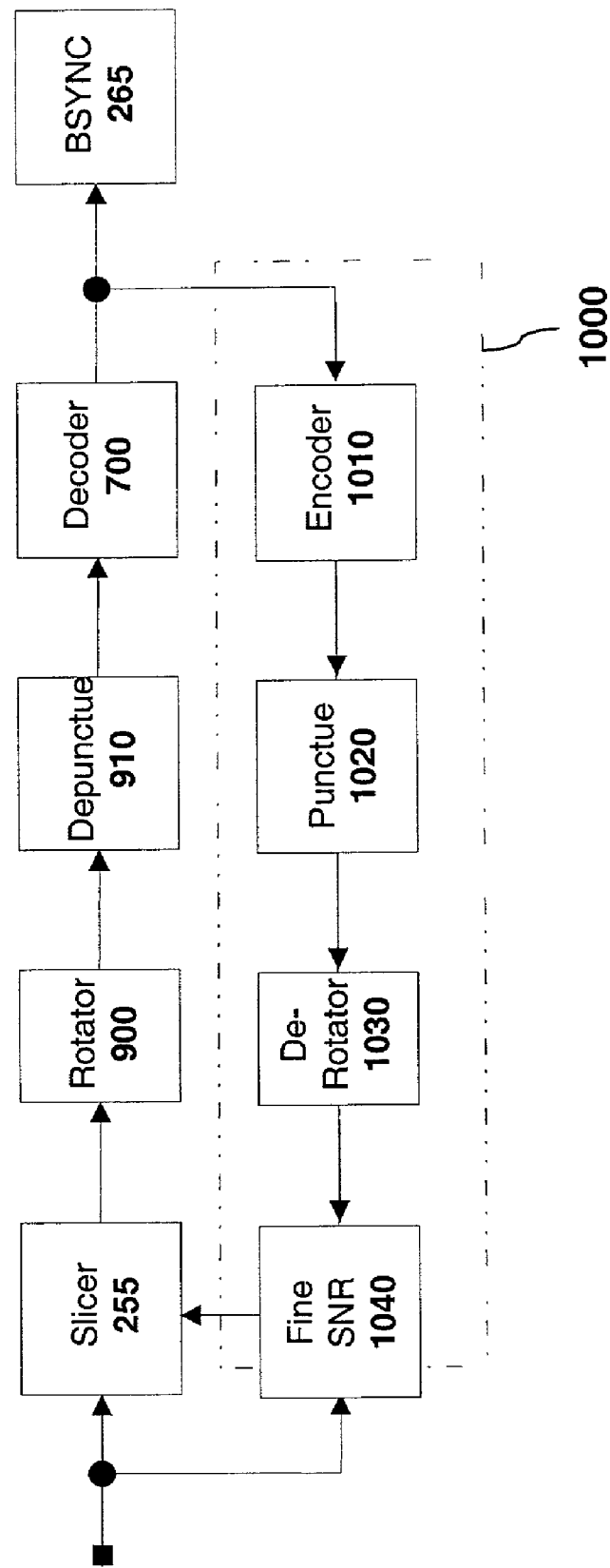
FIG. 10 illustrates a Viterbi feedback loop according to one embodiment of the invention.

In one embodiment, a Viterbi Feedback Path ("VFP") 1000, illustrated in FIG. 10, is provided in the depuncture region 715. It is composed of a Viterbi encoder 1010, a puncture block 1020, a de-rotator 1030, and a fine SNR block 1040. The feedback path provides feedback from the Viterbi encoders 1010 to a fine SNR block 1040 associated with the slicers 255. In particular, the fine SNR block 1040 uses this information to update the slicer decision levels and/or to monitor noise variance and signal power.

In one embodiment, the feedback response bit from the Viterbi encoders is transmitted all the way through the feedback path along with its associated data bit. This will eventually reach the fine SNR block 1040 and will indicate a valid response to the fine SNR's feedback request. In one embodiment, there are four instances of this entire path in the depuncture region 715 (i.e., each transponder is provided with its own path).

Figure 12:
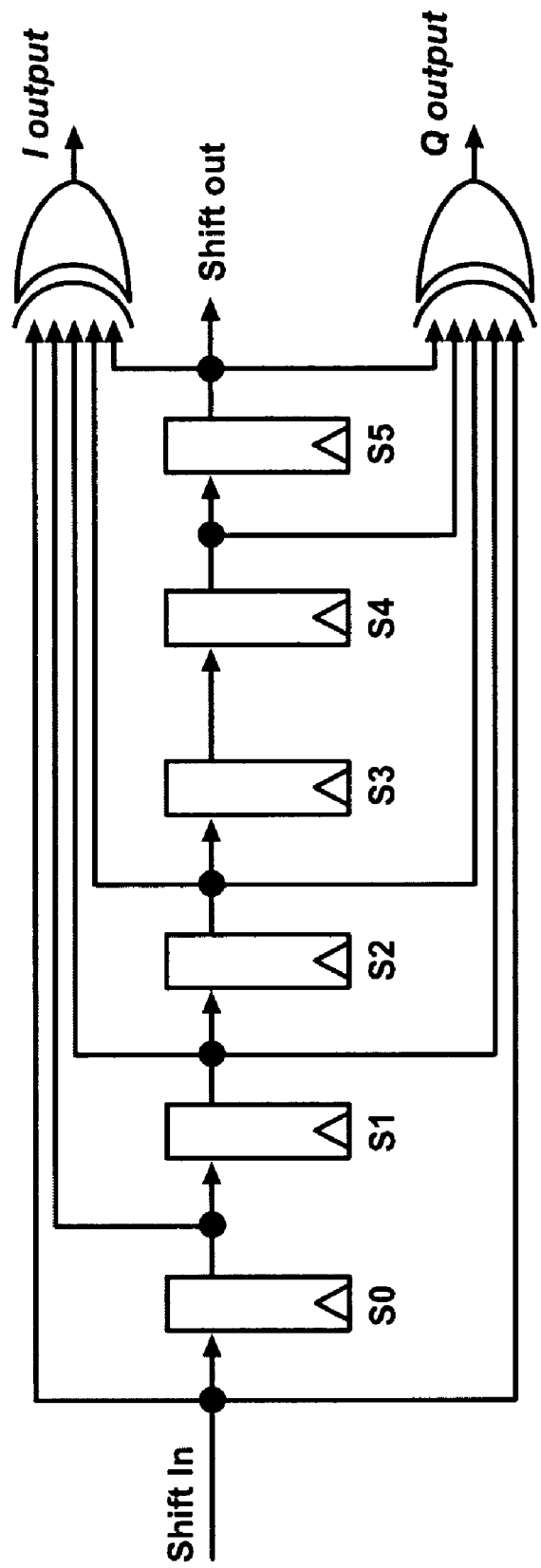
FIG. 12 illustrates a Viterbi encoder employed in one embodiment of the invention.

FIG. 12 illustrates a Viterbi encoder 1010 employed in one embodiment of the invention. It is comprised of a shift register structure with taps to generate two outputs every cycle. The encoder 1010 takes a single bit from the Viterbi decoder 700 and re-encodes it to two hard decision values, I and Q (i.e., using the rate ½ encoder). The I and Q values are then passed to the puncture block 1020.

The puncture block 1020 operates in a converse manner to the depuncture block 910. Instead of adding null symbol values, it throws away the symbol values according to the puncture patterns described in Table 1. In one embodiment, no buffering is required in the depuncture block 910 because the output rate is always less than or equal to the input rate (i.e., because the puncture block throws away symbol values). The state machine for the puncture block is described in Table 5 below. The control signal indicating a change of puncture phase is piped along with the data coming from the Viterbi encoder. IN one embodiment, this change of phase signal is guaranteed to arrive only when the puncture block is in state 0 (for any of the code rates), and it is asserted only for a single symbol. The puncture state machine described in the table below generates two outputs: NOPNI and NOPNQ. NOPNI indicates that the I symbol value is not punctured, while NOPNQ indicates that the Q symbol value is not punctured.

TABLE 5

| Code Rate Name | Current State | Change Phase | Next State | NOPNI | NOPNQ |
| --- | --- | --- | --- | --- | --- |
| 1/2 | 000 | — | 000 | 1 | 1 |
| 2/3 | 000 | 1 | 000 | 1 | 0 |
|  | 000 | 0 | 001 | 1 | 1 |
|  | 001 | — | 000 | 0 | 1 |
| 3/4 | 000 | 1 | 000 | 1 | 0 |
|  | 000 | 0 | 001 | 1 | 1 |
|  | 001 | — | 010 | 0 | 1 |
|  | 010 | — | 000 | 1 | 0 |
| 5/6 | 000 | 1 | 000 | 1 | 0 |
|  | 000 | 0 | 001 | 1 | 1 |
|  | 001 | — | 010 | 0 | 1 |
|  | 010 | — | 011 | 1 | 0 |
|  | 011 | — | 100 | 0 | 1 |
|  | 100 | — | 000 | 1 | 0 |
| 6/7 | 000 | 1 | 000 | 1 | 0 |
|  | 000 | 0 | 001 | 1 | 1 |
|  | 001 | — | 010 | 0 | 1 |
|  | 010 | — | 011 | 0 | 1 |
|  | 011 | — | 100 | 1 | 0 |
|  | 100 | — | 101 | 0 | 1 |
|  | 101 | — | 000 | 1 | 0 |
| 7/8 | 000 | 1 | 000 | 1 | 0 |
|  | 000 | 0 | 001 | 1 | 1 |
|  | 001 | — | 010 | 0 | 1 |
|  | 010 | — | 011 | 0 | 1 |
|  | 011 | — | 100 | 0 | 1 |
|  | 100 | — | 101 | 1 | 0 |
|  | 101 | — | 110 | 0 | 1 |
|  | 110 | — | 000 | 1 | 0 |

The de-rotator block 1030 is fed by the puncture block 1020. It rotates symbols using the exact inversion of the rotator block 900 based on the "current rotational phase" signals described above. The phase rotation table for one embodiment of the de-rotator 1030 is shown in Table 6 below.

TABLE 6

| De-rotator Phase | $I_{rot}$ | $Q_{rot}$ |
| --- | --- | --- |
| 0° | I | Q |
| −90° | ~Q | I |

By rotating −90 degress, all de-rotators can reach all phases (i.e., −90, −180, −270 and 0 degrees). The output of the de-Rotator will be two rotated symbol values, Irot and Qrot. However, in one embodiment, only the Irot symbol value must be passed on because the fine SNR block 1040 only looks at the I values of the symbol.

Viterbi Region

For those unfamiliar with the principles associated with Viterbi encoding/decoding, a general discussion of these principles can be found in BRUCE A. CARLSON, COMMUNICATION SYSTEMS, AN INTRODUCTION TO SIGNALS AND NOISE IN ELECTRICAL COMMUNICATION ($3^{rd}$ ed. 1986) at 491–508, and SIMON HAYKIN, DIGITAL COMMUNICATIONS (1988) at 393–141.

In one embodiment of the invention, each of the Viterbi decoders is comprised of (1) a Replay Unit and Replay Buffers; (2) a Branch Metric Unit; (3) an Add-Compare-Select Unit and ACS Buffers; (4) a forward-tracing array; and (5) a Minimization Unit.

Replay Unit and Replay Buffers

As mentioned above, in one embodiment, eight Viterbi decoders 700 are shared across thirty-two transponders with each Viterbi decoder servicing four transponders. Of course, various alternate numbers of Viterbi decoders may be employed while still complying with the underlying principles of the invention (e.g., based on variables such as the processing throughput of the Viterbi decoders, the required bitrate of the transponder data streams, and the number of transponders, to name a few).

Moreover, although described below with respect to the Viterbi algorithm, the principles of the invention may be implemented in systems which use alternate types of encoding/decoding. This may include, for example, various other types of maximum-likelihood codes, forward error correction ("FEC") codes, convolutional codes (e.g., Turbo Code), and cyclic codes (e.g., Reed-Solomon Codes), to name a few.

In one embodiment, when a particular decoder changes the transponder or cable carrier it is processing, the decoder is restored to the same state it was in when it was processing the same transponder/carrier the last time around. As used herein, a "context switch" occurs when the decoder switches from processing one transponder/carrier to another. Restoring the state of the decoder on a context switch may be accomplished in a variety of ways. For example, in one embodiment, the decoder state is saved on every context switch. The correct state is then selected when processing a particular transponder. Alternatively, or in addition, the state itself may not be saved. Rather, when switching from one transponder (or cable carrier) to another, N symbols output by the transponder the last time around are replayed, thereby restoring the state of the decoder. In one embodiment, N is greater than or equal to the depth of the Viterbi trellis. In one specific embodiment, N=64. However, it will be appreciated that the particular value of N is not pertinent to the underlying principles of the invention.

There are various cost/performance tradeoffs between the non-replay and the replay scheme. For example, under the non-replay scheme the same output bandwidth (e.g., 1 GB/sec) may be achieved as that of the replay scheme using fewer Viterbi decoders. On the other hand, the replay scheme may require fewer forward-tracing arrays (e.g., 8 as opposed to 32). Either scheme may be more or less appropriate depending on the system configuration (e.g., based on parameters such as the required output bandwidth, number of transponders processed, . . . etc).

Figure 14:
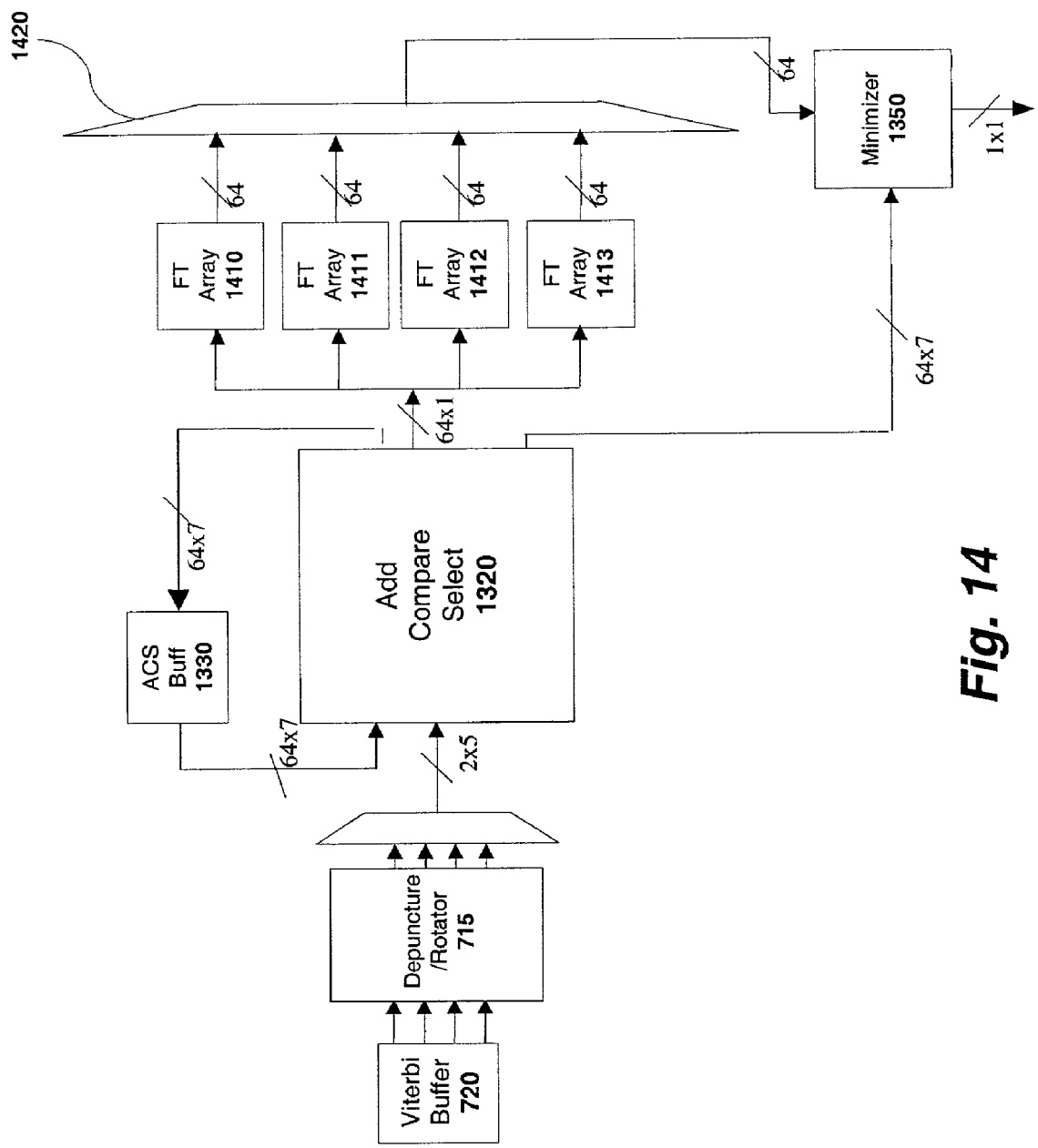
FIG. 14 illustrates one embodiment of a Viterbi decoder which employs a non-replay scheme.

One advantage which the replay scheme has over the non-replay scheme is that in the replay scheme, a multi-cycle bubble due to a context switch can be tolerated whereas in the non-replay scheme, the context switch may need to be accomplished in fewer (e.g., 0) cycles. Another issue to be considered is that the non-replay scheme may require a wider fanout of signals from the add-compare-select unit 1320 (described below). For example, as illustrated in FIG. 14, 64 ACS outputs may need to feed 4 forward-tracing arrays 1410–1416 and the 64 outputs of the 4 forward-tracing arrays 1410–1416 may need to be multiplexed (e.g., via mux 1420) to feed the minimization logic 1350.

Figure 13A:
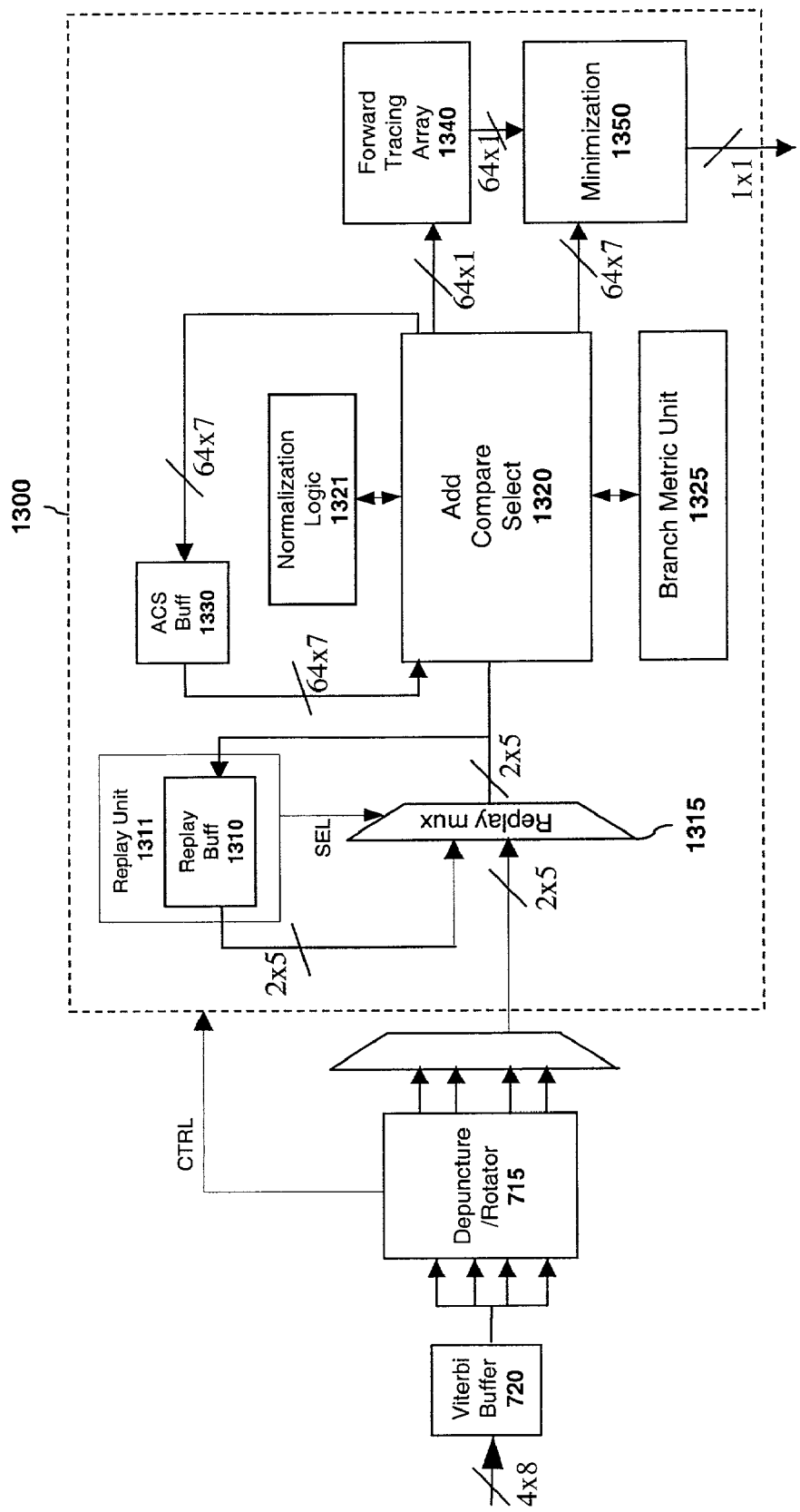
FIG. 13a illustrates one embodiment of a Viterbi decoder which employs a replay scheme.

One embodiment of a Viterbi decoder 1300 which employs a replay scheme is illustrated in FIG. 13*a*. As used herein, a "context switch" refers to a switch from processing data from one transponder (or other signal carrier—e.g., such as a cable carrier) to another. Using the replay scheme, on a context switch, the forward-tracing array 1340 may be restored to the state it was in when it left off processing the same transponder the last time around. In one embodiment, this is accomplished by replaying the last N symbols of the transponder through the decoder and discarding the output. After the last N symbols are replayed, the decoder is ready to accept new symbols for the transponder/carrier. During the replay period, the output from the forward-tracing array 1340 may be ignored.

In order to be able to replay the last N symbols from each transponder, the symbols transmitted from the depuncture/rotator block(s) 715 need to be saved off in one or more replay buffers 1310. In an embodiment in which the depuncture/rotator block 715 provides data for only 1 of the 4 transponders at any given time, the replay buffers for the 4 transponders may be implemented as a single register file. In one embodiment, N=64, each row of the register file 1310 holds 1 symbol (10 bits), and there are 64*4=256 rows. Accordingly, in this embodiment, the size of each register file is 256×10 bits. Moreover, in one embodiment, the register file 1310 is provided with 1 read, and 1 write port. It should be noted, however, that the numbers set forth above represent one specific embodiment of the invention. Various alternate buffering configurations may be employed while still complying with the underlying principles of the invention.

As described above, the depuncture/rotator block 715 signals a context switch when it is done providing data for the current transponder. In one embodiment, the context switch signal is transmitted along with the last symbol to be processed for the current transponder. The replay unit 1311 uses the context switch signal along with a 4-bit one-hot transponder/carrier vector which indicates the current active transponder/carrier to generate the read and write addresses to the replay buffers 1310. Accordingly, in this embodiment, the one-hot transponder/carrier signal is updated on every context switch.

The depuncture/rotator block 715 also generates a "save ACS" signal some predetermined number of clocks before a context switch. The number of clocks may be equal to the depth of the Viterbi trellis, and is the same as the number of replay symbols (64 in one embodiment of the invention). The "save ACS" signal tells the replay unit 1311 to begin saving incoming symbols in the replay buffer 1310.

Figure 13B:
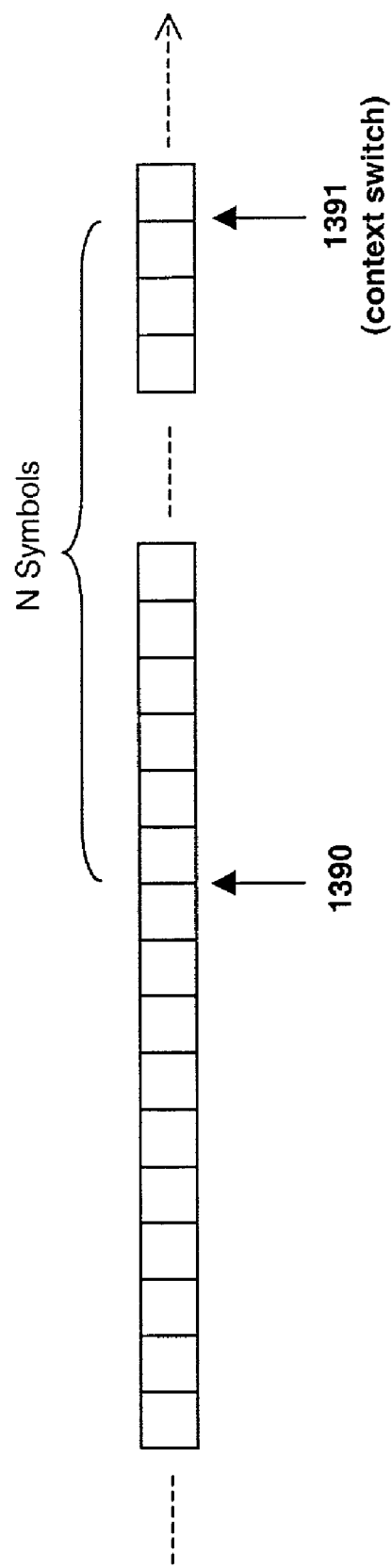
FIG. 13b illustrates one embodiment of symbol timing associated with a replay scheme.

The timing associated with one embodiment of a replay scheme is illustrated in FIG. 13*b*. In this example, a context switch occurs at point 1391. As such, at point 1390, which is N symbols prior to point 1391, the replay unit 1311 begins saving symbols to the replay buffer 1310 (as mentioned, in one embodiment N=64, or the depth of the Viterbi trellis). In addition, the accumulator values from the ACS units 1320 are saved off to the ACS buffers 1330.

When the context switch occurs at point 1391, the system begins processing symbols from a different transponder/carrier. In order to resume processing the symbols illustrated in FIG. 13*b*, the decoder must be restored to the same state it was in at point 1391 the last time around. Accordingly, in one embodiment, the accumulator values are restored from the ACS buffer 1330 and the same set of N symbols are replayed from the replay buffer 1310 (i.e., starting from point 1390). Once all of the symbols have been replayed, the decoder is in the same state that it was in at point 1391 the last time around. The next N symbols may then be decoded.

In one embodiment, the replay buffer 1310 is divided into 4 blocks, each of which holds N replay symbols for each of the four transponders being processed. On every save ACS signal from the depuncture/rotator block 715, the write pointer is reset to point to the start address of the corresponding block based on the one-hot transponder enable signal. Every symbol read out of the replay multiplexer 1315 following the save ACS signal is written into the replay buffer 1310. The write pointer is incremented after every write. Writing continues in this manner until the depuncture/rotator block 715 signals a context switch.

In one embodiment, a "read enable" signal is generated on each context switch which enables reading from the replay buffers by the replay unit 1311. The read enable signal. The read enable signal remains active for the duration of the replay state. On a context switch, the read pointer is reset to the start address of the corresponding block based on the one-hot current transponder signal. During the replay clocks, the replay buffer is read every cycle and the data is fed to the Viterbi decoder 1300 through the replay multiplexer 1315. The read pointer is incremented after every read and, at end of the replay clocks, the "read enable" signal is disabled until the next context switch.

Upon receiving the context switch, the replay unit 1311 uses it to switch the replay multiplexer 1315 to select data from the replay buffer 1310 on the next cycle. The select on the replay multiplexer 1315 stays in this state for the duration of the replay clocks. At the end of the replay clocks, the replay multiplexer 1315 then selects symbols from the depuncture/rotator block 715 until the next context switch.

In one embodiment, the replay unit 1311 sends a "valid bit" signal which enables the Viterbi decoder when valid symbols are read from depuncture/rotator block 715 or the replay buffer 1310. In addition, in one embodiment, during replay, the replay unit 1311 sends a "replay" signal to the Viterbi decoder indicating that the symbols read by the Viterbi decoder are part of replay sequence (i.e., thereby indicating that the output should be discarded).

As mentioned above, one embodiment of the decoder which does not employ a replay scheme is illustrated in FIG. 14. Every time there is a context switch, the survivor path memory corresponding to the new input stream is brought into use. In this embodiment, rather than saving the last N symbols in a replay buffer, a plurality (e.g., 4) forward tracing arrays 1410–1413 are employed to store the current state for each transponder/carrier. That is, the forward tracing arrays store the survivor path data for each respective data stream. Accordingly, in this embodiment, when the decoder moves from one transponder/carrier to the next (i.e., to decode the next N symbols for that transponder), it simply moves to the moves from the current forward tracing array (e.g., 1410) to the next (e.g., 1411).

In one embodiment, the accumulator values may still be temporarily stored in the ACS buffer 1330 on a context switch and reloaded into the ACS accumulators when the stream associated with the accumulator values is processed again. However, it should be noted that an ACS buffer is not required for implementing the underlying principles of the invention (e.g. additional ACS units may be included to concurrently process and store accumulator values for all transponders on the system).

Branch Metric Unit

In one embodiment, the decoder receives 1 symbol every cycle from the depuncture/rotator block 715 along with a valid bit. In an embodiment which uses QPSK modulation, the symbol may consist of an I and Q pair, each of which is 5 bits wide. If bit 4 of either I or Q is set, then this indicates an erasure (i.e., null value) and the symbol is treated differently (as described below). The lower 4 bits of I and Q represent the 4 bit soft decision value of the symbol transmitted out of the demodulator.

As mentioned above, one embodiment of the decoder consists of N states or trellis points, where N may be equal to 64. For any given present state there are two possible next states, and for any given present state there are two possible predecessor states. A symbol value $\{v1\ v2\}$ is associated with each possible state transition from the current time to next time. The symbol $\{v1\ v2\}$ is what would have been transmitted if the particular branch in the trellis did in fact correspond to the state transition at the encoder at that moment in time. In an embodiment which employs 4-bit quantization, $\{v1\ v2\}$ may take on the following four values: $\{0\ 0,\ 0\ 15,\ 15\ 0,\ 15\ 15\}$ (i.e., each branch in the trellis corresponds to one of these four values).

Each branch in the trellis is assigned a branch metric which is the difference between the values of the symbol received from the channel $\{r1\ r2\}$ and the corresponding $\{v1\ v2\}$. This is the difference between the received symbol value and the possible symbol values. As the decoder advances from one stage of the trellis to the next, the branch metrics are accumulated into "path metrics" for each state. The branch metrics of all branches are computed in parallel within the branch metric unit 1325. Since, in one embodiment, each branch can have four possible values, all four possible branch metrics are computed in parallel in the branch metric unit 1325. More specifically, for each input symbol, 4 branch metrics are computed and mapped to the $2*2^{k-1}$ trellis branches, where 'k' is the depth of the convolutional encoder. In one particular embodiment of the invention k=7; resulting in a total of 128 trellis branches. Thus, for a 4-bit quantization and input symbol value $\{r1\ r2\}$, the 4 possible branch metrics are $\{abs(r1-0)+abs(r2-0),\ abs(r1-0)+abs(r2-15),\ abs(r1-15)+abs(r2-0),\ abs(r1-15)+abs(r2-15)\}$.

Figure 15:
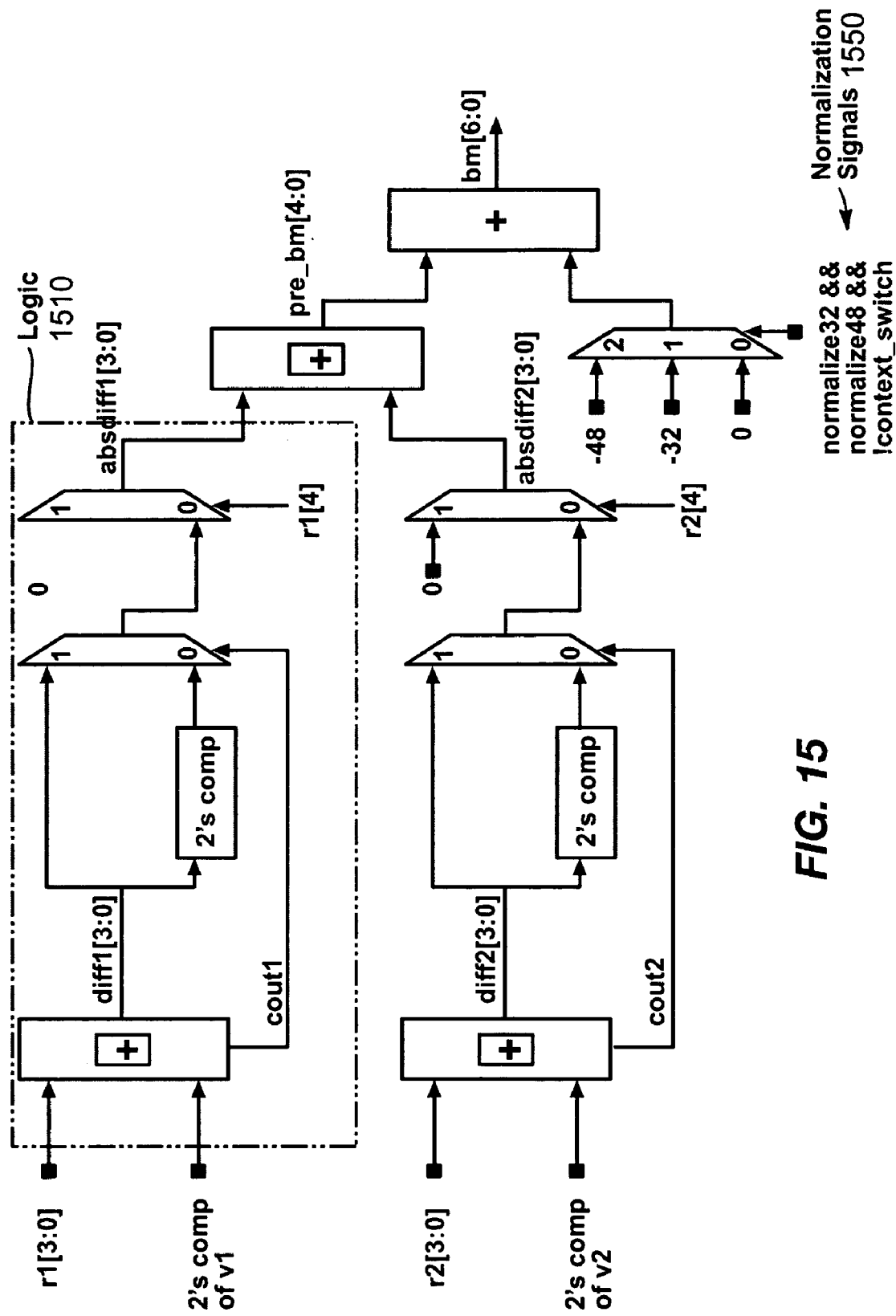
FIG. 15 illustrates a portion of one embodiment of a branch metric unit ("BMU").

If the input symbol value (I or Q) is a null (e.g., bit 4 is set in one embodiment), then the difference between it and v1 and/or v2 is forced to be zero. In this way, a null symbol does not contribute to the branch metric. In one embodiment, the 4 values computed by the branch metric unit 1325 fan out to 128 destinations spread across 64 add-compare-select ("ACS") units 1320. One embodiment of the branch metric unit 1325 is illustrated in FIG. 15. The branch metric logic 1510 enclosed by the dotted line shows the logic for computing abs(r−v). Accordingly, in one embodiment, the branch metric unit 1325 is comprised of four copies of this logic 1510 for generating the four possible branch metric values as described above.

In one embodiment, because $v\{1,2\}$ can take on values of only 0 and 15, logic minimization techniques may be employed. The truth table for absdiff1[3:0], for $v\{1,2\}$=0 is as follows:

| .i 5 |
| --- |
| .o 4 |
| 00000 0000 |
| 00001 0001 |
| 00010 0010 |
| 00011 0011 |
| 00100 0100 |
| 00101 0101 |
| 00110 0110 |
| 00111 0111 |
| 01000 1000 |
| 01001 1001 |
| 01010 1010 |
| 01011 1011 |
| 01100 1100 |
| 01101 1101 |
| 01110 1110 |
| 01111 1111 |
| 1---- 0000 |

Optimizing the truth table produces the following optimized equations:

$$absdiff[3]=(!r[4]\ \&\ r[3]);$$

$$absdiff[2]=(!r[4]\ \&\ r[2]);$$

$$absdiff[1]=(!r[4]\ \&\ r[1]);$$

$$absdiff[0]=(!r[4]\ \&\ r[0]);$$

Similar optimization may be performed for v=15 and produces the following distance equations:

$$absdiff[3]=(!r[4]\ \&\ !r[3]);$$

$$absdiff[2]=(!r[4]\ \&\ !r[2]);$$

$$absdiff[1]=(!r[4]\ \&\ !r[1]);$$

$$absdiff[0]=(!r[4]\ \&\ !r[0]);$$

Normalization

Since the accumulator in each ACS unit 1320 has a fixed precision, all accumulators are normalized periodically to prevent overflow. Normalization occurs simultaneously across the ACS units 1320 so that decoding is made with consistent metric information.

Figure 16:
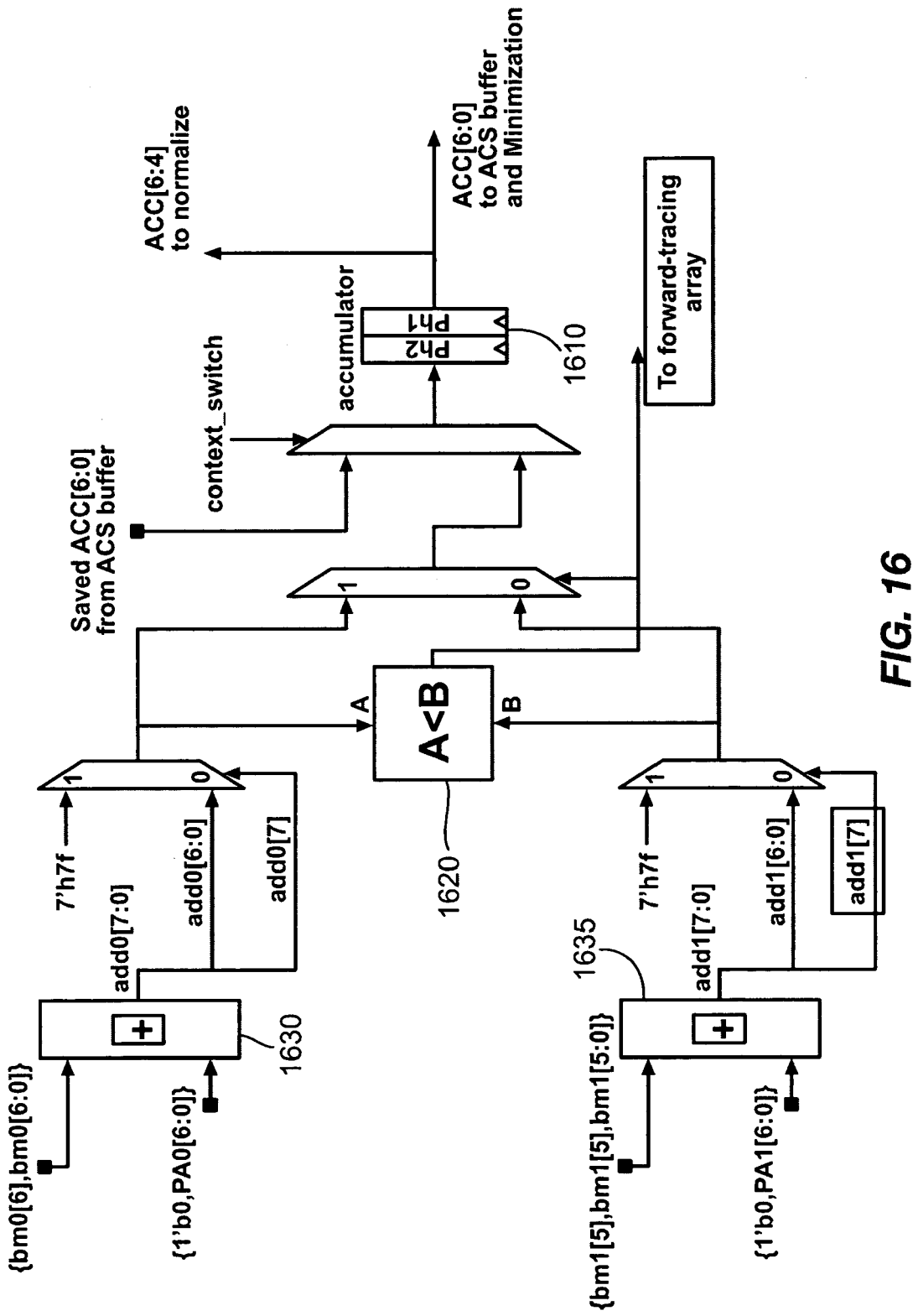
FIG. 16 illustrates a portion of one embodiment of an add-compare-select ("ACS") unit.

In general, a Viterbi decoder with a code rate 1/R has R input branches entering each trellis point in the decode array. There are also R output branches which are inputs to the trellis points in the next column of the array. An add-compare-select ("ACS") unit 1320 may be associated which each trellis point. The ACS unit 1320 computes a metric for each incoming branch by adding an accumulator value on the input branch to the distance calculated for the branch (i.e., by the branch metric unit 1325). The R metrics for the ACS are then compared and the minimum metric is selected and stored in an ACS accumulator 1610 (see FIG. 16). The decode for the trellis point is then the fixed decode bit value associated with the branch that has the minimum metric.

In one embodiment, the ACS accumulators 1610 all have the same precision and the branch metrics increment the accumulators 1610 by values>=0 on every input symbol. As such, unless normalization is performed, the accumulators 1610 will eventually overflow. In one embodiment, in order to prevent overflow, the ACS accumulators 1610 are normalized by subtracting a fixed amount from each accumulator 1610. In order to not impact on decode accuracy, in one embodiment, normalization occurs when all of the accumulators 1610 have a value greater than the normalization amount(s).

In one embodiment, normalization logic 1321 (see FIG. 13a) determines when normalization should take place by monitoring the ACS accumulators 1610 and generating a normalization signal when required. When normalization is signaled, the set of constants used to calculate the distance metrics at the branch metric units 1325 are switched and replaced by a different set of constants that incorporates the normalization amount (see, e.g., normalization signals 1550 in FIG. 15). Thus, the normalization+distance values, supplied to all ACS accumulators as part of the branch calculation process, will normalize the accumulators simultaneously.

Different normalization amounts may be specified, depending on the particular embodiment. For example, in one particular embodiment, illustrated in FIG. 15, "Normalize32" and "Normalize48" signals 1550 received by the branch metric unit 1325 indicate that the branch metric values need to be reduced by the normalization amounts of 32 or 48, respectively, resulting in branch metric values ranging from −48 to +30. Accordingly, given these values, 7 bits may be used to represent the branch metric (i.e., $2^6$=64, plus one sign bit). It should be noted, however, that various other normalization values may be employed while still complying with the underlying principles of the invention.

In one embodiment, the normalization logic 1321 monitors the bit settings in each of the accumulators 1610 before generating a normalization signal. For example, the "Normalize32" signal may be generated if all 64 state metric accumulators are greater than or equal to 32, whereas the "Normalize48" signal may be generated all 64 state metric accumulators are greater than or equal to 48. In one embodiment, normalization is not performed on the first two symbols after a context switch due to the pipelined nature of normalization signals.

Additional levels of normalization may be used depending on the system configuration. For example, in one embodiment, three normalization signals, norm_hi, norm_med, and norm_low may be used to subtract three different amounts from the accumulators (i.e., depending on the values of each of the accumulators). Normalization signal selection may be accomplished by monitoring the 3 most significant bits of all the state metrics. For example, in one embodiment, if the accumulator values range from N:0, then norm_hi is generated if bit N of all state metrics are set. Norm_med is generated if bit N or bits N−1 and N−2 of all state metrics are set and norm_low is generated if bit N or bit N−1 of all state metrics are set. The constants may be calculated based on the value of N. For example, if norm_hi is set, then all state metrics may be subtracted by $2^N$; if norm_med is set then all state metrics may be subtracted by $2^{N-1}+2^{N-2}$; and if norm_lo is set, then all state metrics may be subtracted by $2^{N-1}$.

Add-Compare-Select (A CS) Unit and ACS Buffers

As mentioned above, in one embodiment, each of the trellis nodes require an add-compare-select ("ACS") computation each clock. The ACS unit 1320 adds the branch metric calculated at the branch metric unit 1325 and the path metric stored in the accumulator 1610 (i.e., via adders 1630, 1635 illustrated in FIG. 16) for the two possible paths into the current trellis state. An ACS comparator unit 1620 then selects the path with the smallest state metric, and the updated state metric is saved into the state accumulator 1610. The path selection decisions are subsequently transmitted to the forward-tracing array 1340.

As described above, when all state accumulators exceed a pre-set threshold (e.g., 32, 48), a constant value is subtracted from all of them to avoid overflow. This may be achieved by the normalization process in branch metric unit 1325. In addition, in one embodiment, the ACS adders 1630, 1635 use saturating logic to avoid overflow effects. Moreover, in one embodiment, because the normalization logic 1321 concurrently monitors all state metrics, the normalize signal is staged.

Since the addition of the branch metric to the accumulator potentially includes a normalization amount, the branch metric provided to the ACS unit 1320 may be a negative number represented in 2's complement form. To ensure proper arithmetic, in one embodiment, the 7 bit accumulator value, and the 7 bit branch metric are both sign-extended to 8 bits before being provided to the ACS adders 1630, 1635. Because the accumulator value can never be negative, its sign bit may be set to 0. The output of the adder is saturating, and for this, any overflow needs to be detected. In normal signed arithmetic, overflow may be indicated by an XOR of the carry going into the most significant bit (i.e., sign bit) and the carry out of the most significant bit. In one embodiment of the ACS unit 1320, the output of the adder 1630, 1635 is guaranteed to be a positive value because the only time the normalization logic 1321 subtracts the normalization amount is when all accumulators are greater than the normalization amount. As such, the detection of overflow is greatly simplified. Overflow in the ACS unit 1320 is indicated by the MSB (sign bit) of the result. If the MSB of the result of the adder is set then, in one embodiment, the output of the adder gets forced to 7'h7f—the maximum value represented by 7-bits. That is to say, if an overflow is detected, then the accumulator is saturated to the maximum value.

On a context switch, the ACS unit 1320 loads the accumulators 1610 with values previously saved in the ACS buffer 1330. In one embodiment, a multiplexer 1611 at the input of the accumulator register 1610 selects between the saved accumulator transmitted from ACS buffer 1330 and the computed path metric from the ACS adders 1630,1635. In an embodiment in which each Viterbi decoder decodes data from four transponders, the ACS buffers 1330 store the accumulator values for all four transponders. Thus, if the Viterbi decoder has 64 accumulators, each of which is 7 bits wide, the total storage required per Viterbi decoder is 64*7*4=1792 bits. During a context switch, the 64 accumulators are restored to their previous state for the current transponder (i.e., the state they were in for the current transponder the last time around). Accordingly, in this embodiment, 64*7=448 bits are read from the ACS buffers 1330. Similarly, during the save of the accumulator values, 448 bits of data from the current transponder/carier are written into the ACS buffers. In one embodiment a single read/write port is provided for the ACS buffer. However, depending on the embodiment, multiple ports may also be provided while still complying with the underlying principles of the invention.

In one embodiment, the ACS buffers 1330 for each Viterbi decoder 700 are implemented as eight distinct SRAMs (or an alternate number, depending on the number of Viterbi decoders 700 configured in the system), each holding data for eight accumulators 1610. Thus, in this embodiment, the storage in each SRAM is 8*7*4=224 bits and at any given time 8*7=56 bits may be read into the SRAM (i.e., if only a single port is provided). Each row of the SRAM holds 56 bits, and each SRAM has 4 rows corresponding to the 4 transponders.

As mentioned above, the depuncture/rotator block 710 signals a context switch when it is done providing data for the current transponder. The context switch signal is provided with the last symbol to be processed for the current transponder. The ACS unit 1320 uses the context switch signal along with a signal which indicates the number of transponders active for the current Viterbi decoder 700, to generate a 2-bit ACS buffer address (or an alternate-sized address, depending on the particular implementation). Thus, on every context switch, the ACS buffer 1330 address is updated. In one embodiment, the new ACS buffer address is used as the read pointer to read from the ACS buffer 1330, and the ACS accumulators 1610 are updated with this new data on every context switch.

In one embodiment, a "dead clock" signal is transmitted from the depuncture/rotator block 710 following the context switch signal. During the dead clock signal, no valid symbols are input to the Viterbi decoder 700. The dead clock period is used to load the saved ACS buffer data into the accumulator registers. Inserting the dead clock in this manner allows raw, unlatched register file outputs to be transmitted directly into the accumulator registers 1610, resulting in a considerable logic savings. Alternatively, the ACS buffer data may be latched locally requiring a significant number of latches and multiplexers (448 in one embodiment). Thus, the dead clock allows the saved data to be efficiently loaded into the accumulator. If no dead clock was available, then the saved data would have to be read and latched separately. A multiplexer (or other selection logic) would then be required to select the output of the accumulator or the latch to feed into the ACS unit.

As mentioned above, in one embodiment, the depuncture/rotator block 710 generates a save-ACS signal 64 clocks prior to the context switch. The save-ACS signal is transmitted with the symbol to be processed for the current transponder. In one embodiment, buffer control logic uses the save-ACS signal to save the current accumulator values in the ACS buffers 1330.

Forward-Tracing Array

In order to meet the high clock speed required to process multimedia content from multiple transponders, and the need to process a continuous stream of input symbols, one embodiment of the invention uses a forward tracing architecture (e.g., forward-tracing array 1340) to decode the symbols.

In a conventional Viterbi decoder (as well as other FEC and/or maximum likelihood decoders), two known methods for retrieving the decoded information sequence are traceback ("TB") and register-exchange ("RX"). One drawback of the trace-back approach is the latency resulting from the trace-back and decode. As such, this approach is not typically suitable to running at high speeds required to support high throughput rates. The RX approach is more suitable for high speed processing but requires significantly more hardware than the TB approach, resulting in additional cost and power consumption. Under both of these techniques, a shift register is associated with each node in the trellis. In the TB method, each register contains the history of the surviving branches entering that state. Accordingly, information bits are obtained by "tracing back" through the Viterbi trellis as dictated by the history stored in the registers. By contrast, under the RX approach, the register for a given node at a given time contains all the information bits associated with the surviving partial path that terminates at that node. As the decoding operations proceed, the contents of the registers are continually updated and exchanged as dictated by the surviving branches.

Described below is a forward-tracing architecture and method which is significantly more efficient than the traceback approach but requires less logic than the RX approach. In one embodiment, the survivor path information calculated by the ACS units is used to control a forward-tracing array 1340 to generate the decoded data. The forward-tracing array 1340 may be implemented as a matrix of individually controllable storage elements or "cells." Each row of cells in the matrix corresponds to one of the Viterbi states in the trellis diagram and holds the complete decoded history of the survivor path ending in that particular state. A column of cells corresponds to all the trellis states at any given instant.

Figure 17:
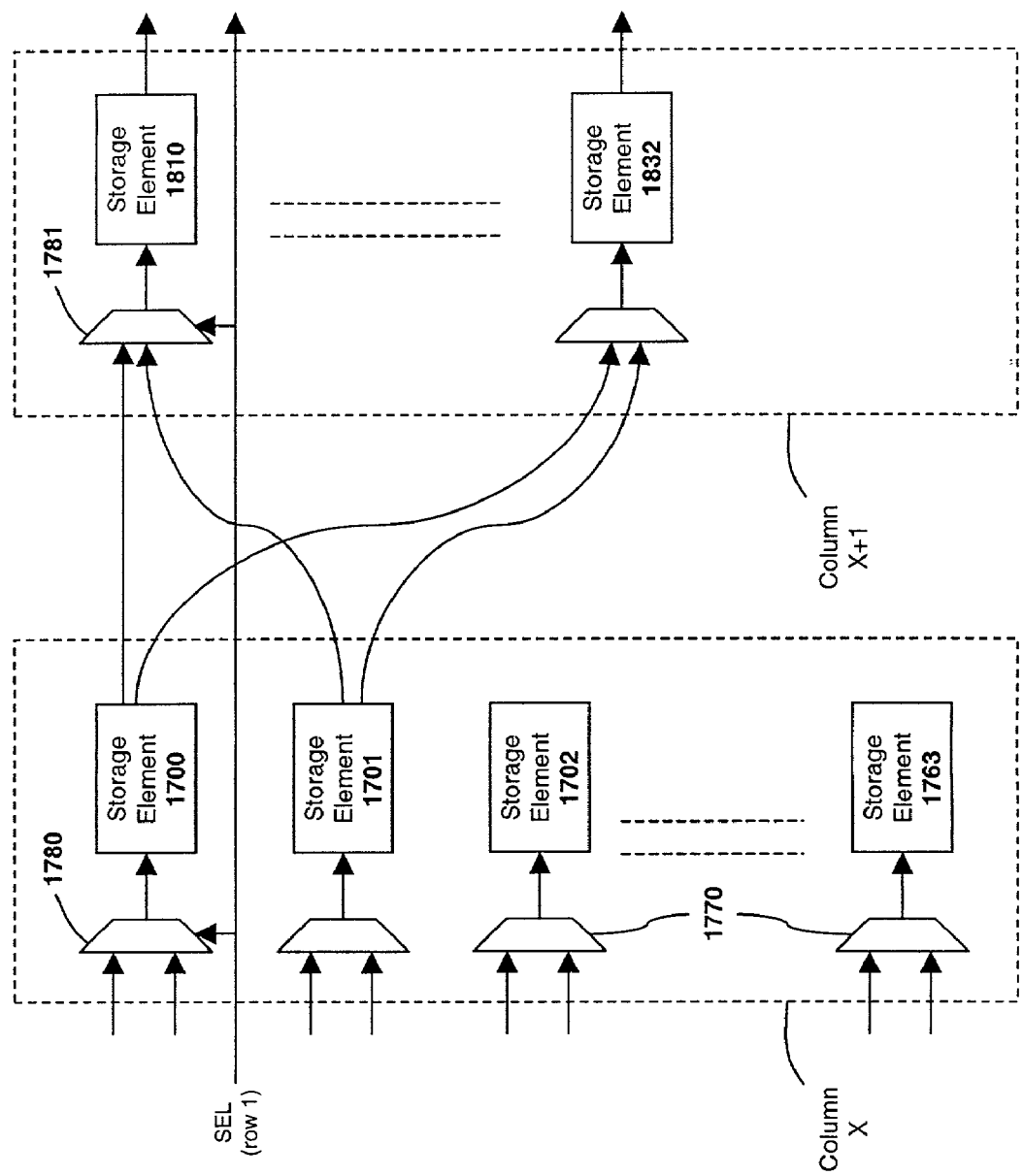
FIG. 17 illustrates portion of a matrix of storage elements employed in one embodiment of a forward tracing Viterbi decoder.

A portion of one embodiment of the cell matrix is illustrated in FIG. 17. Each storage element (e.g., element 1810) in a column (e.g., column X+1) is capable of receiving data from two other storage elements (e.g., elements 1700, 1701) in a prior column (e.g., column X), and each storage element in a column drives data to two storage elements in the next column. In one embodiment, constant values are fed into the inputs of the first column (e.g., ½ 1's and ½ 0's). All the cells in a column may be interconnected according to the Viterbi encoder polynomial that is used to encode the data. In one embodiment, the signal generated by the ACS comparator 1620 (i.e., identifying the survivor path at each trellis point) is used as a select signal to all of the cells in a row, thereby causing the data to propagate through the forward tracing array according to the encoder polynomial. The total number of columns is a function of the decoding depth (e.g., 64 in one embodiment).

It should be noted that the specific details of the forward tracing array 1340 described above should not be read to limit the underlying principles of the invention. For example, while the embodiment illustrated in FIG. 17 processes data encoded at a rate of R=½, the underlying principles of the invention may be implemented on a forward tracing array with various alternate rates. For example, with a rate R=⅓, each cell in the forward tracing array would have three inputs (i.e., from the previous column of cells) and three outputs (to the subsequent column). Moreover, the cells would be interconnected according to the particular encoder polynomial employed. Accordingly, the underlying principles of the invention are not limited to any particular code rate or any particular encoder polynomial.

In one embodiment, the cells within the forward tracing array 1340 may be moved around within each column so that cells connected to on another between successive columns are physically closer together (e.g., thereby reducing the distance the signal must travel between cells). Even though the cells are moved with respect to one another within a column, they still may be interconnected according to the particular encoder polynomial employed.

In one embodiment, the cells of each column of the forward-tracing array 1340 are interconnected as indicated in Table 7 below. As mentioned above, each cell has two source cells and two destination cells. For example, as indicated in Table 7, cell 0 receives its inputs from the outputs of cell 0 and cell 1, and cell 0 drives the inputs of cell 0 and cell 32.

TABLE 7

| Source Cells | Current Cell | Destination Cells |
|---|---|---|
| 0, 1 | 0 | 0, 32 |
| 2, 3 | 1 | 0, 32 |
| 4, 5 | 2 | 1, 33 |
| 6, 7 | 3 | 1, 33 |
| 8, 9 | 4 | 2, 34 |
| 10, 11 | 5 | 2, 34 |
| 12, 13 | 6 | 3, 35 |
| 14, 15 | 7 | 3, 35 |
| 16, 17 | 8 | 4, 36 |
| 18, 19 | 9 | 4, 36 |
| 20, 21 | 10 | 5, 37 |
| 22, 23 | 11 | 5, 37 |
| 24, 25 | 12 | 6, 38 |
| 26, 27 | 13 | 6, 38 |
| 28, 29 | 14 | 7, 39 |
| 30, 31 | 15 | 7, 39 |
| 32, 33 | 16 | 8, 40 |
| 34, 35 | 17 | 8, 40 |
| 36, 37 | 18 | 9, 41 |
| 38, 39 | 19 | 9, 41 |
| 40, 41 | 20 | 10, 42 |
| 42, 43 | 21 | 10, 42 |
| 44, 45 | 22 | 11, 43 |
| 46, 47 | 23 | 11, 43 |
| 48, 49 | 24 | 12, 44 |
| 50, 51 | 25 | 12, 44 |
| 52, 53 | 26 | 13, 45 |
| 54, 55 | 27 | 13, 45 |
| 56, 57 | 28 | 14, 46 |
| 58, 59 | 29 | 14, 46 |
| 60, 61 | 30 | 15, 47 |
| 62, 63 | 31 | 15, 47 |
| 0, 1 | 32 | 16, 48 |
| 2, 3 | 33 | 16, 48 |
| 4, 5 | 34 | 17, 49 |
| 6, 7 | 35 | 17, 49 |
| 8, 9 | 36 | 18, 50 |
| 10, 11 | 37 | 18, 50 |
| 12, 13 | 38 | 19, 51 |
| 14, 15 | 39 | 19, 51 |
| 16, 17 | 40 | 20, 52 |
| 18, 19 | 41 | 20, 52 |
| 20, 21 | 42 | 21, 53 |
| 22, 23 | 43 | 21, 53 |
| 24, 25 | 44 | 22, 54 |
| 26, 27 | 45 | 22, 54 |
| 28, 29 | 46 | 23, 55 |
| 30, 31 | 47 | 23, 55 |
| 32, 33 | 48 | 24, 56 |
| 34, 35 | 49 | 24, 56 |
| 36, 37 | 50 | 25, 57 |
| 38, 39 | 51 | 25, 57 |
| 40, 41 | 52 | 26, 58 |
| 42, 43 | 53 | 26, 58 |
| 44, 45 | 54 | 27, 59 |

TABLE 7-continued

| Source Cells | Current Cell | Destination Cells |
|---|---|---|
| 46, 47 | 55 | 27, 59 |
| 48, 49 | 56 | 28, 60 |
| 50, 51 | 57 | 28, 60 |
| 52, 53 | 58 | 29, 61 |
| 54, 55 | 59 | 29, 61 |
| 56, 57 | 60 | 30, 62 |
| 58, 59 | 61 | 30, 62 |
| 60, 61 | 62 | 31, 63 |
| 62, 63 | 63 | 31, 63 |

In one embodiment, as the data traces forward through each of the columns, the most likely decoded information bits propagate to all the rows of the matrix. If there are a sufficient number of columns (e.g., 128–144), each row in the final column will contain the decoded bit. Alternatively, or in addition, the decoded data may be obtained by reading the storage cell from the row corresponding to the minimum path metric from the last column.

Specifically, in one embodiment, all of the 2:1 multiplexers (or n:1 multiplexers for a different code rate) in a given row (e.g., muxes 1780 and 1781) are controlled by the one select which is the decision bit for that state transmitted from the ACS unit 1320 for the corresponding state. Each cycle, new bits corresponding to the decoded bits for the given state are inserted into one of the columns of the forward-tracing array. The column where the new bits are inserted is shifted every cycle such that new bits are inserted into the same column every N cycles. In one embodiment, N is the depth of the Viterbi trellis (e.g., 64). The new bits which are inserted are constants predefined for the given encoding polynomial. As the decoding operations proceed, the contents of the cells are updated and exchanged as dictated by the surviving branches. In addition, every cycle, a column which is separated by 64 from the column where new bits are being inserted, holds the decoded output bits. This column is read out every cycle and fed to the minimization logic 1350 which selects the most likely decoded bit based on the state which has the minimum path metric (e.g., identified by the minimum value stored in the series accumulators).

Figure 18:
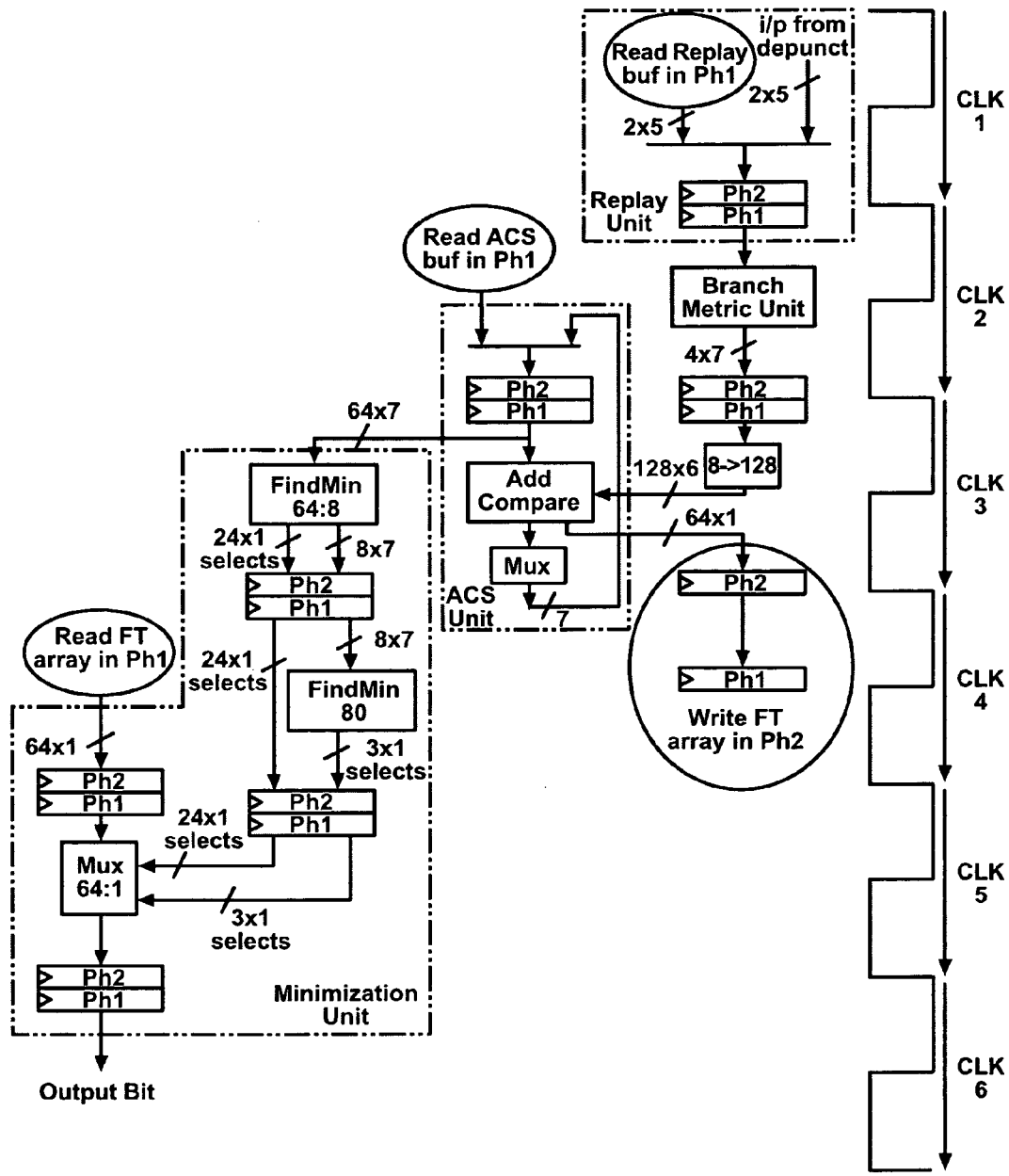
FIG. 18 illustrates a timing diagram describing the timing for one embodiment of a Viterbi decoder.

Decoder timing implemented in one embodiment of the invention is illustrated in FIG. 18. As indicated, in this embodiment, the forward-tracing array 1340 is read in ph1, and written in ph2.

Minimization Unit

The N bits read from the forward-tracing array are fed to the minimization logic 1350. As described above, in one embodiment N=64. These bits correspond to the N states of the Viterbi trellis. The bit which corresponds to the state with minimum path metric is the most likely output decoded bit. The minimization logic 1350 performs the task of finding this output bit. In one embodiment, it searches the N path metrics (each 7 bits wide and each stored in the N accumulators) for the minimum using binary tree search. In doing so, it forms a one-hot N-bit vector. The bit which is set in the one-hot vector, corresponds to the minimum path metric. The vector is then used as a select to a N:1 multiplexer (not shown) whose inputs are the N possible output bits. The output of the multiplexer is the decoded output bit. In one embodiment, in order to ease timing constraints, the minimization logic 1350 may be implemented across 2 cycles.

Load Balancing and Arbitration

The embodiments set forth above assume that the data rate of each data stream (e.g., transponder or cable carrier) processed by the system is equal. As such, the arbitration logic causes each Viterbi decoder to switch from one stream to the next when it runs out of data for the current stream, and/or when the total number of symbols processed from the current input stream exceeds some preset maximum limit (e.g., 64 symbols). When this occurs, the Viterbi decoder 700 begins servicing the next input stream in a round robin fashion. In one embodiment, if no symbols are present for the next input stream, the decoder waits until enough symbols have accumulated, and then it will start processing the input stream. Alternatively, if no symbols are present, the arbitration logic may move to the next stream.

Figure 22:
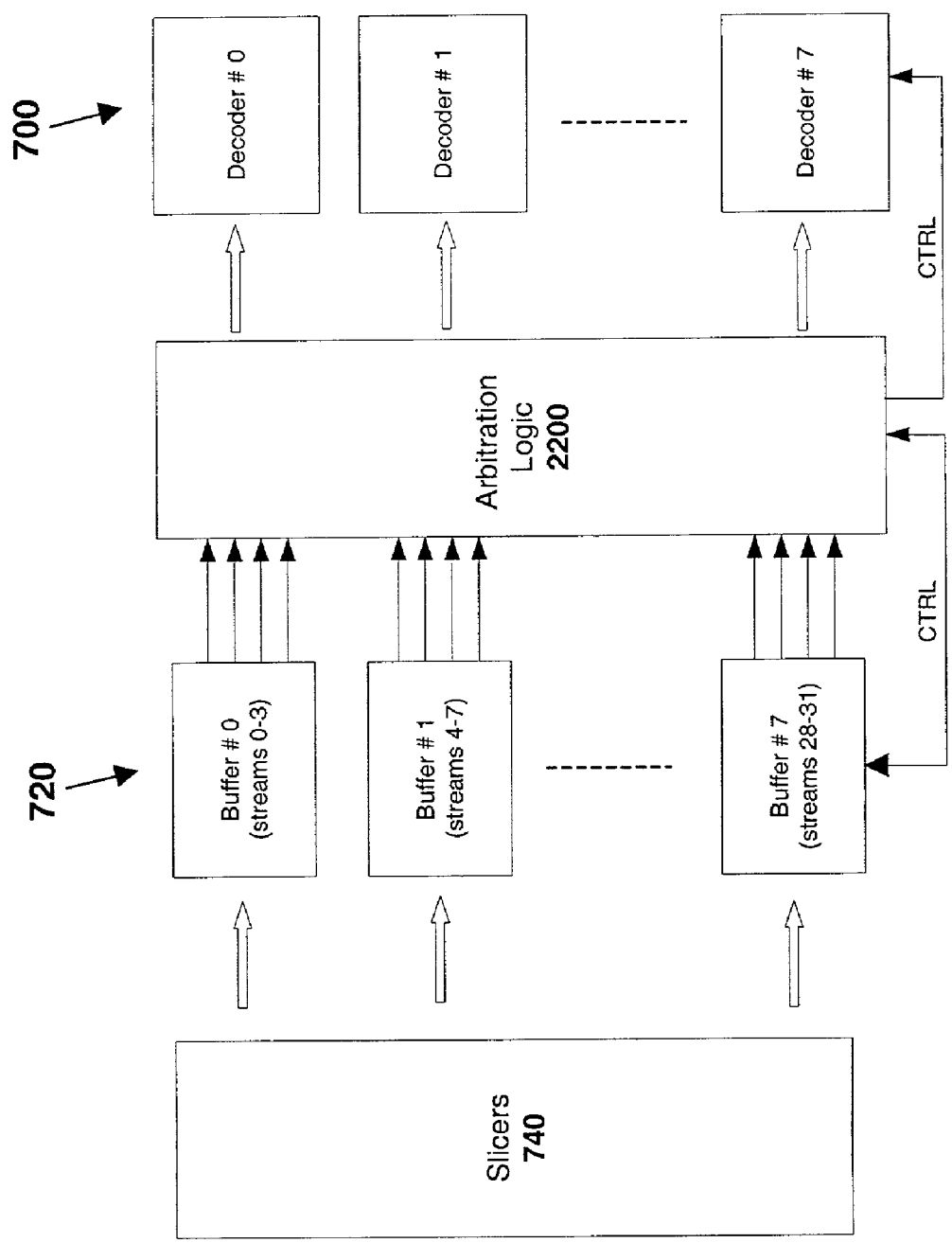
FIG. 22 illustrates arbitration logic according to one embodiment of the invention.

Because the data rates from each stream may not always be equal, in one embodiment, illustrated in FIG. 22, arbitration logic 2200 may be configured to process the input streams from the transponders/carriers more efficiently. Various arbitration policies may be employed. For example, in one embodiment, the arbitration logic 2200 monitors all of the input streams in parallel, determining which input stream has the maximum symbols to be processed (e.g., based on the code rate), and then processes this stream until it runs out of symbols. Alternatively, or in addition, the arbitration logic 2200 waits until the total number of symbols processed exceeds some predetermined maximum limit. When either of these two events happens, the arbitration logic 2200 may re-evaluate the input streams and select a new input stream to be sent to the Viterbi decoder(s).

One embodiment of the arbitration logic 2200 employs a static load balancing policy in which input streams are mapped to decoders 700 based on the rates of each of the input streams. More specifically, when the system is initialized, the arbitration logic 2200 maps streams to decoders such that each decoder handles the same (or approximately the same) combined data rate. For example, if half of the input streams have a rate of R=⅞ and half have a rate of R=½, then the arbitration logic 2200 may divide the input streams such that each decoder processing two ⅞ rate streams and two ½ rate streams. Alternatively, or in addition, relatively more low-rate streams may be mapped to certain decoders and relatively fewer high-rate streams may be mapped to other decoders (e.g., decoder #0 may service 5 streams with a rate=½ and decoder #1 may service 3 streams with a rate=⅞). Various other static mapping policies may be implemented while still complying with the underlying principles of the invention. Moreover, it should be noted that the arbitration mappings described herein may be implemented in software, hardware, firmware or any combination thereof.

In one embodiment of the invention, the arbitration logic 2200 employs a dynamic load balancing policy in which it continually monitors each of the input streams and dynamically reassigns the streams to different decoders 700 as required. For example, if decoder #0 is overloaded (e.g., because the rate of a particular input stream has increased or a particular stream has suddenly become active) the arbitration logic 2200 may reassign one or more streams to one or more alternate decoders which are not as heavily loaded.

In one embodiment, the arbitration logic 2200 will determine which decoders are overloaded (or under-loaded) by monitoring the amount of data buffered for each stream (e.g., in the Viterbi buffers 720). In one embodiment, if the amount of data stored for a particular stream reaches some predetermined maximum threshold, the arbitration logic will re-map the stream to a new Viterbi decoder 700 as described above.

Figure 23:
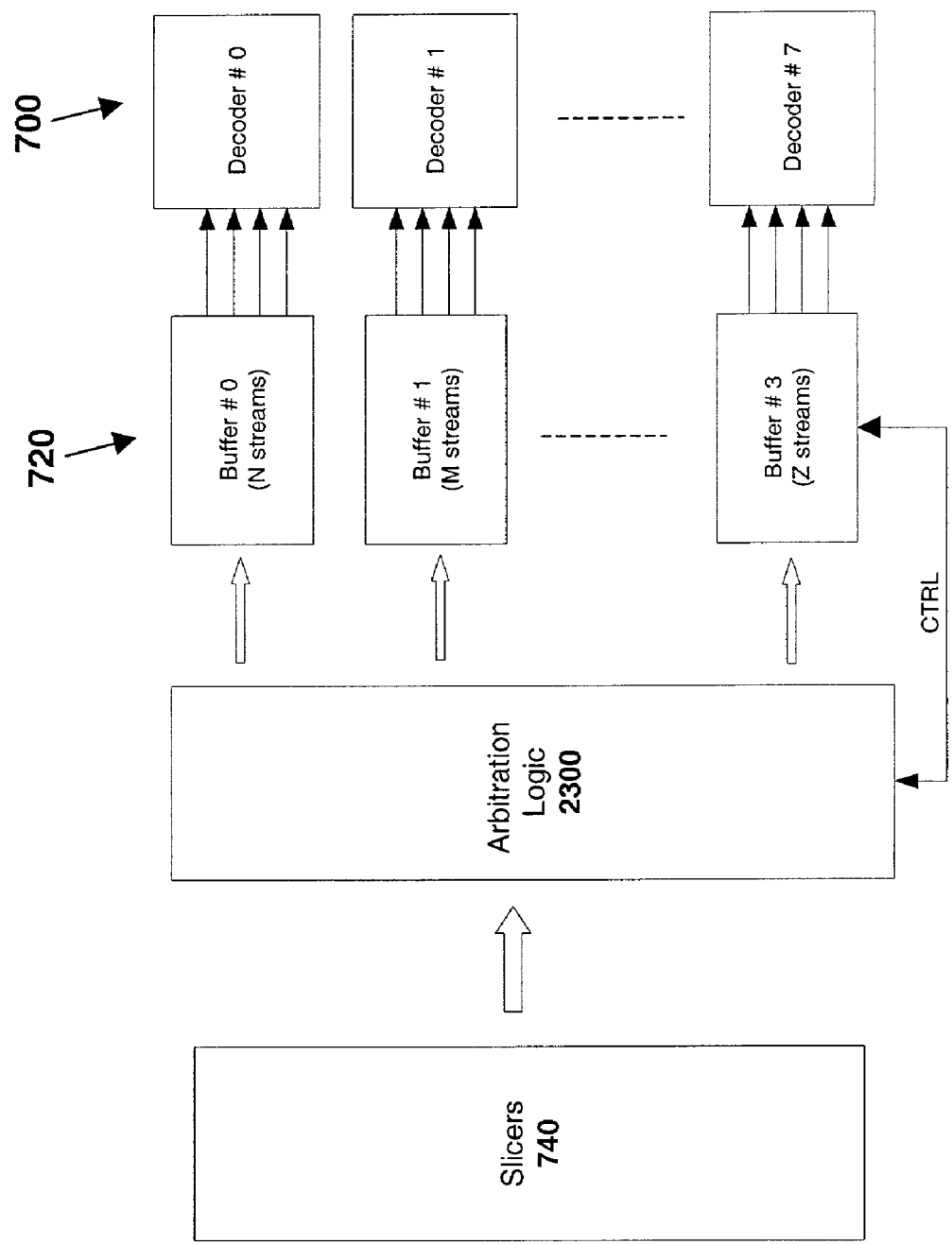
FIG. 23 illustrates arbitration logic according to another embodiment of the invention.

As illustrated in FIG. 23, the arbitration logic 2300 may be configured (either statically or dynamically) between the slicer(s) 740 and the Viterbi buffers 720, rather than between the Viterbi buffers 720 and the decoders 700 (as shown in FIG. 22). Accordingly, in this embodiment, each of the Viterbi buffers may buffer data for a different number of streams depending on the data rate of each of the streams. For example, as indicated in FIG. 23, buffer #0 may store data for N streams whereas buffer #1 may buffer data for M streams. The values of M and N may be based on the data rate of the streams included in the group of M and N streams, respectively. For example, if the average rate of the M streams is relatively low compared to the average rate of the N streams, then N<M. The Viterbi decoders 700 in this embodiment may simply read data from each of the buffers as the data arrives.

Embodiments of a Byte Synchronization Region

The byte synchronizer unit/region 265 is responsible for taking in a stream of bits from the Viterbi decoder and segmenting it into bytes on the correct boundary so that the data transmitted to the remainder of the system will be interpreted correctly. Thus, the Byte Synchronizer 265 must first find the correct byte boundary from the incoming stream and then make sure that the stream follows a consistent pattern in order to ensure that the incoming stream is synchronized.

Figure 19:
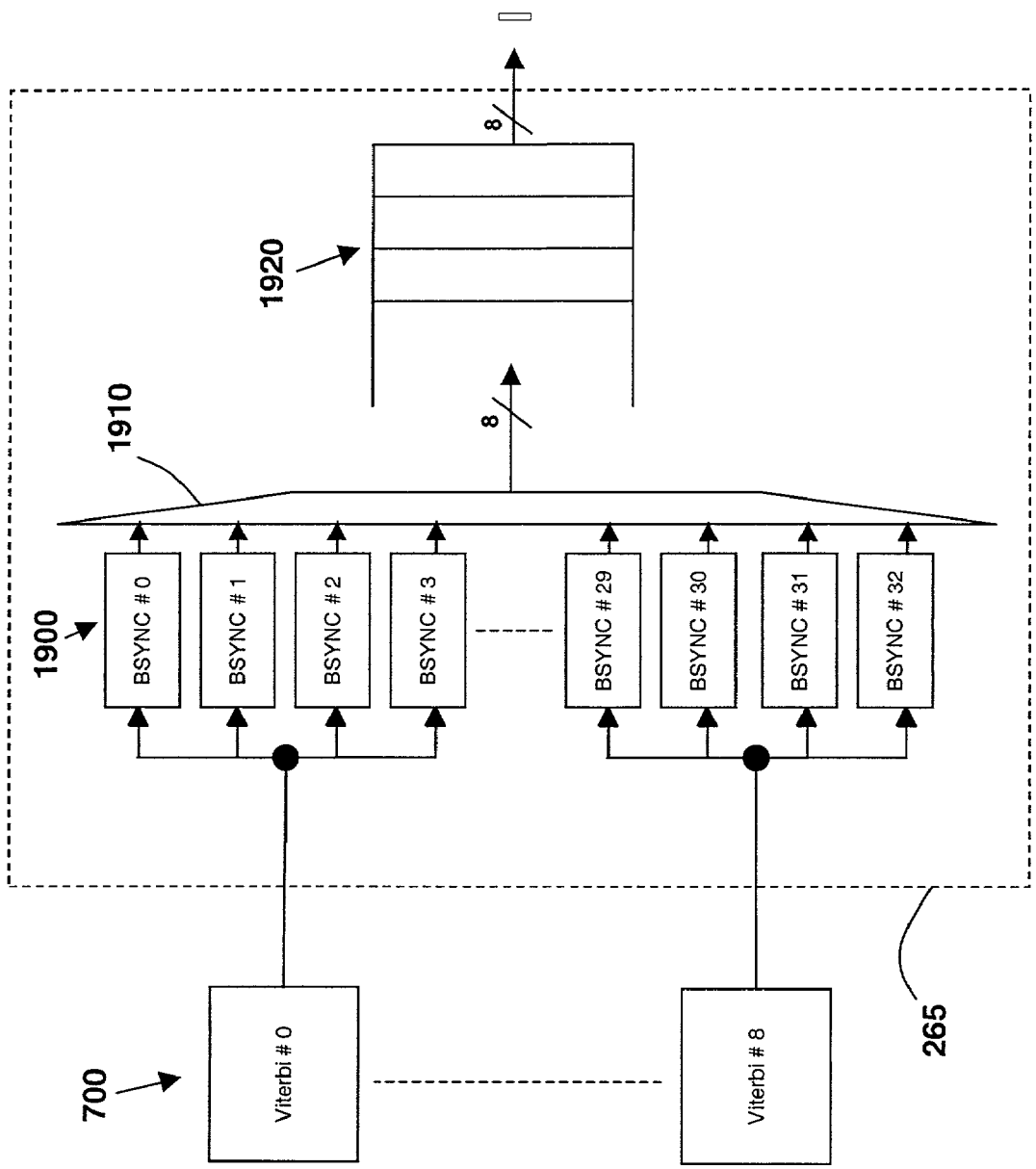
FIG. 19 illustrates a byte synchronization unit according to one embodiment of the invention.

As illustrated in FIG. 19, one embodiment of the byte synchronization ("BSYNC") unit/region 265 is comprised of a plurality of byte synchronization modules 1900, an output multiplexer 1910 and an output buffer 1920. In this embodiment, the BSYNC region 265 is fed by 8 independent Viterbi decoders 700. As illustrated, each Viterbi decoder 700 has a set of 4 dedicated BSYNC modules 1900 to process its bit output. Each of these BSYNC modules 1900 processes data from a single transponder. The output multiplexer 1910 selects among 32 BSYNC modules 1900's valid output bytes to write to the output buffer 1920. The data bytes are then read from the output buffer 1920 and processed by the remainder of the system.

Figure 20:
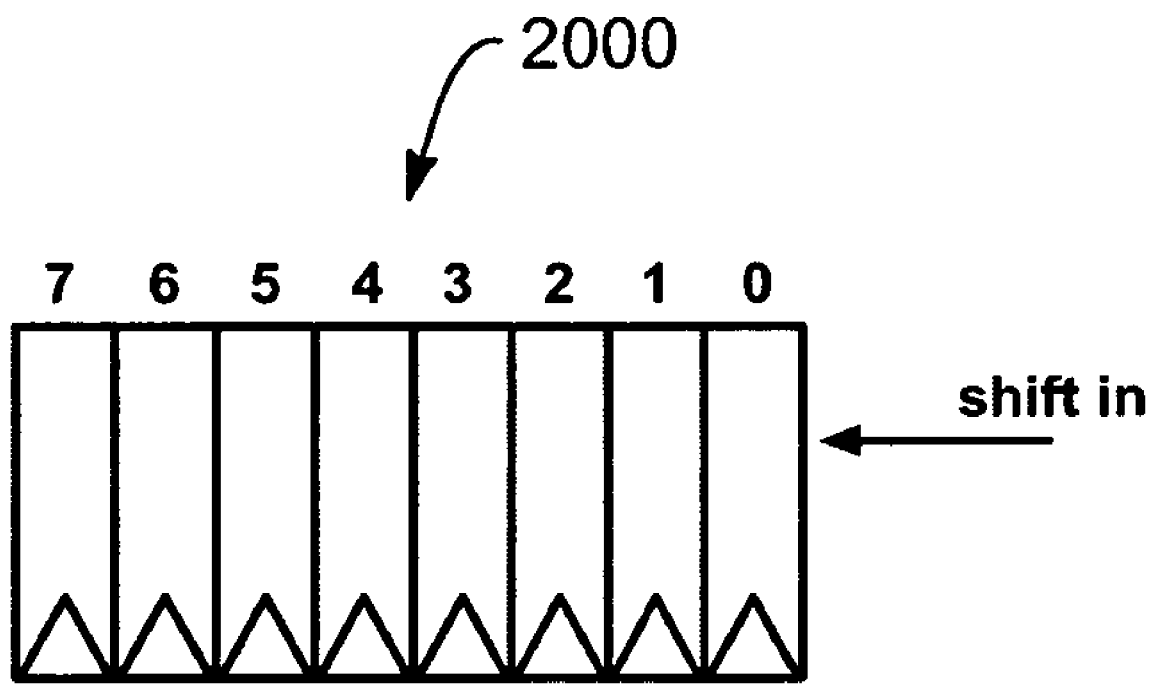
FIG. 20 illustrates a shift register employed in one embodiment of the invention.

Each of the BSYNC modules 1900 controls the state for synchronization and the byte data path for a transponder. A Viterbi decoder 700 provides a single data bit output and a vector indicating which of the 4 transponders the bit is for. Each of the BSYNC modules 1900 decodes the vector to determine whether it should process the data. In one embodiment, as valid data bits are read into the BSYNC modules 1900 they are shifted in from the right into an 8-bit shift register 2000 since the most significant bit of a byte is received first. One embodiment of the shift register 2000 is illustrated in FIG. 20.

The BSYNC module 1900 shifts the input bits from the Viterbi decoder into this register so that it can detect a frame boundary. A frame boundary is considered to start at the point where a predetermined boundary marker (referred to herein as a "frame marker" or "FM") is located. In one embodiment, the frame marker is a byte of information. When the frame marker has been detected, the BSYNC module 1900 assumes it has found the start of a frame and continue to the next state. Several shifts of this register (multiples of 204 bytes) may be required before a boundary is detected since the first bit received from the Viterbi decoder is not guaranteed to be on any particular boundary.

If, for example, the first bit received by the BSYNC module 1900 was the second bit of a frame then it may take: (7 bits in)+((203 bytes/packet for FM packet)*(8 bits/byte))+(204 bytes/packet)*(8 bits/byte)*(7 PM packets)=7+1624+ (1632*7)=13,055 bits before the frame marker was detected.

Once the frame marker is identified, the BSYNC module 1900 begins testing for a consistent incoming stream of bytes to determine synchronization. For example, once a the frame marker is found, the next occurrence of one of these markers should be detected a fixed number of clock cycles later. Specifically, in one embodiment, if the frame marker is detected, this signifies the start of a frame of 8 packets of 204 bytes each. Thus, the marker should be detected at the start of every 8 packets or 8*204 =1632 bytes. Furthermore, in one embodiment a second marker occurs at the start of every packet (referred to herein as a "packet marker" or "PM"). Thus, this packet marker should be detected every 204 bytes. The detection of N out the M total markers at these specific intervals will signify that the incoming stream is "in sync."

The BSYNC module 1900 will not output any valid data bytes until it has determined that the incoming Viterbi bit stream has been synchronized. In one embodiment, the BSYNC modules 1900 run through the following process before any valid bytes are output: (1) wait for the first valid bit from the Viterbi decoder at initialization; (2) "hunt" for the first frame marker; (3) detect a consistent pattern of fame and packet markers; and (4) assert "locked on" signal indicating that the BSYNC module 1900 is in synchronization.

Figure 21:
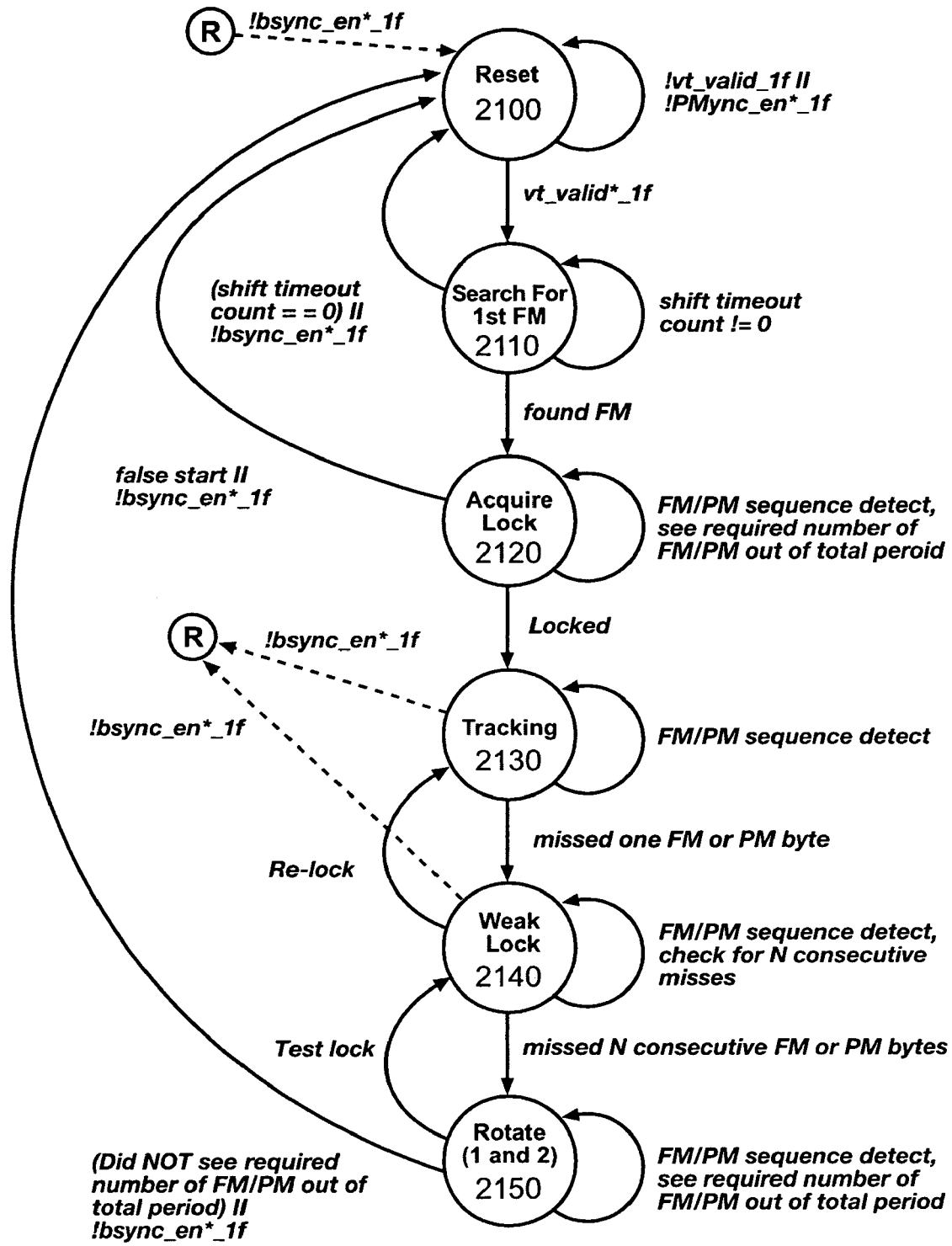
FIG. 21 illustrates a state diagram describing the operation of one embodiment of a byte synchronization unit.

One embodiment of BSYNC module logic is described by the state machine in FIG. 21. The first point to note about the illustrated state machine is that it can be reset from any state. If the "bsync_en*_1f" signal is de-asserted, the state will transition from the current state to the RESET state as indicated.

The initial state of the machine is the RESET state 2100 as shown at the top of FIG. 21. In this state the BSYNC module 1900 is waiting for a valid bit from the Viterbi decoder 700. The BSYNC module 1900 must decode the transponder number sent with the valid data bit to validate that this bit is targeted at its block. Once the first valid bit targeted at its block arrives, the state will transition to the "Search for 1st FM state" 2110. In this state, the shift register 2000 described above is used to capture the incoming bit stream from the Viterbi decoder 700. The register is sampled on each clock edge that the Viterbi decoder asserts its valid bit and is compared with the FM byte.

In one embodiment, the BSYNC module 1900 remains in the RESET state if the BSYNC is disabled via bit read from a software-programmable control register. This allows software to control when the BSYNC module 1900 is allowed to start processing data from the Viterbi decoder 700. As long as the BSYNC module 1900 remains in the RESET state, it will not output any valid data bytes.

The BSYNC module 1900 remains in the "search for 1st FM" state until the FM marker is identified. In one embodiment, a counter is provided to limit the amount of time in this state if the FM is not found. The counter may be initialized with a specified value and decremented every clock until it reaches zero. This counter value should be suitably large to cover the worst case scenario. For example, in an embodiment using the packet sizes and other variables set forth above, it is possible that a search for the first FM could take (204 bytes)*8−(1 bit missed)+8 bits=1,639 clock cycles. A packet size is 204 bytes and 8 cycles must be added to read in the FM or PM marker. In addition, the first bit of the packet is subtracted off in the worst case scenario. The foregoing equation describes the case where the second bit of the incoming packet was the first to be received, so the rest of the packet must be read in before another FM or PM marker is encountered. Accordingly, in this embodiment, the counter should be at least 11 bits to cover the 1,639 cycles. It may be desirable to have a larger timeout value since this is not necessarily the worst case scenario. For instance, in the presence of noise, this value may be increased.

If the FM marker is found before this "timeout" period is reached, the state will transition to the "Acquire Lock" state 2120. If the timeout counter reaches zero before the FM marker is detected, the state will transition back to RESET. A transition to the RESET state will be called a "failure," indicating that the state machine has been led down the wrong path and will never get into synchronization. If the BSYNC module 1900 determines that it cannot synchronize on the incoming stream, it has the ability to control external agents so that it can try to "lock on" again. For example, in one embodiment, the BSYNC module 1900 has the ability to change the rotator phase and/or the depuncture phase (as described above). These parameters are sent directly to a depuncture/rotator block 710 in the DP region 715 (see FIG. 7).

In one embodiment, there are a total of 4 distinct rotator phases and maximum of 7 puncture phases (see descriptions above for more detail). Thus, there is a worst case 4*7=28 theoretical combinations to try when failures have been detected. In one embodiment, the BSYNC module 1900 will attempt a new one of these combinations after reach failure.

In one embodiment, the BSYNC module 1900 will alternate rotator phases first before alternating puncture phases. In this embodiment, only one variable may be changed when a failure occurs, specifying a single rotator/puncture phase combination. After a failure, the state machine will start back at RESET 2100 and attempt to lock on again. The BSYNC module 1900 indicates the current rotator phase with a "current rotator phase signal." Table 8 below shows the encoding for one embodiment of this signal for the rotation phase degrees.

TABLE 8

| Current Rot Phase Signal | Rotator Phase |
| --- | --- |
| 0 | 0° |
| 1 | 90° |

In one embodiment, the puncture phase is changed in the depuncture/rotator block 710 with the assertion of a pulse signal. This signal is asserted for a single cycle and then de-asserted in order to change the phase one time. This differs from the current rotator phase signal which holds it value constant until it is changed.

In one embodiment, there are at least four specific, high-level cases which the BSYNC module 1900 considers when handling failures that require a change to the phase combination: (1) the system is turned on for the first time; (2) the demodulator carrier lock is lost; (3) the demodulator symbol lock is lost (e.g., the demodulator erroneously adds/removes an I,Q pair from stream) and (4) accidental loss of synchronization in the presence of excessive noise.

Since the BSYNC logic may not know which once of these events caused the failure or loss of lock, in one embodiment, it makes certain assumptions. First, it assumes that in the case of the system being turned on, the carrier lock being lost, and/or the accidental loss of lock or sync due to noise that the correct phase combination is completely random.

In the case where the symbol lock is lost, there is nothing the BSYNC can do to recover execpt try to update the current phase combination and try to regain lock again. The Viterbi output would be corrupted for some time in this case until the correct puncture phase was found. However, the loss of carrier lock can be the most frequent cause of a failure and is specially handled in the BSYNC state machine using an individual state. This will be described later.

Continuing with the state machine example, suppose that the current state is "Search for 1st FM" 2110 and a FM is found. The state will transition to "Acquire Lock" 2120. While in this state, a fixed number of FM and PM packets will attempt to be found. Again, in one embodiment, a shift register 2000 (FIG. 20) is used to check for bytes since only one bit is received from the Viterbi decoder at a time. This state will attempt to detect the following sequence (which is itself another state machine): skip 203 bytes--PM--203--PM--203--PM--203--PM--203--PM--203--PM--203--*FM*--203--PM--203-- . . .

In other words, the start of a frame was detected with a FM to move into this state. Therefore, 7 PM packets would be expected to follow before encountering another FM. In one embodiment, the number of periods to search before locking on the sequence is programmable by setting the detection of M number of total sync markers (FM and PM). The required N number of FM or PM bytes to acquire lock may be specified with another programmable register value. Thus, if N out of M total sync bytes are detected, the state machine will consider the byte sequence as being locked. Thus, sync bytes can be missed to gain lock as long as the required number are found in the programmed period. In one embodiment, the state machine will always transition after M sync bytes. That is to say, even if N sync bytes were found before reaching the M count, the state machine would still wait for M counts before transitioning.

Depending on the values chosen for N and M, the BSYNC module 1900 will lock onto different points in the sequence. If M is a multiple of 8, the first byte transmitted out of the BSYNC region 265 will be a FM marker since this byte occurs every 8 packet boundaries. Otherwise, the first byte transmitted will be a PM byte.

If the sequence detector does not see N out of M sync bytes while in the "Acquire Lock" state 2120, the FM byte that caused a transition from the Search for 1st FM state will be considered false (e.g., a false start was caused by the erroneous detection of a FM marker). The state will transition to the RESET state at this point, but the BSYNC module 1900 will not necessarily update the phase combination. In one embodiment, software will specify the number of allowed false starts before updating the phase combination. This value may be set in a control register (e.g., set for 2 false starts).

In one embodiment, if the required N out of M sync bytes are detected, the state transitions to the "Tracking" state 2130. In addition, the "Lock" signal will be asserted by the BSYNC module 1900 indicating that it is in sync and allowing all subsequent bytes gathered by the shift register 2000 to be passed on the output of BSYNC module 1900. In one embodiment, the BSYNC module 1900 asserts a valid bit for each byte boundary for its output data while it is locked. It may also assert a special packet start bit indicating when the data byte is a FM or PM byte.

In one embodiment, while in the Tracking state 2130, the logic is testing for the following continuous correct byte sequence: . . . --*FM*--203--PM--203--PM--203--PM--203--PM--203--PM--203--PM--203--PM--203--*FM*--203-- . . .

The first time a FM or a PM is not detected in this sequence, the state will transition to the "Weak Lock" state 2140. The BSYNC module 1900 will still be considered to be locked on in this case, but will need to validate the input stream further to remain locked. The BSYNC module 1900 will correct any missed FMs or PMs bytes transmitted to its output while it is locked. It can do this since it expects these bytes to be in a fixed position within the byte sequence.

In one embodiment, in the weak lock state, the BSYNC module 1900 will check for a programmable number of consecutive missed FM or PM bytes in order to transition to the next state. The BSYNC module 1900 will still output data bytes in this state and will still correct FM or PM bytes at the packet boundaries. It is possible to leave the Weak Lock state and return to the Tracking state. In one embodiment, as in the Acquire Lock state, if N out of M sync bytes (or some other number) are detected, the state will transition to the Tracking state once again.

If the BSYNC module 1900 misses some consecutive number of sync bytes, in one embodiment, it will transition out of the Weak Lock state to a first rotator state 2150 to attempt to correct for the case of the carrier lock being lost. The BSYNC is still considered to be locked in this state just as in the Weak Lock state. The current rotator phase is changed to −90 degrees from the original value. If a correct sequence is detected, the state will return to the Weak Lock state and the new rotator phase will be used. If not, the state will transition to the second rotator state 2150.

In one embodiment, the second rotator state is essentially the same as the first rotator state except is uses a rotator phase of +90 degrees from the original rotator value. If a correct sequence is detected, the state will return to the Weak Lock state and the new rotator phase will be used. If not, lock will finally be lost by the BSYNC module 1900 and the state will transition to the RESET state 2100. The BSYNC module 1900 would cease outputting valid data bytes at this point and not do so again until it regains lock.

The output multiplexer 1910 selects the appropriate data to be written into the output buffer 1920 in a given clock cycle. In one embodiment, it multiplexes data from the BSYNC modules 1900, a direct data path; and an interrupt data path. Thus, there are a total of 34 data path inputs into the multiplexer 1910. In one embodiment, the output multiplexer 1910 is composed of a data multiplexer and the state machine logic required to arbitrate amongst the various data sources. All of these sources may assert a valid bit indicating there is a valid data byte to be processed in a given cycle.

In one embodiment, the output multiplexer 1910 is actually comprised of two separate multiplexers. One multiplexer selects amongst the 32 BSYNC data paths to write into the output buffer 1920 and the other selects the data sources to transmit directly to the BSYNC module 1900 output (i.e., bypassing the output buffer 1920). In one embodiment, the direct path data and interrupt data are not written into the output buffer 1920.

In one embodiment the BSYNC module 1900 data is prioritized as follows: (1) Interrupt data; (2) output buffer data; (3) direct path data. Interrupt data is given the highest priority. In one embodiment, if there are any interrupts they will be sent even if other sources have data to send. The output buffer 1920 data has the next level of priority and will be allowed to send data if valid data is available. The direct path data has the lowest priority and will only be allowed to send data if there are no interrupts or buffered data pending.

In one embodiment, the maximum number of BSYNC modules 1900 that can assert a valid signal in any given cycle is 8 assuming that the output multiplexer 1910 can process all of them (i.e., because in this embodiment the 32 BSYNC modules 1910 are fed by 8 Viterbi decoders 700). A Viterbi decoder 700 provides data bits to only one BSYNC block at a time. Each BSYNC module 1900 accumulates a byte over 8 cycles since bits are sent from the Viterbi regions a maximum of one bit per cycle. Thus, the BSYNC blocks assert valid bits every 8 cycles in the worst case scenario. This gives the output multiplexer 1910 8 cycles to select 8 bytes to be written into the output buffer 1920. Accordingly, a one byte holding register should be sufficient for each BSYNC module 1900 at the input of the output multiplexer 1910.

In one embodiment, the output multiplexer 1910 employs a round-robin arbitration scheme when selecting between valid BSYNC bytes to process. It keeps track of the last BSYNC serviced and services the next valid BSYNC byte in the following cycle. If a BSYNC block is next in line but does not have any valid data, the output multiplexer 1910 selects the next valid BSYNC module 1900 to process.

Additional Processing

As illustrated in FIG. 2b, various types of additional processing 270 may be employed following the byte synchronization region. For example, in one embodiment, a packet filtering module may filter packets (e.g., MPEG-2 packets, MPEG-4 packets, RealVideo 8 packets, . . . etc) transmitted from the cable/satellite provider. In addition to filtering functions, the packet filter module may also perform de-interleaving, additional decoding (e.g., Reed-Solomon), and de-randomization which are part of one or more broadcast standards (e.g., the DVB-S and/or ATSC).

Figure 24:
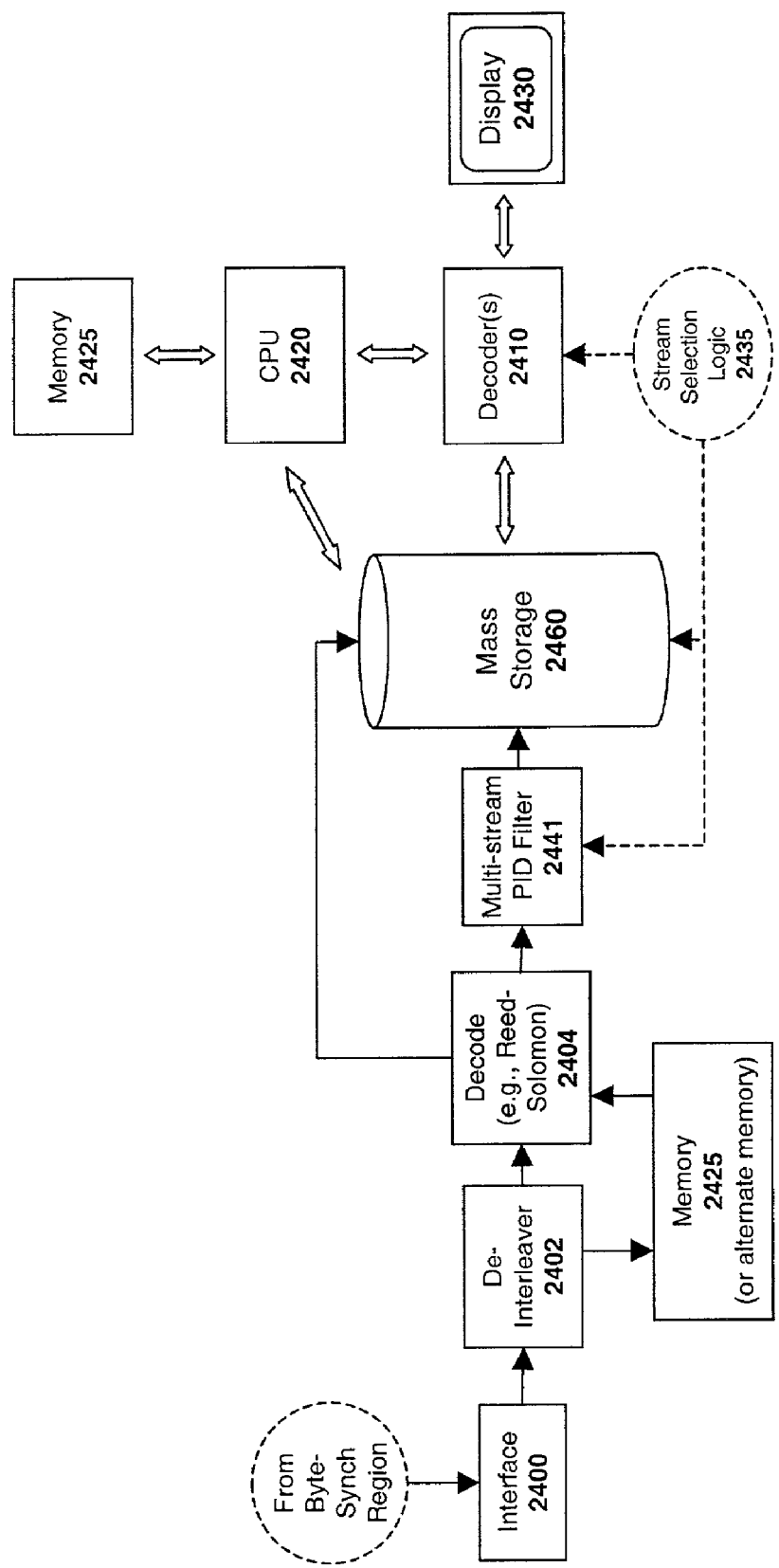
FIG. 24 illustrates additional multimedia stream processing employed in one embodiment of the invention.

One particular example of how data may be processed following the byte synchronization region is illustrated in FIG. 24. Data arrives through a front-end interface 2400, and is identified as belonging to 1 of N (e.g., 32) separate satellite transponders or ATSC (e.g., cable) carriers.

The data from each transponder/carrier may then be de-interleaved (as necessary) by a de-interleaver 2402. In one embodiment, the de-interleaver assembles bytes of packet data and writes them into a set of shared buffers (not shown). When enough bytes from the same packet accumulate in the de-interleaver 2302, the data is written out to SDRAM (e.g., memory 2425 or an alternate memory) using a burst write operation.

The decoder 2404, which in one embodiment is a Reed-Solomon decoder, may include a set of assembly buffers (not shown). These buffers may be used to assemble complete Reed-Solomon code words (e.g., encoded MPEG packets) in preparation for the decoding operation, and to hold the data until the error corrections (if any) can be applied. The Reed-Solomon decoder may support various modes of operation including, for example, DVB, ATSC, and "bypass." In one embodiment, the DVB mode implements the RS (204,188) specified by the DVB-S standard. ATSC mode implements the ATSC-specified RS (207,107) code. Bypass mode may be used in the case of alternative decoders and can be configured to pass the data unchanged or do a syndrome re-calculation to verify that the alternative decoder applied appropriate corrections.

Once the data has been decoded and corrected by the decoder 2402, in one embodiment, the whitening applied to the data by the transmitter may be removed to obtain the original MPEG transport packets (or other type of packets, depending on the implementation) by de-randomization logic (not shown). This de-randomization logic may also support various modes including DVB, ATSC, and/or "bypass."

After de-randomization, the original MPEG (or alternative) packets are obtained and packet filtering functions are applied. In one embodiment, a PID filter 2441 separates packets based on each packet's PID ("packet ID") value. As is known in the art, each cable or satellite "channel" may be comprised of a plurality of PIDs (e.g., one for video, two for stereo audio, one or more for control data, . . . etc). The PID packets associated with each channel are multiplexed together before transmission. As such, in order to render a channel on a television or other display device, the packets must be separated by a PID filter.

As illustrated in FIG. 24, in one embodiment, a mass storage device 2460 may be employed to store multimedia streams from all (or a subset of) the satellite transponders and/or cable carriers processed by the system. In one embodiment, the mass storage device 2460 stores the data following the PID filter (i.e., in a de-multiplexed format).

Alternatively, or in addition, the multimedia streams may be stored on the mass storage device 2460 prior to being filtered by the PID filter 2441. Accordingly, in this embodiment, when a user selects a particular channel from the mass storage device 2460 (e.g., via stream selection logic 2435), the PID filter will then filter the streams associated with that channel. Once a channel is filtered (either before or after the mass storage device 2460), the channel may then be decoded via decoder 2410 (which in one embodiment is an MPEG decoder) prior to being rendered on a display 2430.

Various additional data processing techniques may be employed. For example, in one embodiment, the multimedia processing techniques described in the following co-pending applications may be employed, each of which are assigned to the assignee of the present application: APPARATUS AND METHOD FOR INTELLIGENT MULTIMEDIA COMPRESSION AND DISTRIBUTION, filed Nov. 22, 2000 (Ser. No. 09/721,556); MULTIMEDIA AND COMPUTING SYSTEM, filed Sep. 1, 2000 (Ser. No. 09/653,964); A SYSTEM AND METHOD FOR EFFICIENTLY STORING AND PROCESSING MULTIMEDIA CONTENT, filed Jun. 8, 2001 (Ser. No. 09/877,990); APPARATUS AND METHOD FOR COMPRESSING VIDEO, filed May 2, 2001 (Ser. No. 09/848,118); and A SYSTEM AND METHOD FOR CONDITIONAL ACCESS KEY ENCRYPTION, filed May 2, 2001 (Ser. No. 09/930,784).

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hardwired logic for performing the steps, or by any combination of programmed computer components and custom hardware components.

Elements of the present invention may also be provided as a computer program product which may include a machine-readable medium having stored thereon instructions which may be used to program a computer (or other electronic device) to perform a process. The machine-readable medium may include, but is not limited to, floppy diskettes, optical disks, CD-ROMs, and magneto-optical disks, ROMs, RAMs, EPROMs, EEPROMs, magnet or optical cards, propagation media or other type of media/machine-readable medium suitable for storing electronic instructions. For example, the present invention may be downloaded as a computer program product, wherein the program may be transferred from a remote computer (e.g., a server) to a requesting computer (e.g., a client) by way of data signals embodied in a carrier wave or other propagation medium via a communication link (e.g., a modem or network connection).

It is also important to note that the apparatus and method described herein may be implemented in environments other than a physical integrated circuit ("IC"). For example, the circuitry may be incorporated into a format or machine-readable medium for use within a software tool for designing a semiconductor IC. Examples of such formats and/or media include computer readable media having a VHSIC Hardware Description Language ("VHDL") description, a Register Transfer Level ("RTL") netlist, and/or a GDSII description with suitable information corresponding to the described apparatus and method.

Throughout this detailed description, for the purposes of explanation, numerous specific details were set forth in order to provide a thorough understanding of the present invention. It will be apparent, however, to one skilled in the art that the system and method may be practiced without some of these specific details. For example, while many of the embodiments described above process multimedia streams from a plurality of satellite transponders, the underlying principles of the invention may be implemented on virtually any multi-stream receiver system including, but not limited to, cable receiver systems and broadcast receiver systems. Moreover, in some instances, well known structures and functions were not described in detail in order to avoid obscuring the subject matter of the present invention. Accordingly, the scope and spirit of the invention should be judged in terms of the claims which follow.

What is claimed is:

1. A method for sharing a decoder among a plurality of data streams comprising:
    decoding data samples from a first data stream in said plurality of data streams, thereby putting the decoder in a first state when it last decodes said data samples from said first data stream;
    storing N data samples processed from said first data stream in a decoder re-processing buffer before decoding data from one or more other data streams in said plurality;
    decoding data from one or more other data streams in said plurality, thereby putting the decoder in a second state; and
    decoding again said N data samples stored in said decoder re-processing buffer to restore said decoder to said first state prior to processing any new data samples from said first data stream.

2. The method as in claim 1 further comprising:
    temporarily storing a plurality of accumulator values associated with said first data stream in an accumulator buffer; and
    restoring said accumulator values prior to replaying said N data samples stored in said decoder re-processing buffer.

3. The method as in claim 2 wherein N accumulator values are stored in said accumulator buffer and associated with said first data stream.

4. The method as in claim 1 wherein said decoder is a forward-error correction ("FEC") decoder.

5. The method as in claim 1 wherein said decoder is a maximum likelihood decoder.

6. The method as in claim 1 wherein said decoder is a convolutional decoder.

7. The method as in claim 1 wherein said decoder is a Viterbi decoder.

8. The method as in claim 7 wherein N is a particular Viterbi trellis depth.

9. The method as in claim 1 wherein said data streams are from different satellite transponders.

10. The method as in claim 1 wherein said data streams are from different cable carriers.

11. A replay method of context switching a decoder comprising:
    decoding a first set of data from a first data stream to generate a first plurality of decoded data, said decoder being in a first state after decoding said first set of data;
    temporarily storing said first set of data in a buffer;
    decoding other sets of data from one or more other streams, thereby putting the decoder in a second state after decoding said other sets of data;
    restoring said decoder to said first state by re-decoding said first set of data from said buffer; and
    decoding a second set of data from said first data stream after said decoder is restored to said first state.

12. The method as in claim 11 further comprising:
    temporarily storing said second set of data in a buffer said second set of data being usable to restore said decoder to said second state after said decoder has decoded additional data from said one or more other streams.

13. The method as in claim 11 further comprising:
    temporarily storing a plurality of accumulator values associated with said first data stream in an accumulator buffer; and
    restoring said accumulator values prior to replaying said first set of data stored in said buffer.

14. The method as in claim 11 wherein said decoder is a forward error correction ("FEC") decoder.

15. The method as in claim 11 wherein said decoder is a Viterbi decoder.

16. The method as in claim 11 wherein said first and second data streams are transmitted from first and second transponders, respectively.

17. A system comprising:
    an error-correction decoder for decoding data from a plurality of data streams;
    data replay means for restoring said decoder to a state it was in when it previously decoded data from each respective data stream, before decoding new data from each respective data stream, wherein said data replay means comprises a replay buffer for temporarily storing pluralities of data from each respective data stream, said pluralities of data being usable by said data replay means to restore said decoder to a state it was in when it previously decoded data from each respective data stream.

18. The system as in claim 17 further comprising:
    accumulator storage means for temporarily storing accumulator values associated with each respective data stream.

19. The system as in claim 18 wherein the number of accumulator values associated with each data stream are equivalent in number to a number of data samples from each data stream stored in said replay buffer.

20. The system as in claim 17 wherein said decoder is a Viterbi decoder.

21. The system as in claim 17 wherein said decoder is a Turbo Code decoder.

22. The system as in claim 17 wherein each of said data streams contains data from a different satellite transponder.

23. The system as in claim 17 further comprising:
    one or more additional decoders for decoding a plurality of additional data streams; and additional data replay logic for restoring said decoders to previous states when said decoders previously decoded data from each respective data stream, before said decoders decode new data from each respective data stream.

24. An integrated circuit (IC), said IC comprising:
a decoder for decoding data symbols from a first data stream among a plurality of input data streams and from one or more other data streams among the plurality of data streams, wherein the decoder is in a first state when the decoder last decodes data symbols from said first data stream, and wherein the decoder is in a second state when the decoder last decodes data symbols from said one or more other data streams among said plurality;
a decoder re-processing buffer for storing N data symbols processed from said first data stream before decoding data from one or more other data streams in said plurality; and
decoder re-processing logic to re-process said N data symbols stored in said decoder re-processing buffer and thereby restore said decoder to said first state prior to processing any new data symbols from said first data stream.

25. The integrated circuit as in claim 24 further comprising:

accumulator storage logic to temporarily store a plurality of accumulator values associated with said first data stream in an accumulator buffer; and
accumulator restoration logic to restore said accumulator values prior to replaying said N data samples stored in said decoder re-processing buffer.

26. The integrated circuit as in claim 25 wherein N accumulator values are stored in said accumulator buffer and associated with said first data stream.

27. The integrated circuit as in claim 24 wherein said decoder is a forward-error-correction ("FEC") decoder.

28. The integrated circuit as in claim 24 wherein said decoder is a maximum likelihood decoder.

29. The integrated circuit as in claim 24 wherein said decoder is a convolutional decoder.

30. The integrated circuit as in claim 24 wherein said decoder is a Viterbi decoder.

31. The integrated circuit as in claim 30 wherein N is a particular Viterbi trellis depth.

32. The integrated circuit as in claim 24 wherein said data streams are from different satellite transponders.

33. The integrated circuit as in claim 24 wherein said data streams are from different cable carriers.

* * * * *